(12) United States Patent
Horch

(10) Patent No.: US 7,456,439 B1
(45) Date of Patent: Nov. 25, 2008

(54) VERTICAL THYRISTOR-BASED MEMORY WITH TRENCH ISOLATION AND ITS METHOD OF FABRICATION

(75) Inventor: Andrew E. Horch, Seattle, WA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 513 days.

(21) Appl. No.: 10/884,337

(22) Filed: Jul. 1, 2004

Related U.S. Application Data

(60) Continuation-in-part of application No. 10/201,654, filed on Jul. 23, 2002, now Pat. No. 6,777,271, which is a division of application No. 09/815,213, filed on Mar. 22, 2001, now Pat. No. 6,727,528.

(51) Int. Cl.
*H01L 29/74* (2006.01)

(52) U.S. Cl. .................. 257/133; 257/147; 257/155; 438/212; 438/270; 438/279; 438/587; 438/138

(58) Field of Classification Search .................. 257/302, 257/133, E21.661, 147, 155; 438/268, 212, 438/270, 279, 587, 138
See application file for complete search history.

(56) References Cited

U.S. PATENT DOCUMENTS

| | | | |
|---|---|---|---|
| 3,918,033 A | 11/1975 | Case et al. | |
| 3,943,549 A | 3/1976 | Jaecklin et al. | |
| 3,986,177 A | 10/1976 | Picquendar et al. | |
| 4,031,412 A | 6/1977 | Ohhinata et al. | |
| 4,032,955 A | 6/1977 | Anthony et al. | |
| 4,090,254 A | 5/1978 | Ho et al. | |
| 4,103,415 A | 8/1978 | Hayes | |
| 4,146,902 A | 3/1979 | Tanimoto et al. | |
| 4,165,517 A | 8/1979 | Temple et al. | |
| 4,281,336 A | 7/1981 | Somner et al. | |
| 4,323,793 A | 4/1982 | Schutten et al. | |
| 4,353,086 A | 10/1982 | Jaccodine et al. | |
| 4,590,589 A | 5/1986 | Gerzberg | |
| 4,593,459 A | 6/1986 | Poppert et al. | |
| 4,612,448 A | 9/1986 | Strack | |
| 4,641,166 A | 2/1987 | Takemae et al. | |
| 4,646,121 A | 2/1987 | Ogura | |
| 4,672,410 A | 6/1987 | Miura et al. | |

(Continued)

OTHER PUBLICATIONS

U.S. Appl. No. 10/262,729, filed Oct. 1, 2002, T-Ram, Inc.
U.S. Appl. No. 10/263,376, filed Oct. 1, 2002, T-Ram, Inc.
U.S. Appl. No. 10/671,201, filed Sep. 25, 2003, T-Ram, Inc.

*Primary Examiner*—M. Wilczewski
*Assistant Examiner*—Tsz K Chiu
(74) *Attorney, Agent, or Firm*—Fields IP, PS

(57) ABSTRACT

A semiconductor device may comprise a plurality of memory cells. A memory cell may comprise a thyristor, at least a portion of which is formed in a pillar of semiconductor material. The pillar may comprise sidewalls defining a cylindrical circumference of a first diameter. In a particular embodiment, the pillars associated with the plurality of memory cells may define rows and columns of an array. In a further embodiment, a pillar may be spaced by a first distance of magnitude up to the first diameter relative to a neighboring pillar within its row. In an additional further embodiment, the pillar may be spaced by a second distance of a magnitude up to twice the first diameter, relative to a neighboring pillar within its column.

13 Claims, 51 Drawing Sheets

U.S. PATENT DOCUMENTS

| | | | |
|---|---|---|---|
| 4,673,962 A | 6/1987 | Chatterjee et al. | |
| 4,677,455 A | 6/1987 | Okajima | |
| 4,734,384 A | 3/1988 | Tsuchiya | |
| 4,797,373 A | 1/1989 | Malhi et al. | |
| 4,829,357 A | 5/1989 | Kasahara | |
| 4,833,516 A | 5/1989 | Hwang et al. | |
| 4,864,168 A | 9/1989 | Kasahara et al. | |
| 4,868,138 A | 9/1989 | Chan et al. | |
| 4,959,703 A | 9/1990 | Ogura et al. | |
| 4,982,258 A | 1/1991 | Baliga | |
| 4,997,790 A | 3/1991 | Woo et al. | |
| 5,034,785 A | 7/1991 | Blanchard | |
| 5,081,518 A | 1/1992 | El-Diwany et al. | |
| 5,082,796 A | 1/1992 | El-Diwany et al. | |
| 5,099,300 A | 3/1992 | Baliga | |
| 5,106,776 A | 4/1992 | Shen et al. | |
| 5,252,845 A | 10/1993 | Kim et al. | |
| 5,307,310 A | 4/1994 | Narita | |
| 5,321,285 A | 6/1994 | Lee et al. | |
| 5,321,289 A | 6/1994 | Baba et al. | |
| 5,324,966 A | 6/1994 | Muraoka et al. | |
| 5,334,548 A | 8/1994 | Shen et al. | |
| 5,390,145 A | 2/1995 | Nakasa et al. | |
| 5,396,454 A | 3/1995 | Nowak | |
| 5,398,200 A * | 3/1995 | Mazure et al. | 365/174 |
| 5,412,598 A | 5/1995 | Shulman | |
| 5,422,296 A | 6/1995 | Lage | |
| 5,463,344 A | 10/1995 | Temple | |
| 5,464,994 A | 11/1995 | Shinohe et al. | |
| 5,471,419 A | 11/1995 | Sankaranarayanan et al. | |
| 5,488,242 A | 1/1996 | Sunouchi et al. | |
| 5,504,357 A | 4/1996 | Kim et al. | |
| 5,525,820 A | 6/1996 | Furuyama | |
| 5,528,062 A | 6/1996 | Hsieh et al. | |
| 5,543,652 A | 8/1996 | Ikeda et al. | |
| 5,587,944 A | 12/1996 | Shen et al. | |
| 5,689,458 A | 11/1997 | Kuriyama | |
| 5,874,751 A | 2/1999 | Iwamuro et al. | |
| 5,910,738 A | 6/1999 | Shinohe et al. | |
| 5,914,503 A | 6/1999 | Iwamuro et al. | |
| 5,936,267 A | 8/1999 | Iwamuro | |
| 5,939,736 A | 8/1999 | Takahashi | |
| 5,981,984 A | 11/1999 | Iwaana et al. | |
| 6,015,725 A | 1/2000 | Hirayma | |
| 6,081,002 A | 6/2000 | Ameraseker et al. | |
| 6,110,764 A | 8/2000 | Lee | |
| 6,218,217 B1 | 4/2001 | Uenishi et al. | |
| 6,225,165 B1 | 5/2001 | Noble, Jr. et al. | |
| 6,229,161 B1 | 5/2001 | Nemati et al. | |
| 6,391,689 B1 | 5/2002 | Chen | |
| 6,444,527 B1 | 9/2002 | Floyd et al. | |
| 6,448,586 B1 | 9/2002 | Nemati et al. | |
| 6,462,359 B1 | 10/2002 | Nemati et al. | |
| 6,545,297 B1 | 4/2003 | Noble, Jr. et al. | |
| 6,551,868 B1 | 4/2003 | Auriel et al. | |
| 6,656,797 B2 | 12/2003 | Blanchard | |
| 6,727,528 B1 | 4/2004 | Robins et al. | |
| 2001/0024841 A1 | 9/2001 | Noble, Jr. et al. | |
| 2002/0093030 A1 | 7/2002 | Hsu et al. | |
| 2002/0096690 A1 | 7/2002 | Nemati et al. | |
| 2002/0100918 A1 | 8/2002 | Hsu et al. | |

\* cited by examiner

VERTICAL THYRISTOR-BASED MEMORY WITH TRENCH ISOLATION AND ITS METHOD OF FABRICATION

RELATED DATA

This application claims benefit and priority as a continuation-in-part of "Thyristor-Based Device Including Trench Isolation", U.S. patent application Ser. No. 10/201,654 filed Jul. 23, 2002, now U.S. Pat. No. 6,777,271 which is a divisional of "Thyristor-Based Device Including Trench Dielectric Isolation for Thyristor-Body Regions", U.S. patent application Ser. No. 09/815,213 filed Mar. 22, 2001, issued Apr. 27, 2004 as U.S. Pat. No. 6,727,528; the disclosures of which are hereby incorporated by reference in their entirety.

For purposes of disclosure, cross reference is also made to "Novel Minority Carrier Isolation Device," U.S. patent application Ser. No. 10/671,201 filed Sep. 25, 2003; "Trench Isolation for Thyristor-Based Device," U.S. patent application Ser. No. 10/262,729 filed Oct. 1, 2002; and to "Deep Trench Isolation for Thyristor-Based Semiconductor Device," U.S. patent application Ser. No. 10/263,376 filed Oct. 1, 2002; the disclosures of each hereby being incorporated by reference in their entireties.

BACKGROUND

The present invention is directed to semiconductor devices and, more specifically, to a thyristor memory device.

The semiconductor industry has recently experienced technological advances that have permitted dramatic increases in integrated circuit density and complexity, and equally dramatic decreases in power consumption and package sizes. Present semiconductor technology may now permit single-die microprocessors with many millions of transistors, operating at speeds of hundreds of millions of instructions per second, to be packaged in relatively small semiconductor device packages. As the use of these devices has become more prevalent, the demand for faster operation and better reliability has increased.

An important part in the circuit design, construction, and manufacture of semiconductor devices concerns semiconductor memories; the circuitry used to store information. Conventional random access memory devices may include a variety of circuits, such as SRAM and DRAM circuits. SRAMS are mainly used in applications that require a high random access speed and/or a CMOS logic compatible process. DRAMS, on the other hand, are mainly used for high-density applications where the slow random access of DRAM can be tolerated.

Some SRAM cell designs may consist of at least two active elements, one of which may include an NDR (Negative Differential Resistance) device. Overall performance of this type of SRAM cell may be based in large part upon the properties of the NDR device. A variety of NDR devices have been introduced in various applications, which may include a simple bipolar transistor or a complicated quantum-effect device. One advantage of an NDR-based cell for an SRAM design may be its potential for allowing a cell area smaller than conventional SRAM cells (such as the 4T or 6T cells). Many of the typical NDR-based SRAM cells, however, may have deficiencies that may prohibit their use in some commercial SRAM applications. Some of these deficiencies may include: high power consumption due to the large standby current for its data retention states; excessively high or excessively low voltage levels for cell operation; and/or sensitivity to manufacturing variations which may degrade its noise immunity; limitations in access speed; limited operability over a given temperature range and limited yield due to a variety of fabrication tolerances.

Recently, thyristors have been introduced as a type of NDR device for forming a thyristor-based memory device. These types of memory can potentially provide the speed of conventional SRAM but with the density of DRAM and within a CMOS compatible process. Typically, such thyristor-based memory may comprise a capacitively coupled thyristor to form a bi-stable element for an SRAM cell. For more details and for more specific examples of such device, reference may be made to "Semiconductor Capacitively-Coupled NDR Device and its Applications in High-Density High-Speed Memories and in Power Switches," U.S. patent application Ser. No. 09/092,449, now U.S. Pat. No. 6,229,161; issued May 8, 2001, hereby incorporated by reference in its entirety.

One consideration in the design of thyristor-based memories may be its cell area. The fabrication of a memory cell typically involves forming at least one storage element and circuitry designed to access the stored information. The cell area of a DRAM is typically between 6 $F^2$ and 8$F^2$, where F may be the minimum feature size.

Another consideration in the design of semiconductor memories may be the density of memory arrays. One factor in achieving a memory array of high density may be the ability to isolate the different circuitry components.

Another consideration in the design of semiconductor memories may be the cost of fabrication. One factor in the cost of memory fabrication may be the fabrication method.

Another consideration in the design of semiconductor memories may be the ability to reliably store data. For example, a thyristor-based memory may lose or corrupt data if it should accidentally turn-off (stored data may transition to '0') or turn-on (stored data may transition to '1').

SUMMARY

In a particular embodiment, a thyristor-based memory may comprise a plurality of pillars (or columnar structures) arranged in an array of rows and columns across a supporting substrate. A pillar may comprise vertically-aligned, contiguous regions of semiconductor material of alternating conductivity type. The regions may define at least anode-emitter, n-base, p-base and cathode emitter regions of a thyristor in series with a gateable access transistor. The access transistor may comprise source/drain and drain/source regions, and a body region therebetween. The pillars of semiconductor material may be in an upright position relative to the supporting substrate.

In another particular embodiment, a semiconductor device may comprise pillars defining an array of rows and columns. An insulative barrier may be disposed between neighboring rows of pillars of the array. In a further particular embodiment, the barrier may have a depth and a length sufficient to substantially insulate pillars of one row from those of the neighboring row.

In another particular embodiment, a semiconductor device may comprise an array of rows of columnar structures (e.g., pillars) of semiconductor material. A first conductive sleeve may be capacitively coupled to and at least partially encircling a given columnar structure. A second conductive sleeve may be coupled to and at least partially encircling a neighboring columnar structure in the same row. The first and second conductive sleeves may be coupled to each other. A first wordline of the row may be defined at least in part by the first conductive sleeve coupled to the second conductive sleeve. In a further embodiment, the given columnar structure may comprise a body region of an access transistor capacitively coupled to the first conductive sleeve. In a further embodiment, the given columnar structure may further comprise a base region of a thyristor that may be capacitively coupled to another conductive sleeve associated with a second wordline.

In another particular embodiment, a distance between the pillars in a given row may be less than the distance between the different rows.

BRIEF DESCRIPTION OF THE DRAWINGS

The subject matter of embodiments of the present invention may be understood by reference to the following detailed description and with reference to the accompanying drawings, in which.

DETAILED DESCRIPTION

Figure 1:
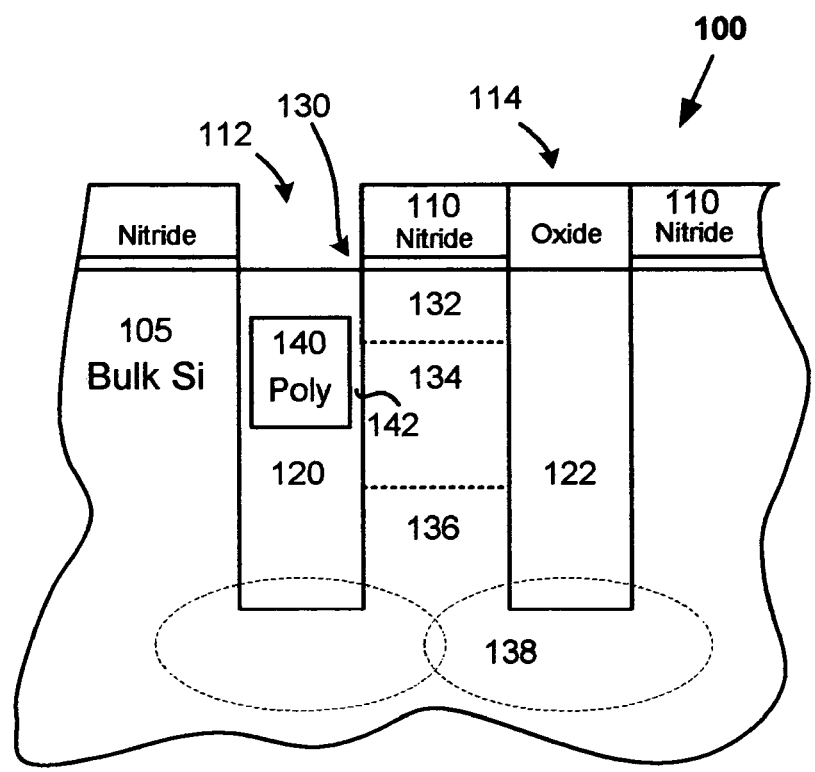
FIG. 1 is a partial cross-sectional view of thyristor-based semiconductor device, according to an embodiment of the present invention.

In the further description that follows, readily established circuits and procedures for the exemplary embodiments may be disclosed in a simplified form (e.g., simplified block diagrams and/or simplified description) to avoid obscuring an understanding of the embodiments with excess detail and where persons of ordinary skill in this art can readily understand their structure and formation by way of the drawings and disclosure. For the same reason, identical components may be given the same reference numerals, regardless of whether they are shown in different embodiments of the invention.

As used herein, "substrate" or substrate assembly may be meant to include, e.g., a portion of a semiconductor or bulk material. Such portion may have one or more layers of material including, but not limited to Si, Ge, SiGe, and all other semiconductors that have been formed on or within the substrate. Layered semiconductors comprising the same or different semi-conducting material such as Si/Si, Si/SiGe and silicon-on-insulator (SOI) may also be included. These layers and/or additional layers may be patterned and/or may comprise dopants to produce devices (e.g., thyristors, transistors, capacitors, interconnects, etc.) for an integration of circuitry. In forming these devices, one or more of the layers may comprise topographies of various heights. When referencing this integration of circuitry, therefore, it may be described as integrated together, on or with a substrate.

The term "pillar" may be used herein to refer to structures that, depending on context, may also be described as "columns" or "posts". As used herein, the term "pillar", is intended to encompass its ordinary and customary meaning in the semiconductor arts, and to include columnar structures and/or posts.

The term "column" may have at least two meanings. In a first usage, the term "column" may refer to a single columnar structure. In a second usage, the word "column" may be used to refer to an organization of structures within an array, as in "rows and columns." Ordinarily, the intended usage may be clear from context by those skilled in the art. For purposes of clarity herein, the disclosure may refer to an array of pillars organized into rows and columns. Therefore, this application may avoid the use of the word "column" in a first usage as a columnar structure and may instead substitute the word "pillar" merely to avoid confusion with the usage within an array of rows and columns.

The terms "row" and "column" of an array are used herein for convenience for relative interrelationship. For example, in describing a particular embodiment, the term a row may refer to a plurality of structures arranged along an x-axis. The term column may further be used to describe structures of the plurality arranged along a y-axis, the y-axis intersecting the x-axis. In some cases, therefore, and depending on context, the same embodiment may be described with the terms row and column interchanged. For example, the word "column" may be used to recite the structures arranged along the x-axis and the word "row" may be used to recite the structures arrange along the y-axis, with no resulting change in recited structure. In other words, the selection of the term "row" to refer to one axis and of the term "column" to refer to a second axis may, unless the context indicates otherwise, be merely for convenience.

The terms "F", "minimum feature size" or "minimum independent feature size" may refer to the smallest size for an independent unit feature dimension that may be formed using an optical lithographic process, such as standard photolithography with or without assisting optical proximity correction, phase shift techniques and the like. The independent unit feature may be described as one, which may be independently imaged using e.g., standard or conventional photolithographic processes. These independent unit features may be contrasted relative to dependent features, which may not be separately imaged. For example, dependent features may be formed proximate or between, and usually with dependent relationship, to one or more independently patterned features. Such dependent feature sizes (e.g., thickness of a conformal layer or spacer) often have a dimension of magnitude less than the repetitive patterning resolution of photolithographic imaging.

For example, first and second features (the second perhaps being in paired or complimentary relationship to the first) may each be individually imaged and formed in relationship to each other via "F" (the minimum feature size) and may collectively have a dimension of 2F. In a particular embodiment, imaging techniques such as optical proximity correction (OPC) or phase shift photolithography may be used to establish, e.g., a spacing between first features, which together in combination provide combined 2F dimension for the first and second features.

The term "F" may also be used in the context of describing a repetitive unit area. For example, a unit area to a repetitive pattern may comprise a length of 2F and a width of 2F, for establishing an area of magnitude $4F^2$. In another example, the unit area may comprise a length of 2F and a width of 3F, for establishing a fundamental unit area for the pattern of magnitude $6F^2$. In particular contexts herein, a dimension may be referred to as a diameter, a width, a length, or a periodicity, which may correspond or be related to F.

As referenced herein, portions of a device (e.g., a transistor or thyristor) may be described as being formed in, at or on a semiconductor substrate. Such alternative terms in/at/on may be used individually merely for purposes of convenience. In the context of forming semiconductors, such terms may collectively reference portions of a semiconductor element that may be within and/or on a starting structure or material.

The present invention is believed to be applicable to a variety of different types of semiconductor devices, and has been found to be particularly suited for devices using thyristor-based devices, such as memory cells, and for enhancing the ability to form such devices in a semiconductor substrate. While the present invention is not necessarily limited to such devices, various aspects of the invention may be appreciated through a discussion of various examples using this context.

According to an embodiment of the present invention, a thyristor-based semiconductor device, such as a memory cell, may be manufactured in a manner that includes forming pillars with sidewalls that may define (per a cross-sectional and side view) a trench that electrically isolates a vertical thyristor. A trench is formed in the device using conventional methods, such as by patterning a mask over semiconductor substrate (e.g., bulk silicon) and subsequently etching the trench at a portion of the substrate that is exposed via the patterned mask. An electrically insulative material may be formed in the trench, and a portion of the device adjacent the trench may be implanted to form the body of a thyristor. In one particular implementation, the portions of the device implanted includes a portion surrounded by the trench. The body of the thyristor is formed having adjacent portions, at least one of which is disposed vertically adjacent another one of the contiguous regions. The thyristor can be formed in a variety of spatial orientations, can be implemented with conventional CMOS fabrication methods, and is particularly applicable as a thin capacitively coupled thyristor. A control port, such as a gate, is capacitively coupled to one of the contiguous regions of the thyristor and adapted to control the operation of the thyristor, for example, by effecting the switching of the thyristor between a blocking state and a conducting state. A reference voltage is coupled to another one of the contiguous regions. In one particular implementation, the gate is formed in the trench, and in another implementation the gate is formed surrounding a contiguous portion of the thyristor. The isolation trench addresses challenges including those discussed in the background hereinabove, including the need to electrically isolate the thyristor from surrounding circuitry while maintaining the ability to manufacture devices near the thyristor.

In a more particular example embodiment of the present invention, the thyristor is formed as part of a memory cell that uses either an NMOSFET or a PMOSFET as an access transistor, or pass gate, to the thyristor. A source/drain region of the access transistor is electrically connected to an emitter region (e.g., anode or cathode) of the thyristor. The pass gate may, for example, also include vertical portions as does the thyristor. The emitter region to which the pass transistor is connected may have a different doping type than the pass transistor source/drain region. In a more specific example embodiment of the present invention using a transistor as a pass gate, an isolation trench is formed adjacent the pass gate and a gate for the transistor is formed in the trench, such as using methods described herein to form a control port for the thyristor.

In another particular implementation, an insulative portion is formed in the trench and is configured and arranged to prevent the control port from coupling to more than one contiguous region of the thyristor. In this manner, it is possible to couple either a lower or upper contiguous region, or to independently couple two contiguous regions in opposite electrical directions using two control ports. In a more particular implementation, the insulative portion includes a spacer formed at the bottom of the trench prior to the formation of the control port in the trench for the thyristor.

The Figures show thyristor-based semiconductor devices being formed having adjacent trench isolation, according to various example embodiments of the present invention. Certain ones of the figures use reference numbers similar to numbers used in previously described figures, and not necessarily with repeated description thereof.

Beginning with FIG. 1, a nitride mask 110 is deposited over a semiconductor material 105 including bulk silicon, and a photo mask is patterned over the nitride mask. The nitride mask is etched in a manner that leaves at least two open portions 112 and 114 over the semiconductor material 105. The nitride mask is then removed at the open portions and exposing the semiconductor material thereunder. Trenches are etched in the semiconductor material at the exposed material, and an oxide liner may be formed in the trenches. The depth of the trench is selected to achieve electrical insulation from other circuitry in the device, and in one particular implementation is about 0.5 microns. In addition, the trenches can be formed having different depths, such as for use in an existing process without significantly changing the isolation of the existing logic when the existing trench isolation is too shallow for thyristor isolation.

After the trenches are etched, a region 138 of the substrate 105 at a lower end of a thyristor pillar 130 is implanted with a dopant to form an emitter region of the thyristor. Oxide material 120 and 122 is deposited in the trenches and planarized using a process such as chemical-mechanical polishing (CMP). The planarized oxide is then patterned with a photo mask and a portion of the oxide in the trench under open portion 112 is etched to form an open area for a poly gate for the thyristor. A gate dielectric 142 is formed in portion of the gate open area adjacent the thyristor pillar, and polysilicon gate material 140 is deposited in the gate open area. Additional oxide is then formed over the polysilicon gate, and the nitride is stripped off the device. Additional thyristor regions are then formed, including base regions 136 and 134 and emitter region 132, which are electrically insulated by the oxide 120 and 122.

Figure 2:
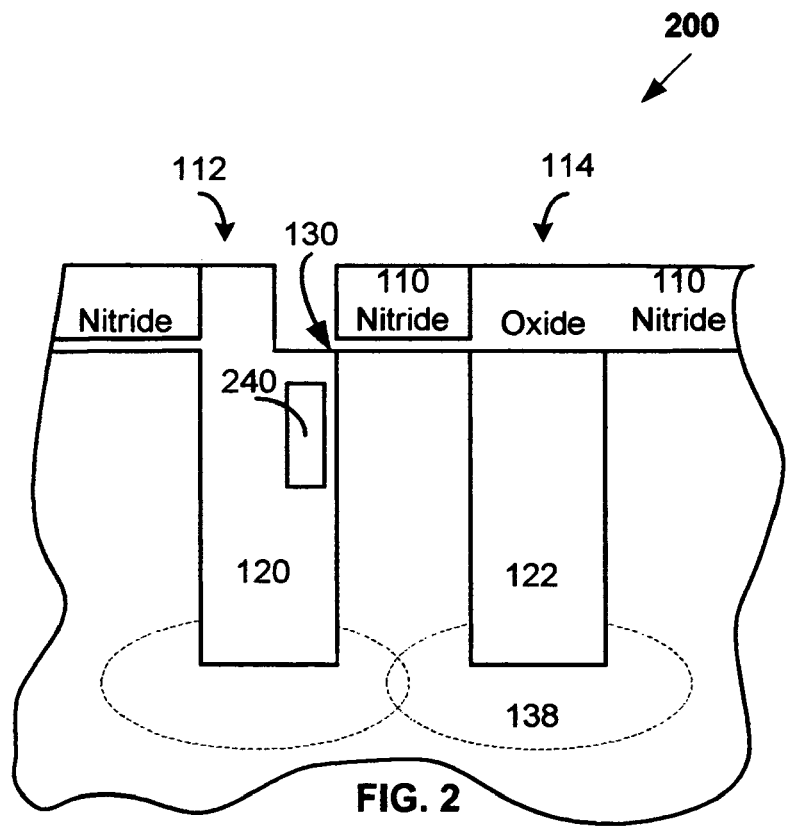
FIG. 2 is a partial cross-sectional view of a thyristor-based semiconductor device, according to another embodiment of the present invention, and showing a gate formed near a sidewall.

FIG. 2 shows a semiconductor device 200 having a gate 240 formed in a portion of the trench 112, according to another example embodiment of the present invention. In this example, the gate is formed in an open area that is near one sidewall of the trench, the sidewall being adjacent a portion where a thyristor is to be formed. FIGS. 3-7 show a thyristor-based device being formed using similar steps.

Figure 3:
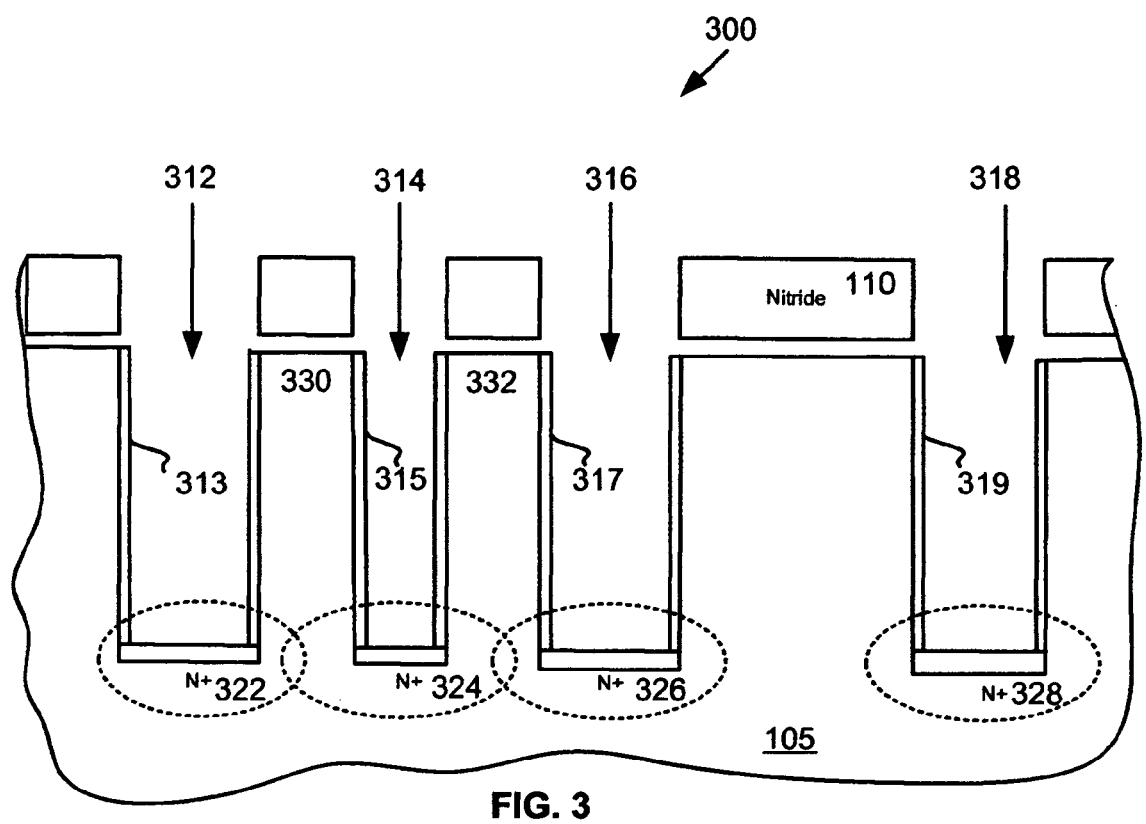
FIG. 3 is a partial cross-sectional view that shows a step in the formation of a thyristor-based semiconductor device, according to another embodiment of the present invention, showing etching of a substrate and doping for emitter regions.
Figure 4:
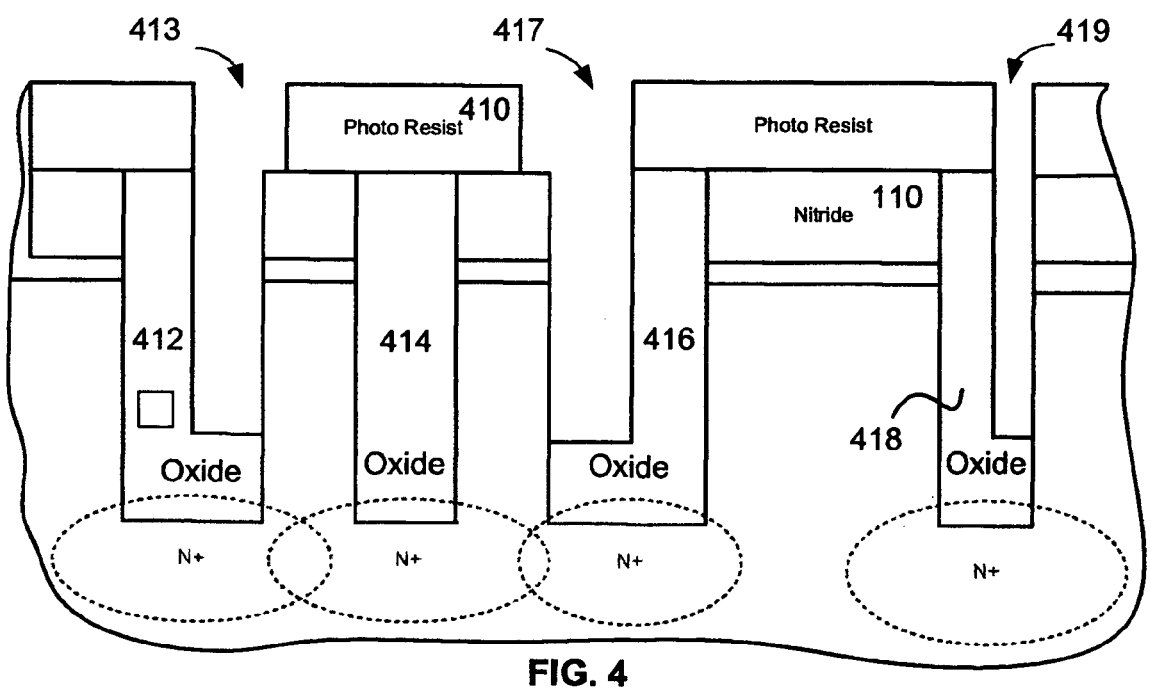
FIG. 4 is a partial cross-sectional view that shows another step in the formation of the thyristor-based semiconductor device such as that of FIG. 3, according to an embodiment of the present invention, and showing deposit of oxide in a trench and etching of the oxide.
Figure 5:
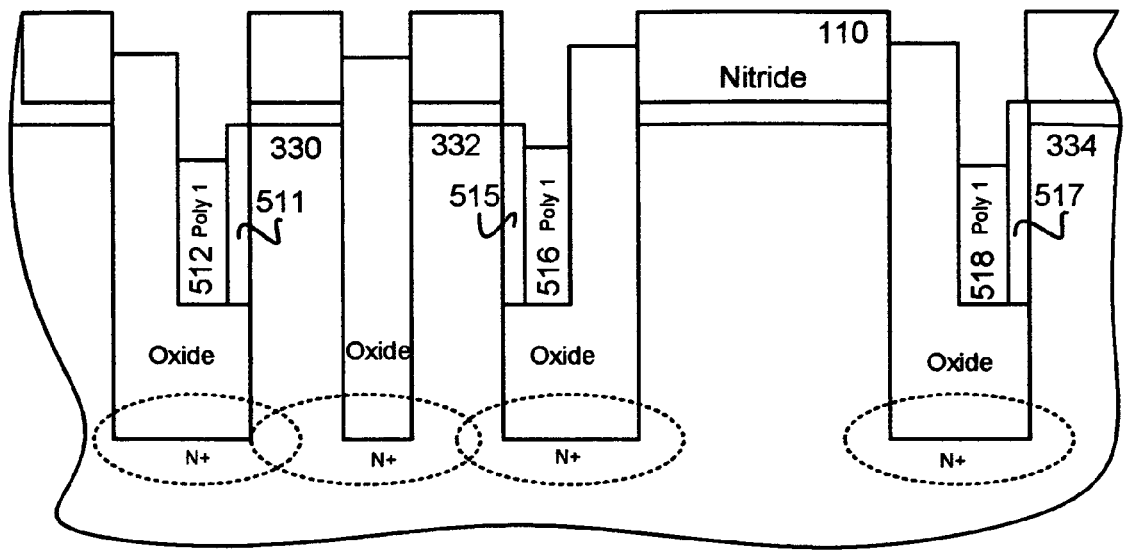
FIG. 5 shows another step in the formation of the thyristor-based semiconductor device shown in FIG. 4, according to another embodiment of the present invention, showing the formation of gate oxides on sidewalls of thyristor pillars.

Beginning with FIG. 3, thyristor devices are formed at stacks 330, 332 and 334, according to a more particular example embodiment of the present invention. A nitride mask is used to form openings 312, 314, 316 and 318 in substrate 105 in the device, and oxide liners 313, 315, 317 and 319 are formed on sidewalls and bottoms of the openings. Dopant 322, 324, 326 and 328 is then implanted via the bottom of each of the openings to be used in forming an emitter region of subsequently formed thyristors. Oxide 412, 414, 416 and 418 is deposited in each opening and a photo resist 410 is then patterned over the device in FIG. 4. Openings 413, 417 and 419 are formed in the oxide. As shown in FIG. 5, gate oxides 511, 515 and 517 are formed on the sidewalls of the thyristor pillars 330, 332 and 334 and polysilicon gates 512, 516 and 518 are formed therein and electrically (capacitively) coupled to base regions of the adjacent thyristors (i.e., capacitively as shown in FIG. 5).

Figure 6:
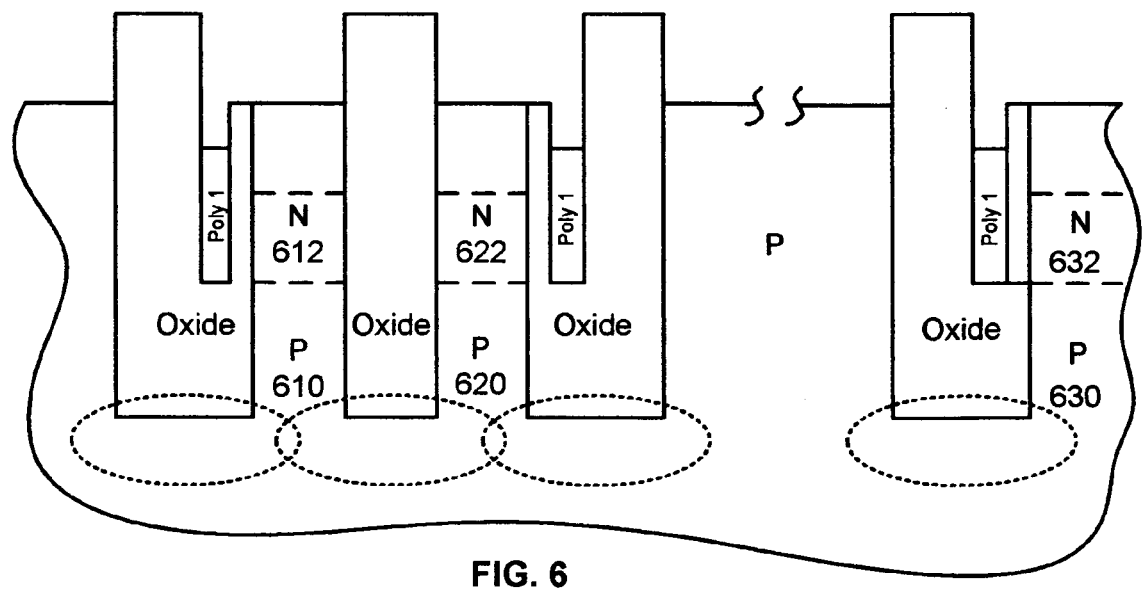
FIG. 6 is a partial cross-sectional view that shows another step in the formation of the thyristor-based semiconductor device shown in FIG. 5, according to an embodiment of the present invention, showing removal of a mask.
Figure 7:
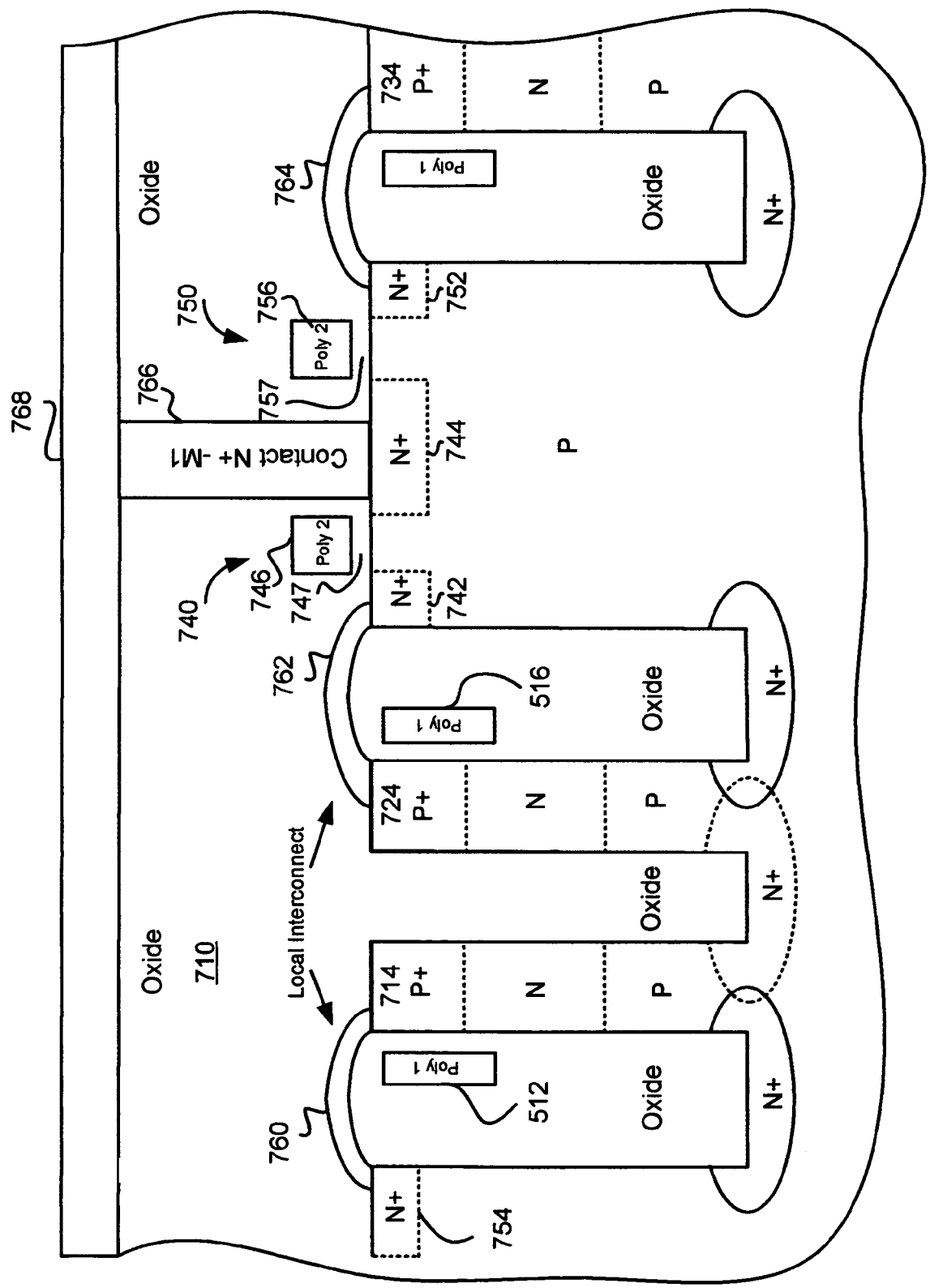
FIG. 7 is a partial cross-sectional view that shows another step in the formation of the thyristor-based semiconductor device shown in FIG. 6, according to an embodiment of the present invention, showing formation of access transistors and bitline contact.

The nitride mask 110 is then removed in FIG. 6, and P base thyristor portions 610, 620 and 630, along with N base thyristor portions 612, 622 and 632 are formed using, for example, conventional dopant implantation methods described herein. The P base portions are each electrically connected with their corresponding N base and N+ emitter regions above and below, respectively. The N base portions are electrically connected thereabove to their corresponding P+ emitter regions. P+ emitter regions 714, 724 and 734 are formed over the P base portions in FIG. 7. Transistors 740 and 750 are then formed by first forming a gate oxide 747 and 757 (e.g., as shown in the art), and forming polysilicon over the gate oxide. The polysilicon is then photolithographically masked and etched to form gate portions 746 and 756, and the source/drain regions 742, 744 and 752 are implanted (N+ source/drain region 754 is also implanted and shown without remaining transistor portions). In a more particular implementation, gate portions 746 and 756 are formed in a single deposition step with the formation of gates 512 and 516. Alternatively, the formation of the source/drain regions may include a lightly-doped drain (LDD) implant following the gate photo-etch, and subsequent formation of sidewall spacers on the gate. Once the sidewall spacers are in place, a second source/drain implant is affected to form heavily doped portions adjacent the LDD portions. Local interconnects 760, 762 and 764 are then formed electrically coupling the P+ emitter portions of the thyristors and the N+ source/drain regions of the transistors. Contact 766 is formed through a via that extends through oxide 710. Metal interconnect 768 is formed over the oxide and can be used to intercouple the circuitry to a variety of other circuitry.

Figure 8:
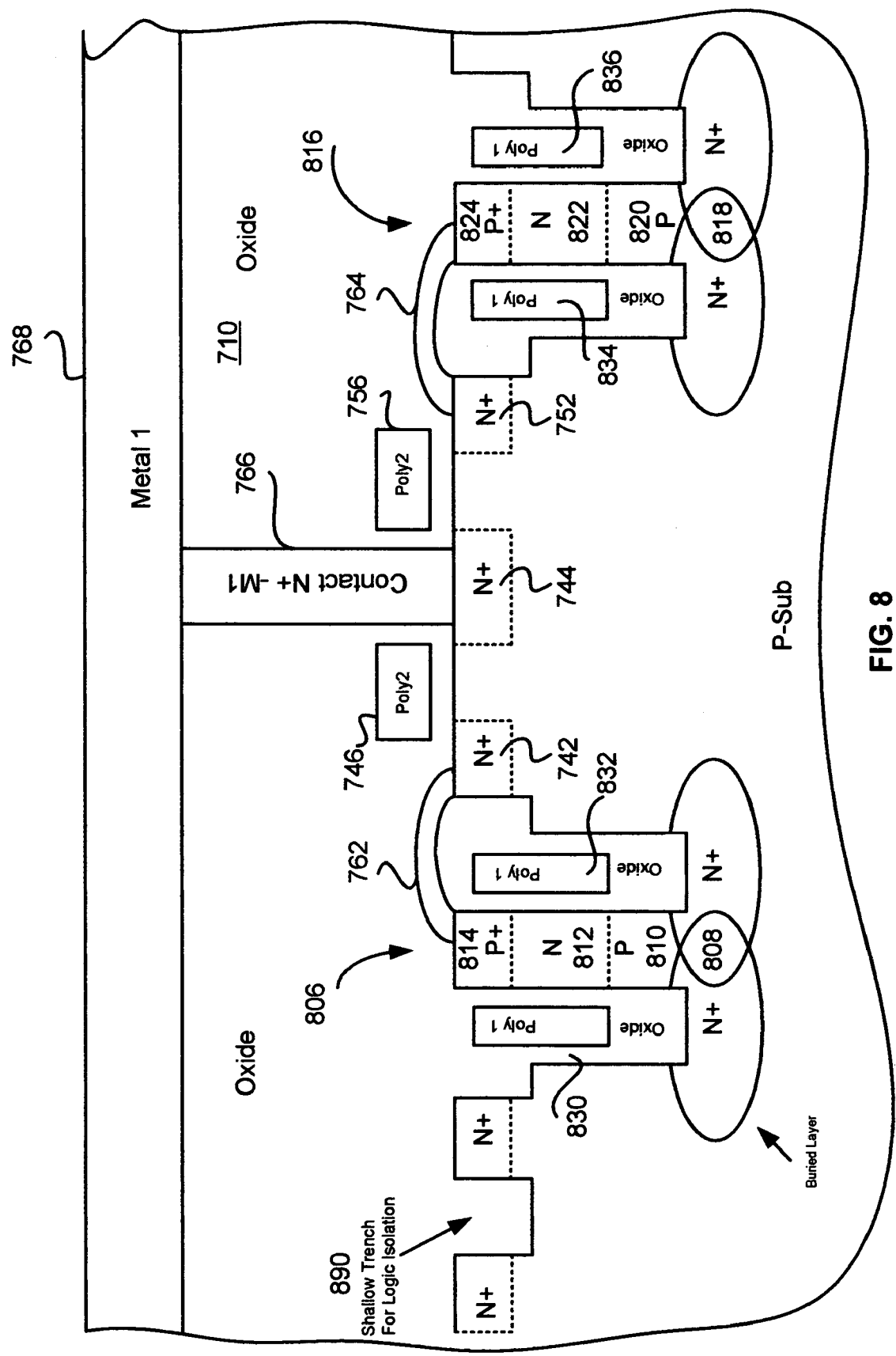
FIG. 8 is a partial cross-sectional view of a thyristor-based semiconductor device, according to an embodiment of the present invention, showing a shallow isolation trench.

FIG. 8 shows a thyristor-based semiconductor device having a split gate, according to another example embodiment of the present invention. The device is similar to the device shown in FIG. 7, with a difference including the use of gates on both sides of the thyristor. In this instance, thyristors 806 and 816, respectively, are formed having N+ emitter regions 808 and 818, P base regions 810 and 820, N base regions 812 and 822, and P+ regions 814 and 824. Gate portions 830 and 832 are formed in oxide trenches and adjacent thyristor 806, and gates 834 and 836 are formed similarly adjacent thyristor 816. In one implementation, the gates 834 and 836 are part of a contiguous gate region that surrounds the thyristor. In addition, FIG. 8 shows another alternate implementation wherein a shallow trench isolation (STI) 890 is used to isolate additional circuitry in the device from the thyristor.

Figure 9:
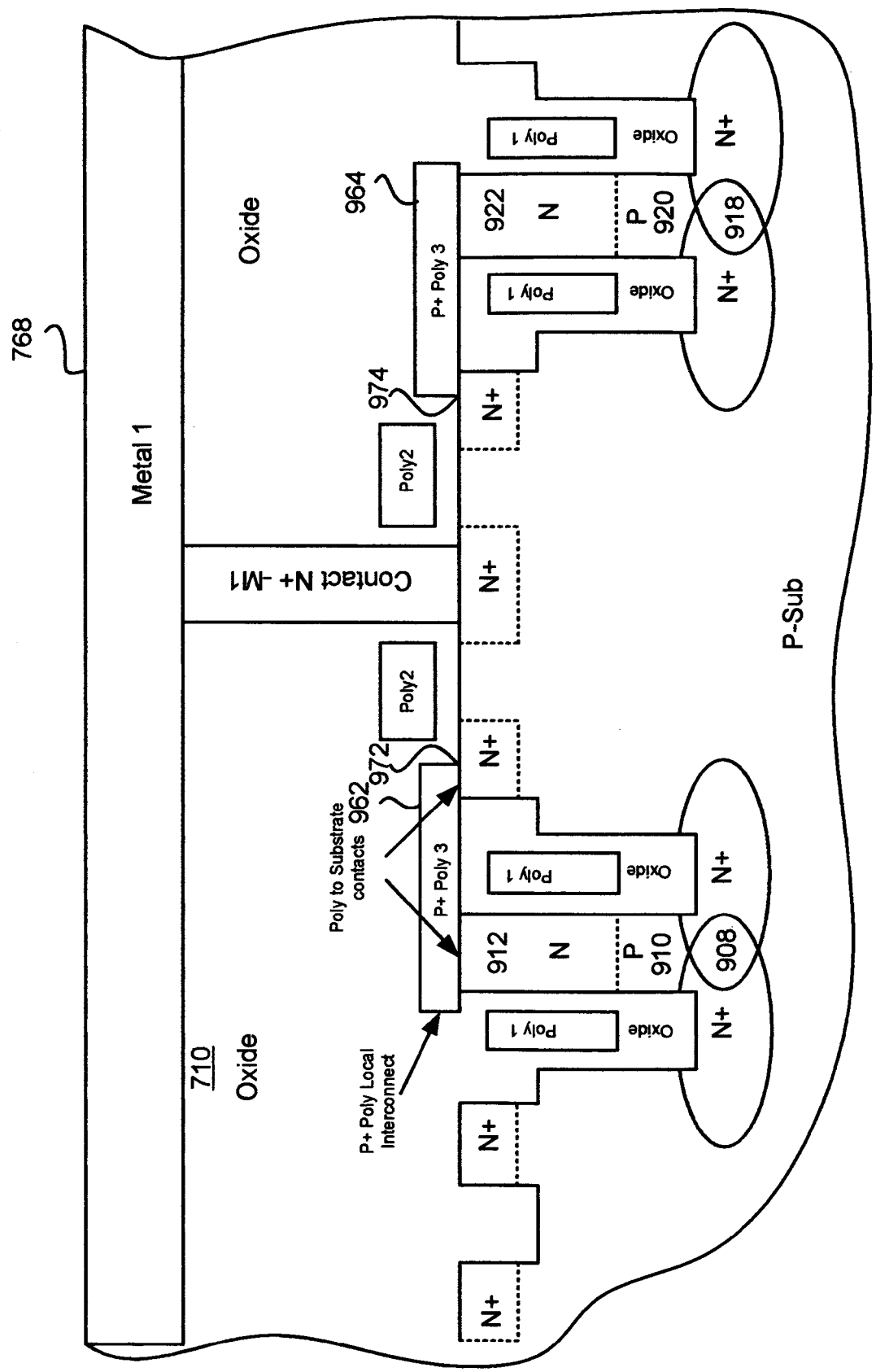
FIG. 9 is a partial cross-sectional view of a thyristor-based semiconductor device, according to an embodiment of the present invention, showing a realization for a local interconnect.

FIG. 9 shows a thyristor-based semiconductor device having a P+ emitter region that acts as a portion of an interconnect to a transistor, according to another example embodiment of the present invention. The thyristor device is formed having N+ emitter regions 908 and 918, P base regions 910 and 920 and N base regions 912 and 922, for example, in a similar manner as described hereinabove. P+ emitter regions 962 and 964 are then formed over the N base regions and extending laterally to the N+ source/drain region of a transistor. A high conductivity material, such as salicide 972 and 974, is formed to connect the p+ emitter and n+ source/drain to electrically couple the thyristor to the transistor.

Figure 10A:
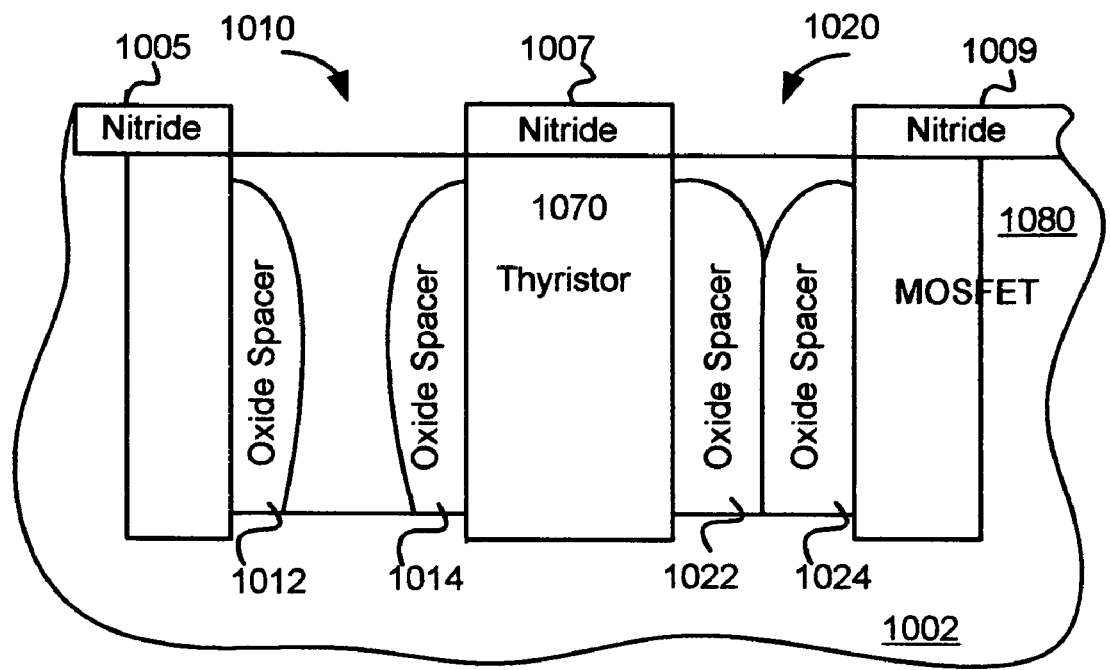
FIG. 10A is a partial cross-sectional view useful to show a step in the formation of a thyristor-based semiconductor device, according to an embodiment of the present invention, and showing formation of oxide spacers in a trench.
Figure 10B:
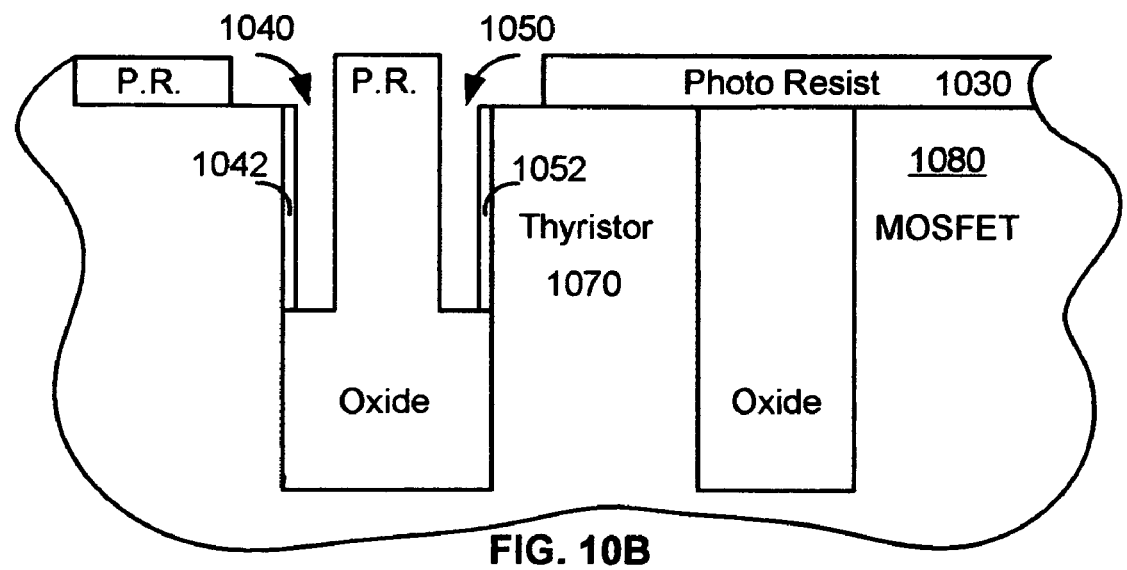
FIG. 10B is a partial cross-sectional view useful to show another step in the formation of the thyristor-based semiconductor device as shown in FIG. 10A, according to an embodiment of the present invention, and showing formation of a mask to define regions for oxide removal.
Figure 10C:
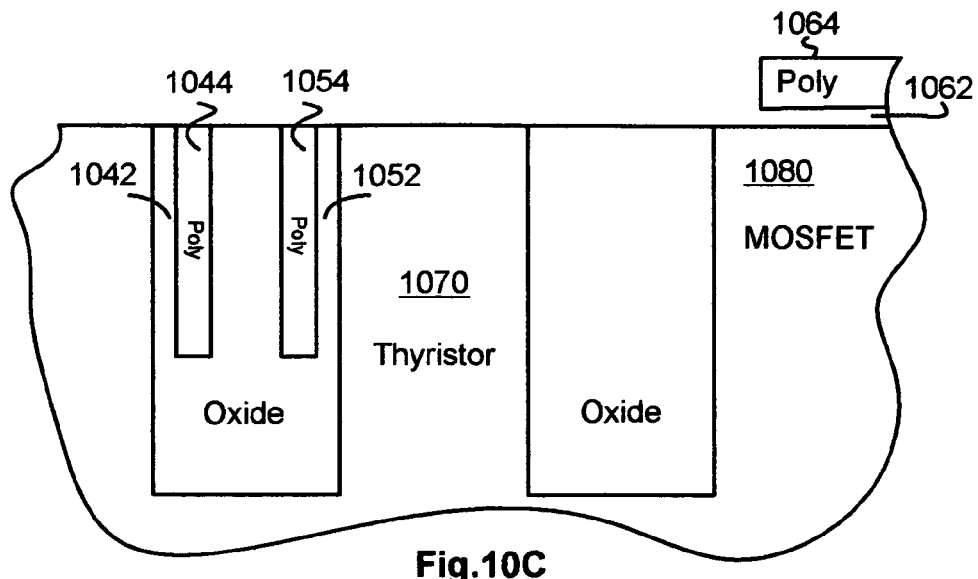
FIG. 10C is a partial cross-sectional view useful to show another step in the formation of the thyristor-based semiconductor device such as that shown in FIG. 10B, according to an embodiment of the present invention, further illustrating formation of electrodes.

The formation and filling of the trenches in each of the above and other example implementations can be accomplished in a variety of manners. FIGS. 10A-10C show the formation of gates to be associated with a MOSFET 1080 and a thyristor 1070 (each shown without implant regions), according to another example embodiment of the present invention. In FIG. 10A, a nitride layer is patterned over a substrate 1002 to form mask regions 1005, 1007 and 1009, and trenches 1010 and 1020 are etched in the substrate. Oxide material is deposited and anisotropically etched to form spacers 1012, 1014, 1022 and 1024, forming sidewall spacers in trench 1010 and filling trench 1020. The bottom of the thyristor is then implanted with a dopant to form an emitter region, and the implant is optionally driven into the substrate via a subsequent process, such as annealing. The unfilled portion of the trenches is then filled with oxide, which may be planarized by using chemical-mechanical polishing (CMP) or another planarization method, and the nitride is removed. Other implants are then effected, such as for source/drain or well regions of the MOSFET 1080, base or emitter portions of the thyristor 1070 or for other circuitry.

A photoresist 1030 is patterned over the device in FIG. 10B and the oxide is etched to form openings 1040 and 1050. Gate oxide 1042 and 1052 is then formed in the openings, and polysilicon gates 1044 and 1054 are formed adjacent the gate oxide in FIG. 10C. In one particular implementation, gate oxide 1062 and gate 1064 for the MOSFET 1080 are formed with gate oxide 1042 and 1052, and with gates 1044 and 1054, respectively.

Figure 11A:
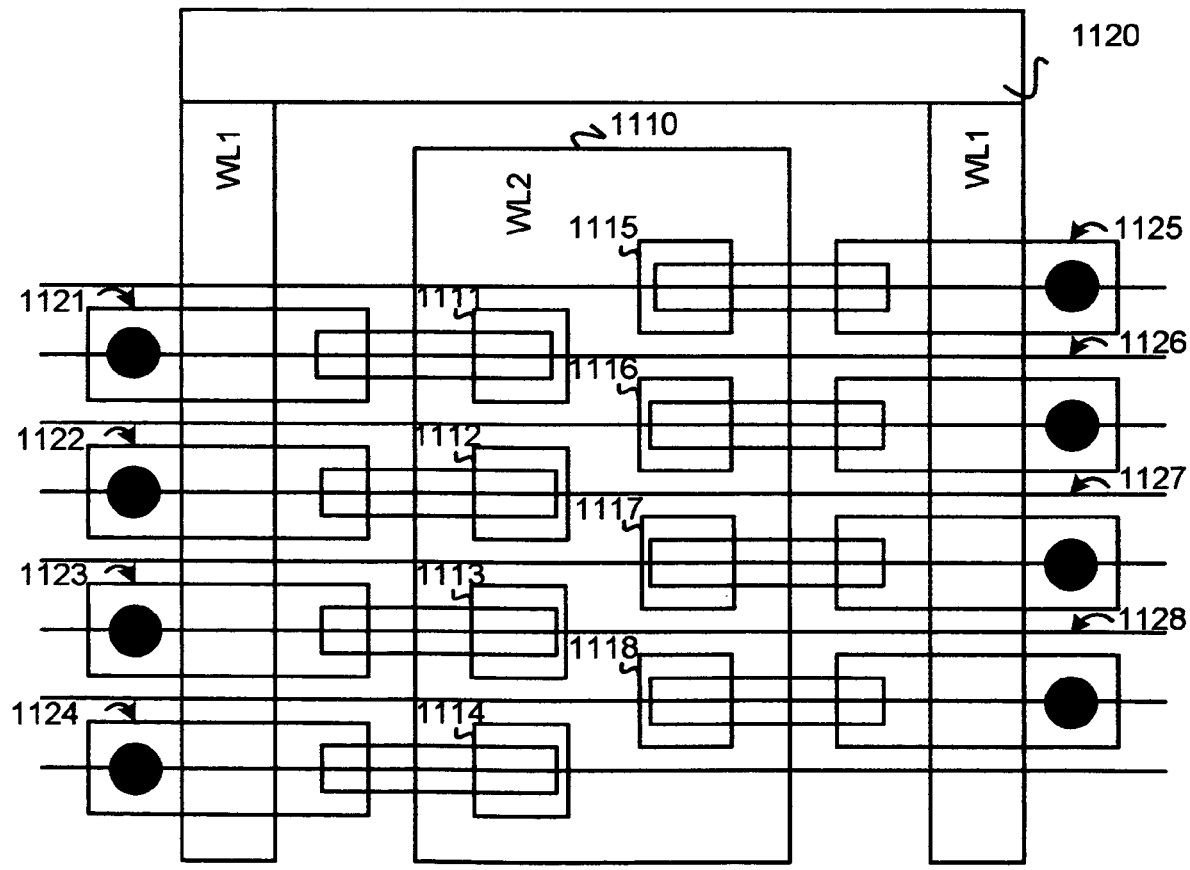
FIG. 11A is a partial top view of a memory array having a split wordline, according to an embodiment of the present invention.

FIG. 11A shows an array of memory cells having a split (or folded) wordline and including thyristor-based memory devices coupled to a transistor, according to another example embodiment of the present invention. Split wordline 1120 is electrically connected to a gate portion of CMOS transistors 1121, 1122, 1123, 1124, 1125, 1126, 1127 and 1128. A source/drain portion of each of the transistors is electrically connected via local interconnect to either an anode or cathode portion of eight thyristors 1111, 1112, 1113, 1114, 1115, 1116, 1117 and 1118, and each thyristor is electrically connected (i.e., capacitively as presented hereinbefore) to a second wordline 1110. The second wordline is electrically connected to a base portion of either an anode or cathode portion that is not coupled to the local interconnect. Each thyristor is formed adjacent a trench that is adapted to isolate the thyristor from other circuitry in the device. In one particular implementation, the memory cells include cells formed as shown in FIG. 8, with the wordline 1120 being represented by gate portion 746, and wordline 1110 being represented by gate portions 830 and 832.

Figure 11B:
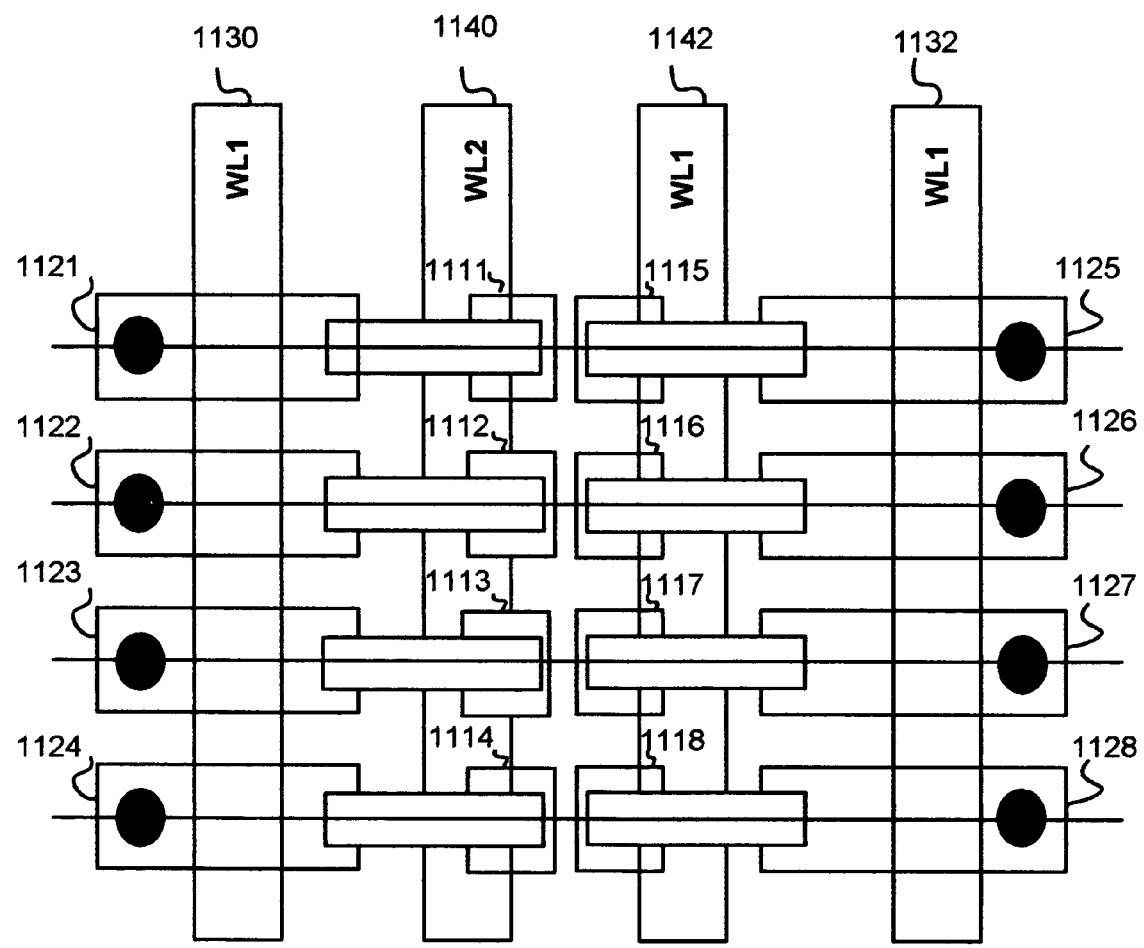
FIG. 11B is a partial top view of a memory array, according to another embodiment of the present invention, and showing separate wordlines.

FIG. 11B shows another array of memory cells having separate wordlines 1130 and 1132 and including thyristor-based semiconductor devices, according to another example embodiment of the present invention. Wordline 1130 is electrically connected to a gate portion of CMOS transistors 1121, 1122, 1123 and 1124, and wordline 1132 is electrically connected to a gate portion of CMOS transistors 1125, 1126, 1127 and 1128. A source/drain region of each of the transistors is electrically connected via local interconnect to a thyristor. Either an anode or cathode end portion of each of thyristors 1111, 1112, 1113 and 1114 is electrically connected to wordline 1140, and an anode or cathode end portion of each of thyristors 1115, 1116, 1117 and 1118 is electrically connected to wordline 1142. Each thyristor is formed adjacent a trench that is adapted to isolate the thyristor from other circuitry in the device. In one particular implementation, the memory cells include cells formed as shown in FIGS. 3-7, with one of the wordlines 1130 and 1132 being represented by gate portion 746, and wordlines 1140 and 1142 being represented by gate portions 512 and 516.

Figure 12:
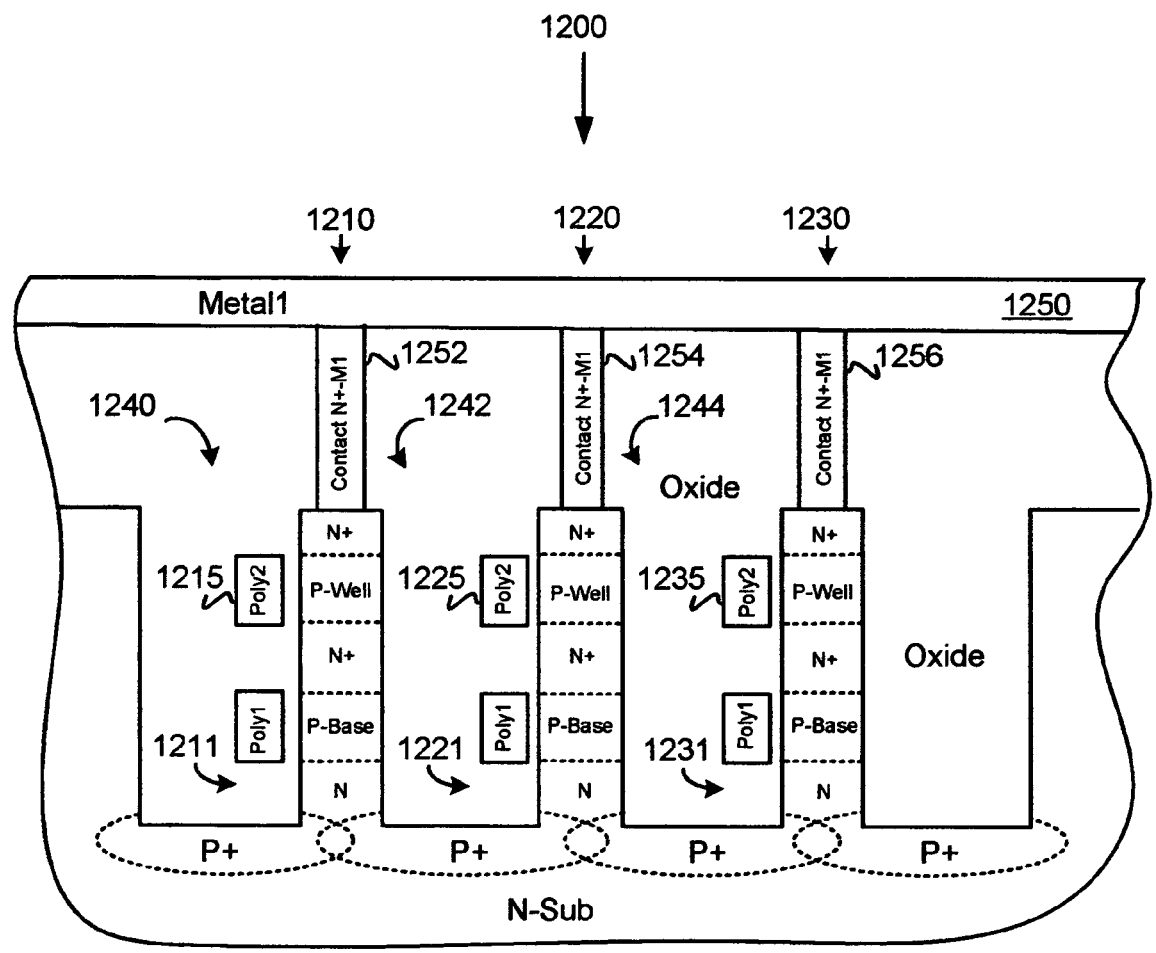
FIG. 12 is a partial cross-sectional view of a semiconductor device having access transistors in series and vertically aligned with a thyristor, according to another embodiment of the present invention.

FIG. 12 shows a semiconductor device 1200 having pass gates formed and capacitively coupled to channel or body regions of access transistors (as shown in FIG. 12) and vertically aligned with a thyristor, according to another example embodiment of the present invention. Thyristors 1211, 1221 and 1231 are formed having contiguous vertically adjacent base and emitter regions, such as those described hereinabove. Pass gates 1215, 1225 and 1235 are formed over the channel regions or body region of the access transistors at an elevation above the thyristors and vertically aligned therewith (as shown in FIG. 12). Each of the vertically aligned thyristor and access transistor combinations 1210, 1220 and 1230 are electrically isolated by trenches 1240, 1242 and 1244. For the given series of pillar combinations 1210, 1220, 1230, one end of the access transistor at the top of the pillars (as shown in FIG. 12) are connected to an interconnect 1250 via contacts 1252, 1254 and 1256.

Figure 13:
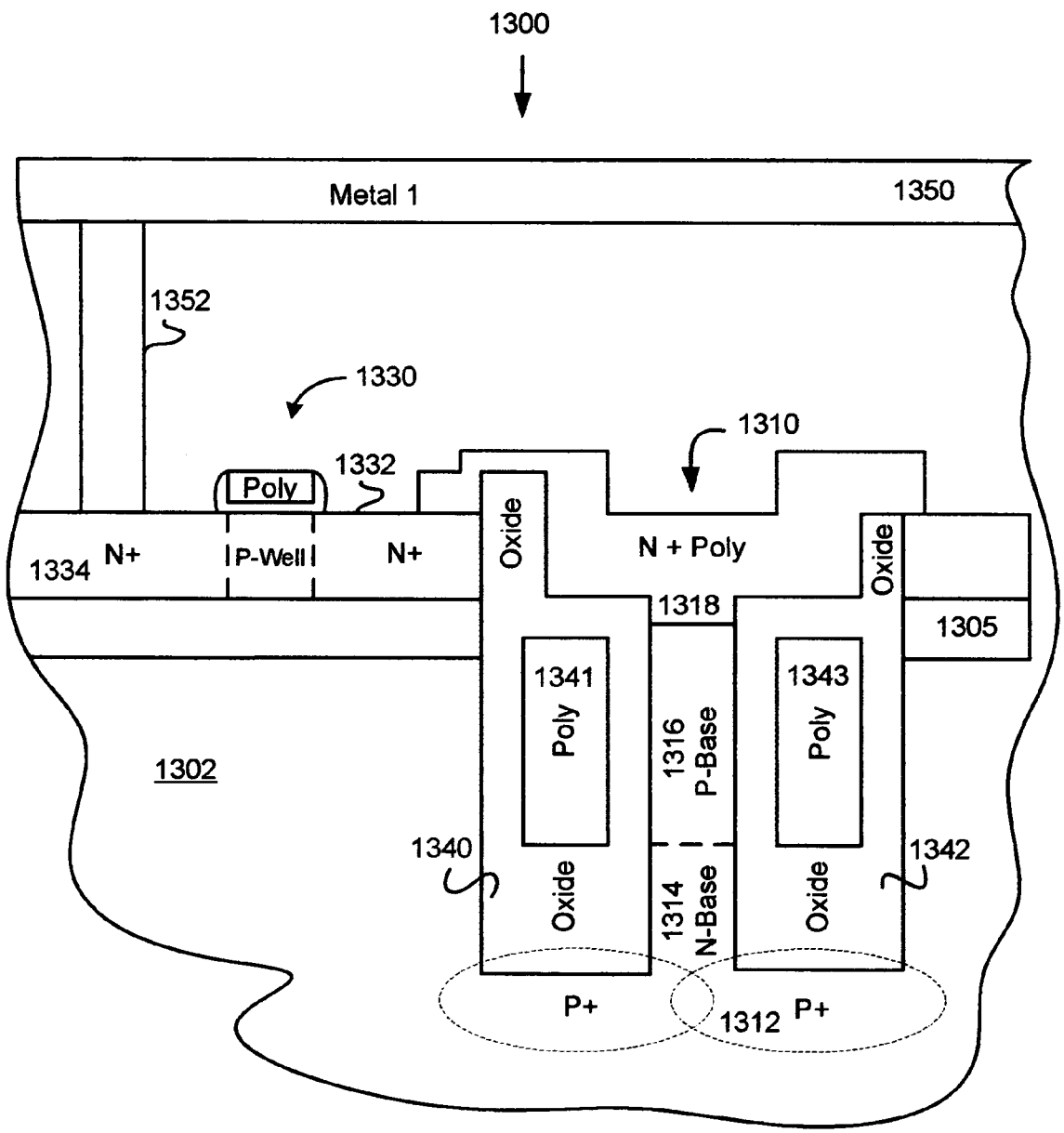
FIG. 13 is a partial cross-sectional view of a semiconductor device for a thyristor according to an embodiment of the present invention, and showing an access transistor in series with a thyristor.

FIG. 13 is a semiconductor device 1300 having silicon on insulator (SOI) structure with a buried insulator 1305 and a thyristor 1310 electrically isolated using trenches 1340 and 1342, according to another example embodiment of the present invention. The thyristor includes vertically adjacent regions that include a P+ emitter region 1312, N-base 1314, P-base 1316 and N+ emitter 1318. Control ports 1341 and 1343 are capacitively coupled to the P-base region 1316. The thyristor is coupled to a pass gate 1330 via a portion of the N+ emitter region 1318 that extends to an N+ source/drain region 1332 of the pass gate 1330. Another source/drain region 1334 is coupled via a contact 1352 to a metal interconnect 1350 that can be coupled to other circuitry.

Another aspect of the present invention is directed to improving the stability of the above-described thyristor devices in the presence of high temperatures and various disturbances. In this context, the above-described thyristor devices are modified and/or enhanced as described in concurrently-filed U.S. patent application Ser. No. 09/814,980, entitled "Stability In Thyristor-Based Memory Device," now U.S. Pat. No. 6,462,359; issued Oct. 8, 2002; incorporated herein by reference in its entirety. The skilled artisan will appreciate that a shunt element, such as described in the concurrently-filed patent document, can be formed in the trench below the control port (e.g., 140 of FIG. 1) and using similar manufacturing techniques used in forming the control port. In another embodiment, the shunt element can be formed in a second trench on the side of the vertically adjacent thyristor regions (e.g., 134, 136 of FIG. 1) opposite the side adjacent the control port.

Figure 14:
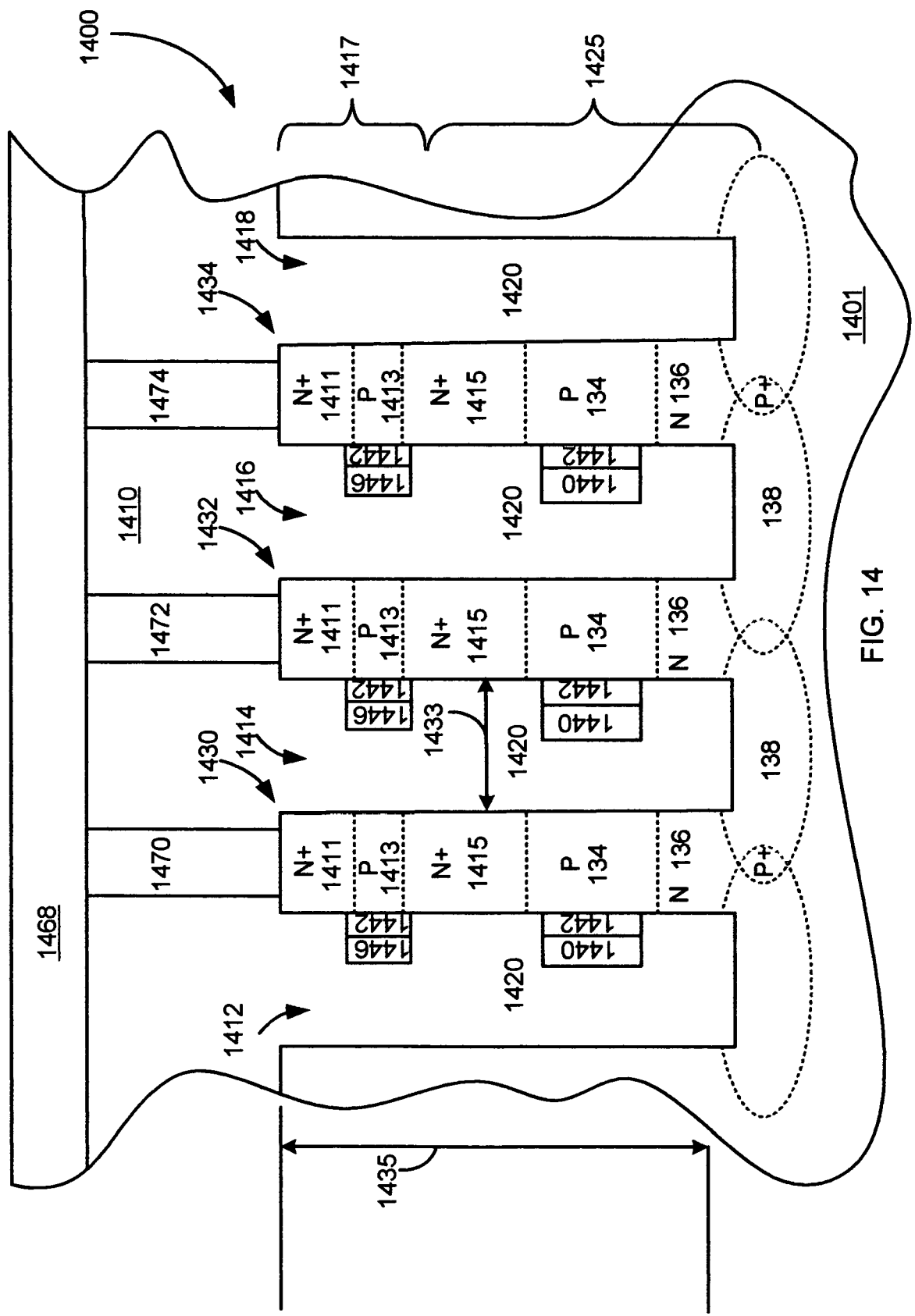
FIG. 14 is a simplified partial cross-sectional view of a thyristor-based memory array consistent with an embodiment of the present invention.

Referencing FIG. 14, a thyristor-based memory array 1400, in accordance with an embodiment of the present invention, may comprise a semiconductor substrate 1401 with buried P+ doped regions 138. Pillars 1430, 1432, 1434 may extend vertically above the P+ doped regions 138 of the supporting substrate 1401. The individual pillars 1430, 1432, 1434 may comprise vertically aligned, alternating regions of opposite conductivity type, which may define an access device 1417 in series with a thyristor 1425. The access transistor 1417 may comprise source and drain regions 1411, 1415 separated by body region 1413. These regions 1411, 1413, 1415 for the access transistor may be vertically disposed over a second group of regions 134, 136 for p-base and n-base regions of thyristor 1425.

The thyristor 1425 may comprise anode-emitter (i.e., P+ region 138), n-base 136, p-base 136, and cathode-emitter 1415 regions. It may be understood that cathode-emitter region 1415 may also serve as a drain/source region 1415 of the access transistor 1417.

Oxide 1420 may fill trenches 1412, 1414, 1416, 1418 to insulate the individual pillars (e.g., 1432) from neighboring pillars (e.g., 1430, 1434). In particular embodiments, the height 1435 of at least some pillars may be at least twice the distance 1433 between neighboring pillars.

Further referencing FIG. 14, dielectric 1442 may be disposed between transistor body 1413 and gate electrodes 1446 such that the electrode may be capacitively coupled through dielectric 1442 to the transistor body 1413. Gate electrode 1446 may vertically extend beyond upper and lower boundaries to slightly overlap source and drain regions 1411 and 1413. The gate electrode 1446 may, in turn, be electrically connected to a voltage source as part of a wordline.

Capacitor electrodes 1440 may be capacitively coupled (through dielectric 1442) to thyristor p-base regions 134, and may be electrically connected to another voltage source as part of a separate wordline. In a particular embodiment, insulating material such as oxide 1420 may fill remaining regions of the trenches. Depending on the array design or layout, at least some of the pillars 1430, 1432, 1434 (e.g., of a given column) may be electrically coupled to bitline 1468 through electrically conductive contacts 1470, 1472, 1474.

Although the insulating material 1420 may be described as oxide for a particular embodiment, it will be understood that alternative embodiments may comprise other insulating material, such as, for example, glass, boro phospho silicate glass (BPSG), phosphosilicate glass (PSG), spin-on dielectric, etc.

Figure 15:
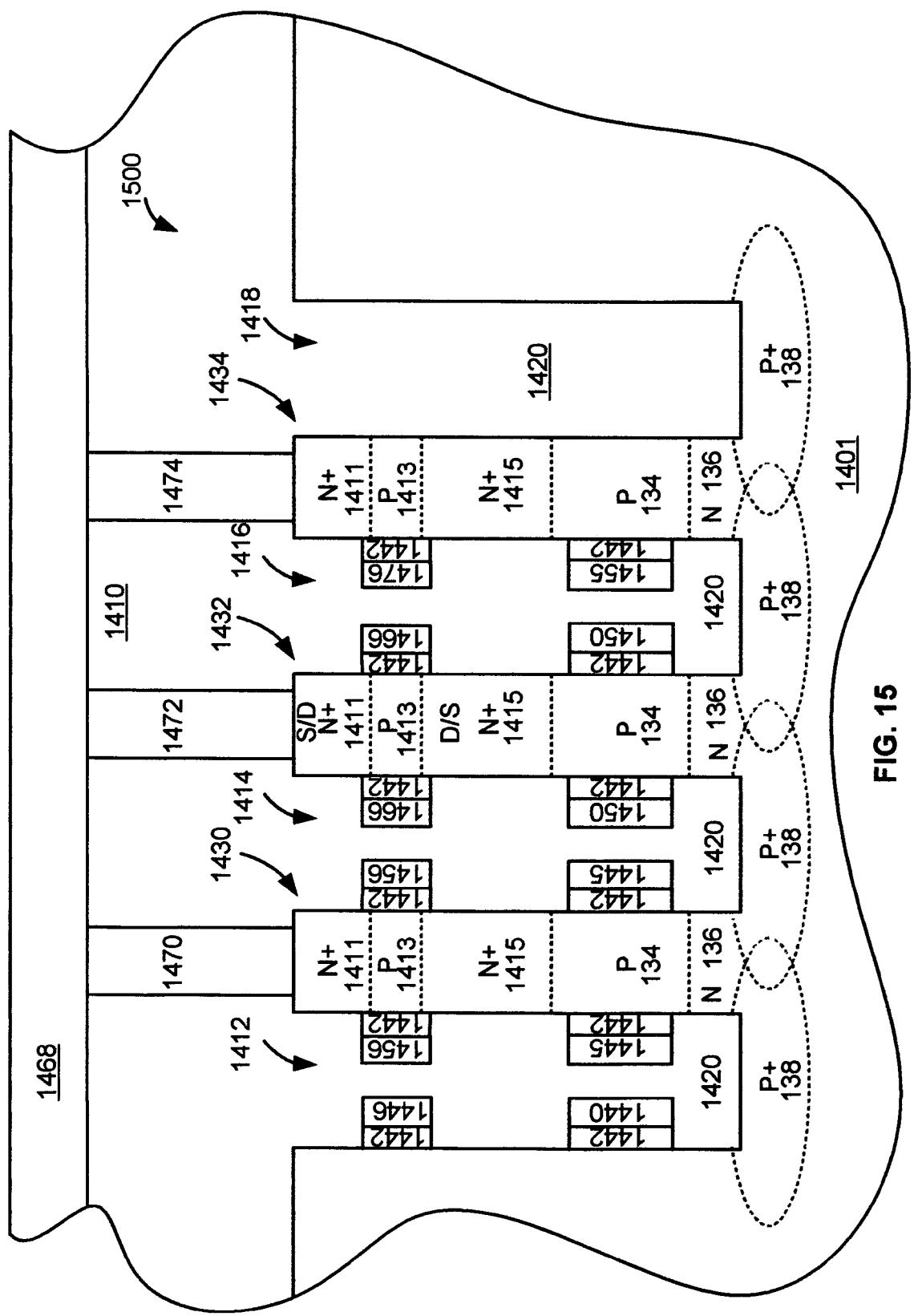
FIG. 15 is a simplified partial cross-sectional side view of a memory array consistent with another embodiment of the present invention, showing electrodes disposed on opposite sidewalls of the pillars.
Figure 16:
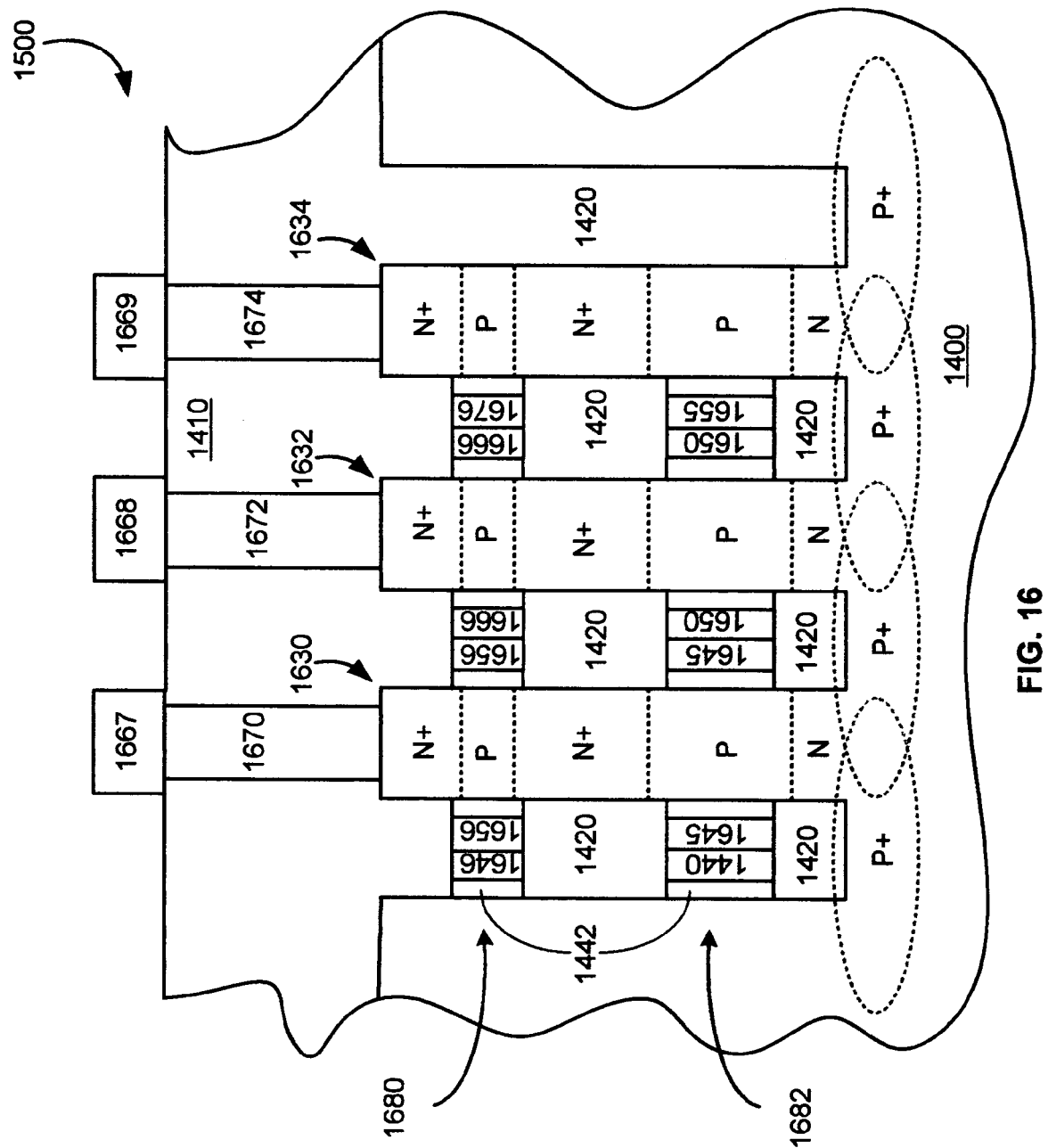
FIG. 16 is a simplified partial cross-sectional side view of a memory array consistent with another embodiment of the present invention, showing some pillars along a row sufficiently close to allow gates and electrodes to interconnect.

Referencing FIG. 15, a memory array 1500 may be viewed in cross-sectional view from a first side view direction, while in FIG. 16, it may be viewed in cross-sectional view from a second side view direction that may be perpendicular to the first direction. Referencing FIGS. 15 and 16, memory array 1500 may comprise a plurality of pillars that define an array of rows and columns. FIG. 15 may represent a view cutting through a column of the memory array 1500, and FIG. 16 may represent a view cutting through a row of the memory array 1600.

First referencing FIG. 15, conductive gates 1456 and 1466 may partially or totally encircle a circumference of body regions 1413 of respective pillars. Capacitor-electrodes, e.g., 1445 and 1450, may also partially or totally encircle a circumference of p-base regions 134 to respective pillars 1430 and 1432. The gates may be capacitively coupled to the transistor bodies 1413; while the capacitor-electrodes 1445, 1450; likewise, may be capacitively coupled to the thyristor p-bases 134.

Further referencing FIG. 15; the pillars 1430, 1432, and 1434 along a column may have a distance between them sufficient to prevent contact between their respective gate and capacitor-electrodes. Again, it may be noted that the pillars of the column may be associated with a common bitline 1468.

Referencing FIG. 16, the pillars 1630, 1632, 1634 of a given row may define a distance between them that is less than that defined between the pillars of a column. In a particular embodiment, the separation between pillars within the row may be sufficiently narrow to interconnect gate and capacitor electrodes along the length of the row. For example, along this row of pillars, gates 1656 and 1666 may short together, and capacitor-electrodes 1645, 1650 may also short together.

Accordingly, the gate electrodes along a row may be electrically coupled to form a common electrode of a first wordline 1680; and the capacitor-electrodes of the row may be electrically coupled to form a common electrode of a second wordline 1682. Within the row, the separate pillars 1630, 1632, 1634 may be electrically coupled to separate respective bitlines 1667, 1668, and 1669. Thus, the memory cell of a pillar may be operable by a combination of voltage levels on first wordline 1680, and second wordline 1682 for signal propagation on separate bitlines 1667, 1668, and 1669.

Figure 17:
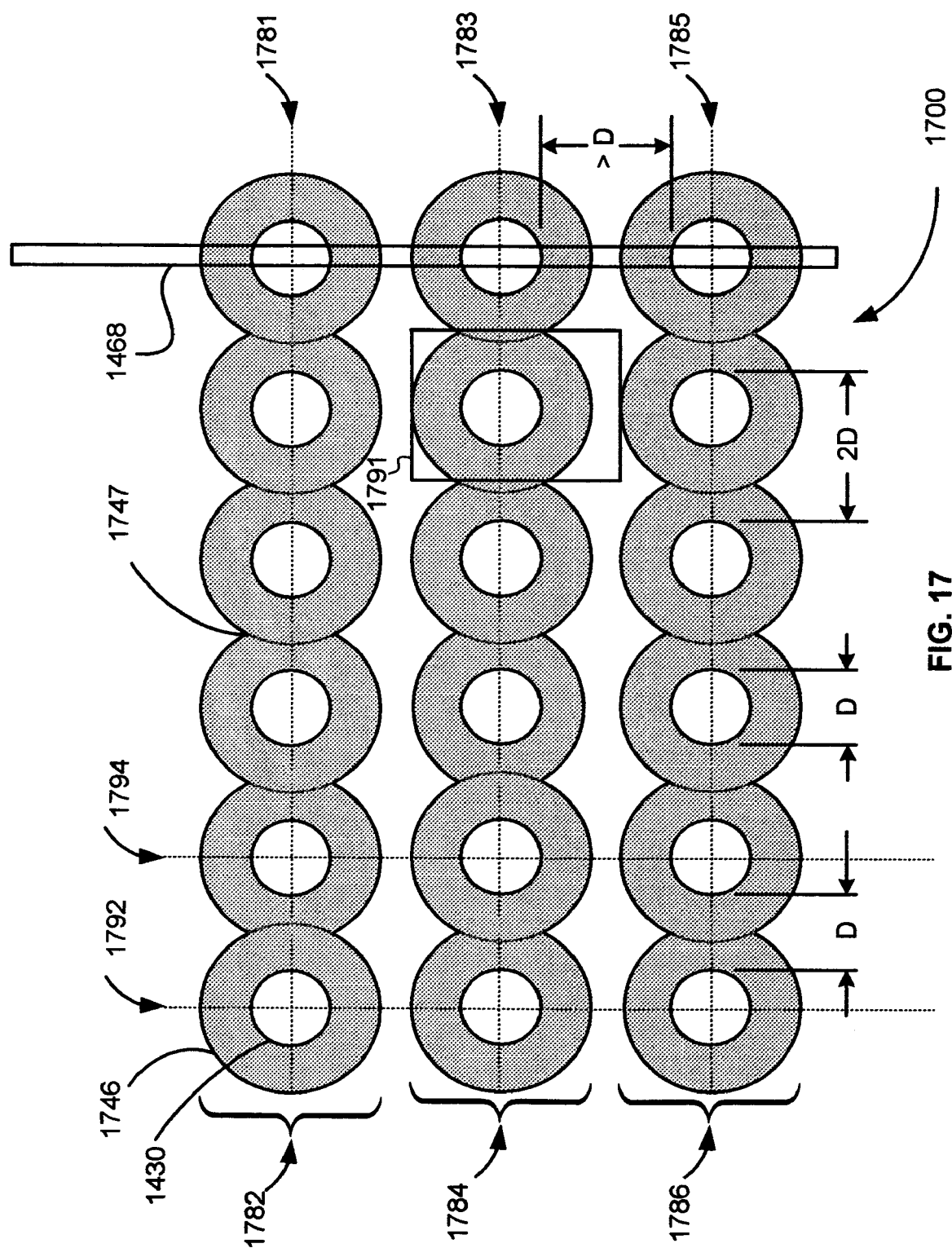
FIG. 17 is a simplified partial view of a memory array consistent with another embodiment of the present invention, showing round pillars (as seen from a top view) disposed in rows and columns, and showing conductive sleeves encircling the individual pillars shorting along a row.

Referencing FIG. 17, a thyristor-based memory array 1700 may comprise a plurality of memory cells that define rows 1781, 1783, and 1785 orthogonal to columns 1792, 1794 . . . . Conductive sleeves 1746, perhaps comprising polysilicon, may encircle and capacitively couple (via dielectric not shown) to pillars 1430. Within a given row, the sleeves 1746 may short together (for example, short 1747) to define common electrodes of wordlines 1782, 1784, 1786, respectively. Conversely, within a given column 1792, 1794, an interspacing may avoid intercoupling of the sleeves that may be associated with separate wordlines.

Further referencing FIG. 17, in accordance with one embodiment, pillars 1430 may comprise a round circumference of diameter D. Within the rows 1781, 1783, 1785 the pillars 1430 may be laterally separated by a distance as great as D. In a column, on the other hand, the pillars may be spaced sufficiently great to prevent the sleeves 1746 of the different wordlines from shorting together. In a particular embodiment, a spatial periodicity may extend laterally along a row with spatial period (pillar and gap) as great as 2D.

Within the columns 1792, 1794 the pillars 1430 may be separated by a distance greater than D, and perhaps as great as 2D, which may be sufficiently great to prevent the sleeves 1746 from shorting together. In a particular embodiment, the spatial periodicity longitudinally along a column with a spatial period (pillar and gap) greater than 2D and perhaps as great as 3D. Accordingly, the area of a memory cell 1791, in such embodiments, may be less than $6D^2$.

In a further embodiment, D may be representative of a minimum dimension per a given (photolithographic) technology, which could comprise, e.g., a value of 130 nanometers.

Figure 18A:
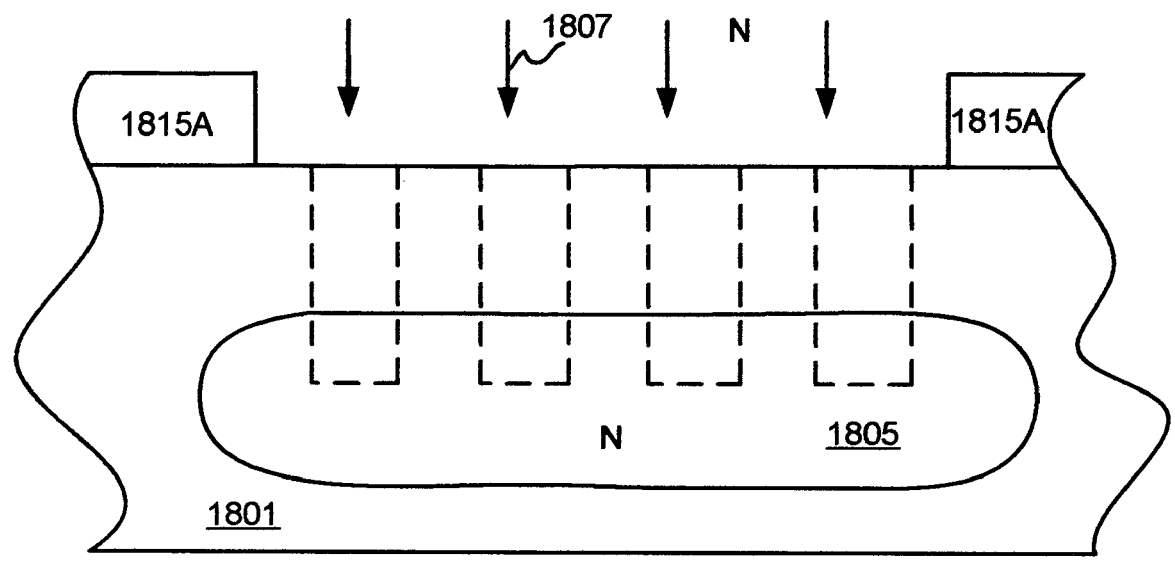
FIG. 18A is a simplified partial cross-sectional view of a semiconductor device, useful to describe a method of processing a semiconductor device for an embodiment of the present invention, in an early stage of fabrication showing the formation of a buried implant.

In accordance with an embodiment of the present invention, referencing FIG. 18A, dopant implants may be implanted (e.g., via a retrograde implant procedure) into a substrate 1801 to form buried layer 1805.

Further referencing FIG. 18A, semiconductor substrate 1801 may be a layer with protective material 1815A patterned to define a window and exposing an area of the semiconductor substrate 1801 to be associated with an array of pillars for the memory array. N-type dopant 1807 may be directed through the window defined by the mask 1815A and with sufficient energy into semiconductor substrate 1801 to define a buried implant region 1805 extending beneath the desired pillars.

Figure 18B:
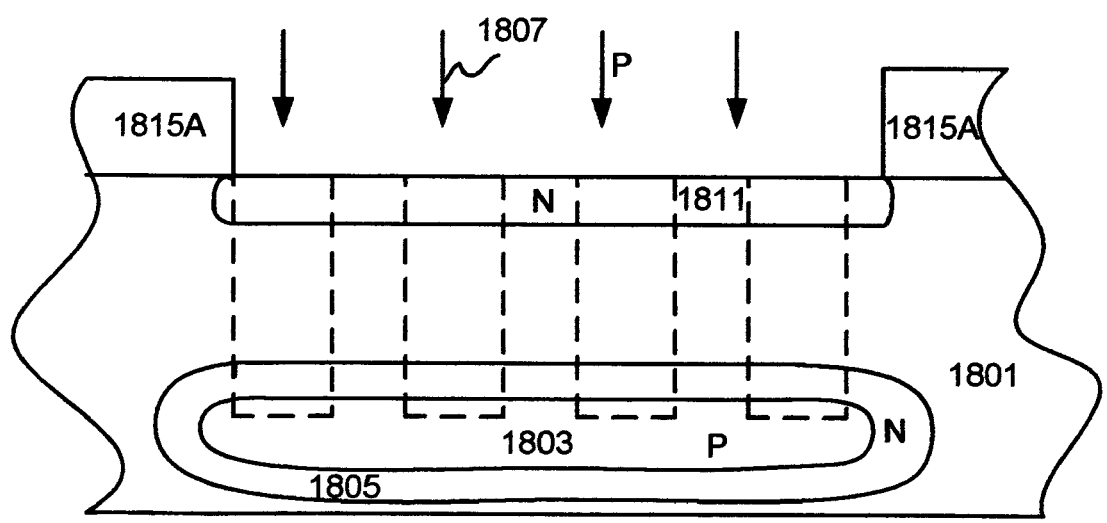
FIG. 18B is a simplified partial cross-sectional view of the semiconductor device of FIG. 18A in another stage of fabrication showing the formation of another buried implant.

Referencing FIG. 18B, p-type dopant 1809 may then be driven into the semiconductor substrate 1801 with energy sufficient to define a buried p-region 1803 with an average depth slightly less than the previously defined buried n-region 1805. In a particular embodiment, buried p-region 1803 will be used for propagating a reference voltage to anode-emitter regions for thyristors to be formed in the pillars of the array. Further referencing FIG. 18B, n-type dopant may then be diffused into an upper surface region 1811 of the substrate with a dosage appropriate for source/drain regions for an access transistor.

Figure 18C:
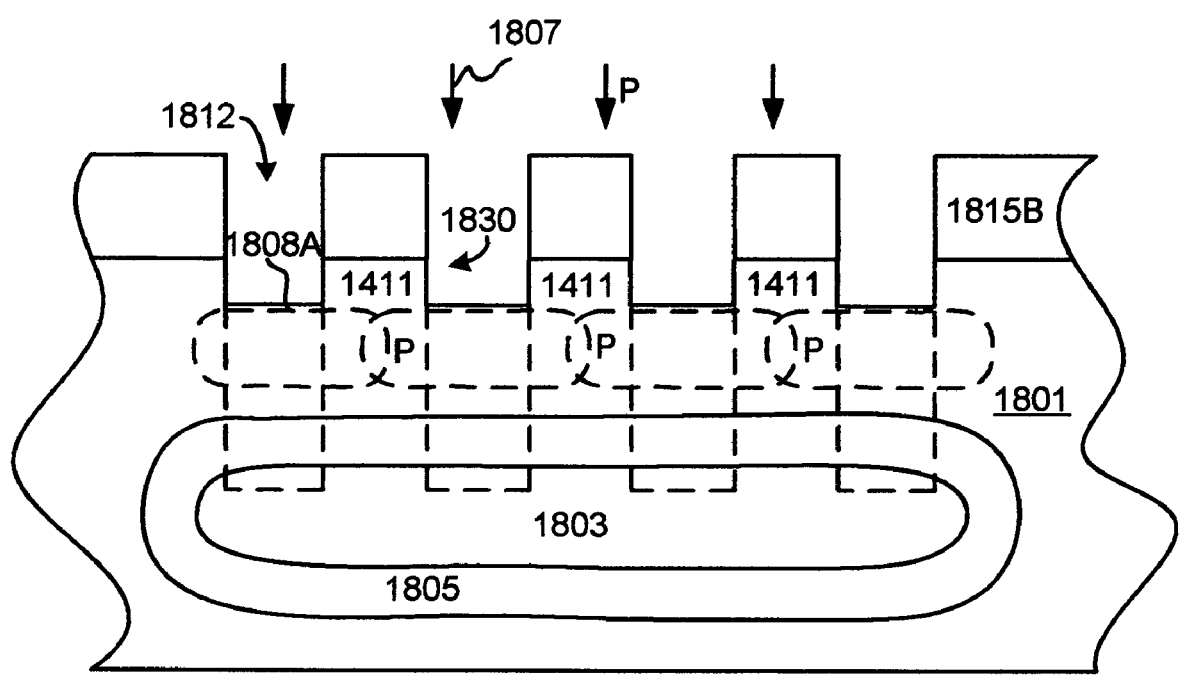
FIG. 18C is a simplified partial cross-sectional view of the semiconductor device of FIG. 18A in another stage of fabrication showing the formation of pillar sidewalls and of body regions of intended transistors to be formed in the pillars.

Next, referencing FIG. 18C, new masking material 1815B may be deposited and patterned over the semiconductor substrate 1801. In one example, the mask material may comprise photoresist that may be patterned using, e.g., photolithographic procedures for defining openings therethrough and to expose regions of the substrate for the formation of trenches. The resulting protective elements of patterned mask 1815B may be described alternatively as islands of protective material disposed over regions of the semiconductor substrate to protect sites for the formation of pillars.

Using mask 1815B as an etch block, exposed regions of the semiconductor substrate 1801 may be etched to form a trench (e.g., 1812) and lower a floor 1808A for the trench to an elevation between the N+ source/drain region 1411 and a desired p-body for the access transistors within the pillars. Next, p-type dopant 1809 may be implanted with energy sufficient to provide a lateral scattering of the dopant at least halfway through the diameters of the pillars (e.g., 1830). Additionally, the dosage of p-type dopant 1809 may define some of the channel characteristics for the access transistors.

Figure 18D:
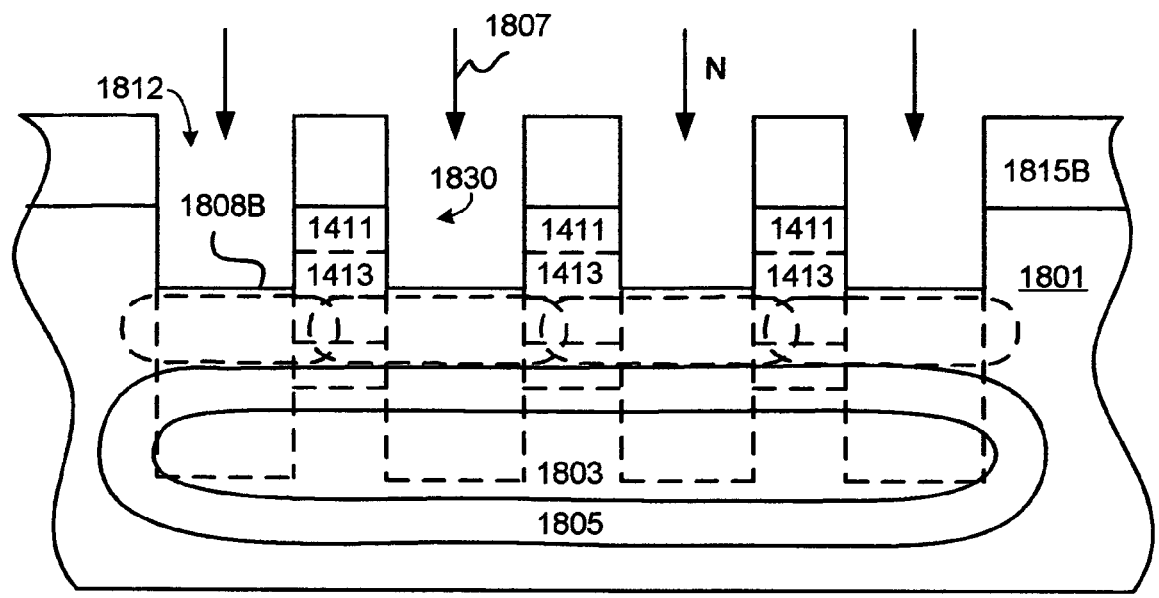
FIG. 18D is a simplified partial cross-sectional view of the semiconductor device of FIG. 18A in another stage of fabrication showing the formation of source and drain regions of intended transistors to be formed in the pillars.
Figure 18E:
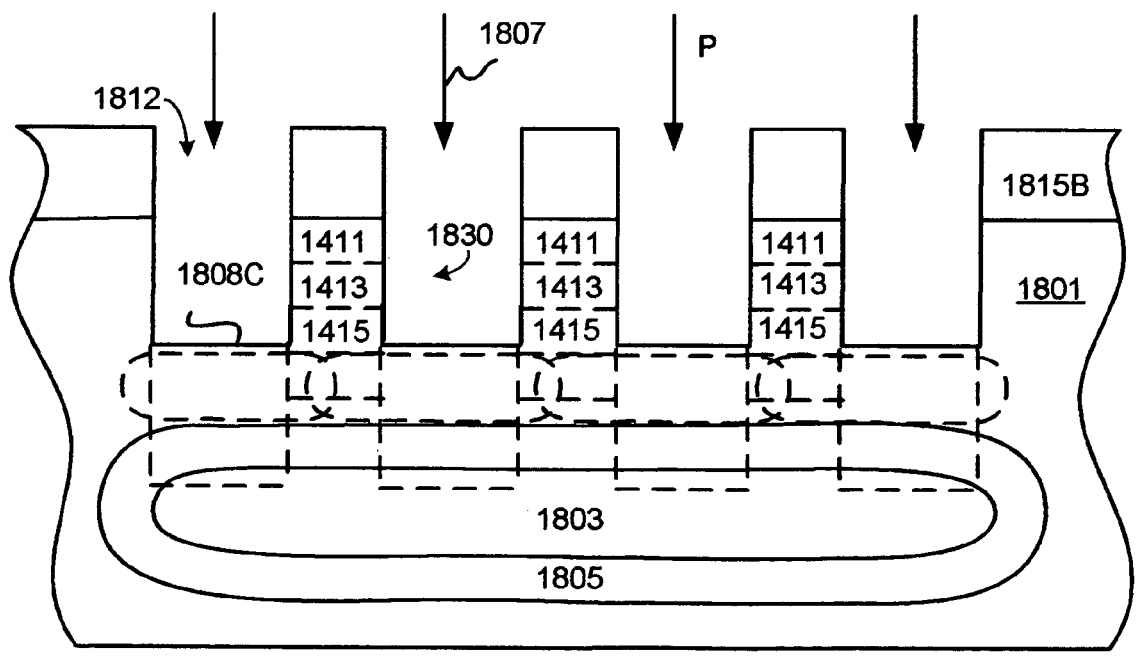
FIG. 18E is a simplified partial cross-sectional view of the semiconductor device of FIG. 18A in another stage of fabrication showing the formation of a base region of intended thyristors to be formed in the pillars.

Next, referencing FIGS. 18D and 18E, exposed regions of the semiconductor material defined by the trench 1812 may be further etched to lower the floor 1808B to an elevation between the p-body region 1413 and the desired drain/source (or cathode-emitter) region. This etch may be performed anisotropically while using the mask material 1815B as a protective pattern over pillars (e.g., 1830) and other peripheral regions of the semiconductor substrate 1801. Upon lowering the trench floor 1808B to an elevation at the boundary between the p-body and 1413 drain/source regions, n-type dopant 1807 may be implanted into the semiconductor material 1801 and with energy sufficient to scatter dopant laterally (via the lateral straggle) to implant the drain/source or cathode-emitter regions within the pillars.

Referencing FIG. 18E, further etching may then be performed to lower the floor 1808C of the trenches (e.g., 1812) down to an elevation between the cathode-emitter 1415 and the desired p-base region for the thyristors. P-type dopant 1809 may then be implanted into exposed regions of the substrate with energy sufficient to scatter dopant laterally and to dope the desired p-base region 134 for the thyristor device within the pillars.

Figure 18F:
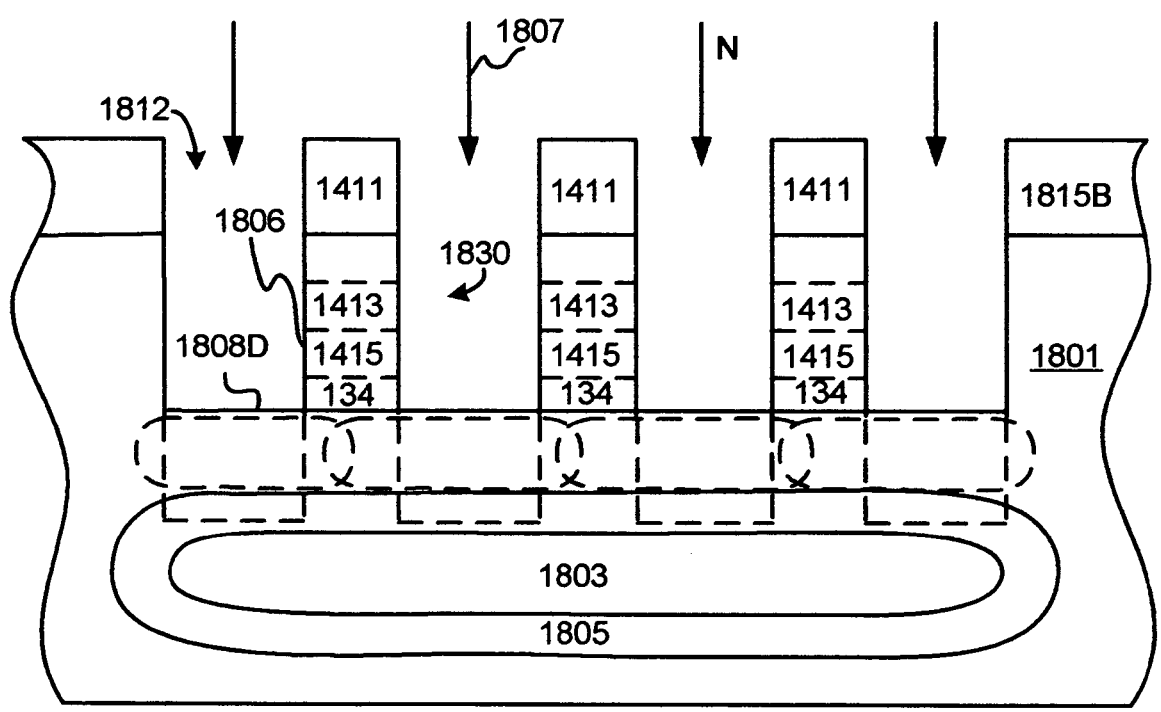
FIG. 18F is a simplified partial cross-sectional view of the semiconductor device of FIG. 18A in another stage of fabrication showing the formation of another base region of intended thyristors to be formed in the pillars.

Moving forward, with reference to FIG. 18F, additional anisotropic etching may be performed to further recess the trench floor 1808D to an elevation between the p-base region 134 and the desired n-base region for the thyristors. This may further define sidewalls 1806 for the pillars 1830. N-type dopant 1807 may then be directed to exposed regions of the semiconductor substrate, which may impact the floor 1808D of the trench regions 1812 and scatter laterally to implant (using the lateral straggle technique) the desired n-base regions for the thyristors with the pillars.

Figure 18G:
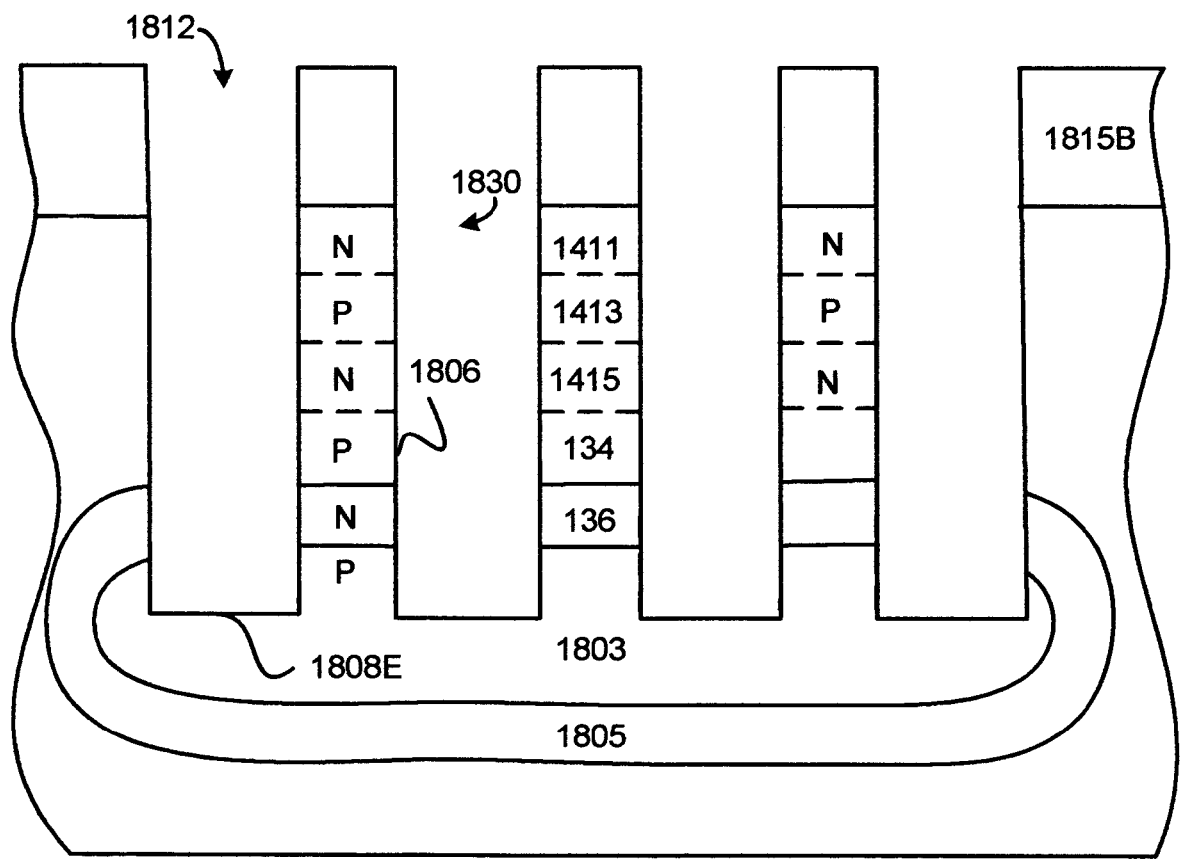
FIG. 18G is a simplified partial cross-sectional view of the semiconductor device of FIG. 18A in another stage of fabrication showing the extension of trench floors into buried anode-emitter regions for thyristors.

Referencing FIG. 18G, upon implanting the n-base regions for the thyristor, the trench regions may be further etched anisotropically to lower the floors 1808E of the trenches downward and into the buried p-region 1803. This may be understood to define sidewalls (e.g., 1806) of the pillar 1830 about the n-base region 136 and a portion for the p-anode-emitter region 1803 for the thyristor device. Thus, a pillar of semiconductor material within the memory array may comprise alternating layers of n-p-n-p-n-p dopant regions 1411, 1413, 1415, 134, 136, 1803, respectively, for portions of an access transistor and thyristor of a memory device.

In an alternative embodiment, referencing FIGS. 19A through 19F, relative to the embodiment described previously with respect to FIGS. 18A through 18G, a method of forming a semiconductor device may similarly comprise patterning first mask material 1815A over a semiconductor substrate 1801 to define a window and expose regions 1900 of the semiconductor substrate 1801 to be associated with pillars for a memory array. N-type dopant 1807 may be directed through the window with energy sufficient to form buried n-region 1805 (FIG. 19A) of depth to encompass the area beneath the memory array. P-type dopant 1809 may also be implanted through the window defined by the mask 1815A to form a buried p-region 1803 (FIG. 19B) having a nominal depth less than that for buried n-region 1805.

Figure 19A:
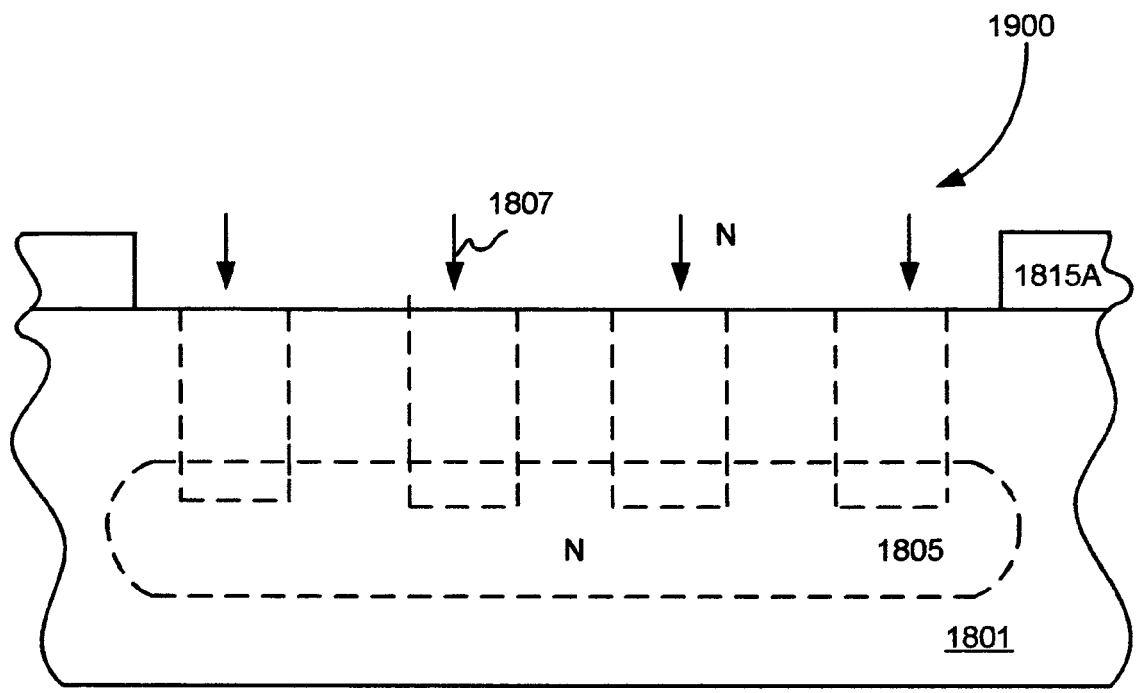
FIG. 19A is a simplified partial cross-sectional view of a semiconductor device, useful to describe a method of processing a semiconductor device for an embodiment of the present invention, in an early stage of fabrication showing the formation of a buried implant.
Figure 19B:
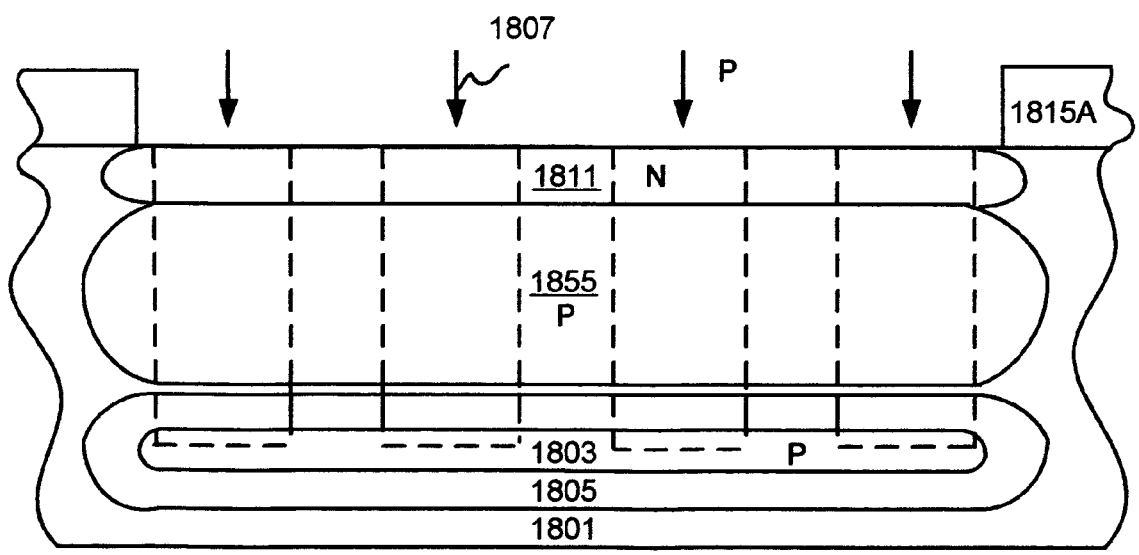
FIG. 19B is a simplified partial cross-sectional view of the semiconductor device of FIG. 19A in another stage of fabrication showing the formation of additional buried regions.

Further referencing FIG. 19B, an additional p-type retrograde implant may be performed for distributing p-type dopant across an area for the array with a depth distribution to extend through region 1855 of the semiconductor substrate 1801. This depth distribution may include regions a p-well (or body region) for the access transistors and also the p-base regions to the thyristors that are to be formed in the pillars for the memory array. Again, n-type dopant may then be diffused into a surface region 1811 to be associated with the formation of source/drain regions for access transistors.

Figure 19C:
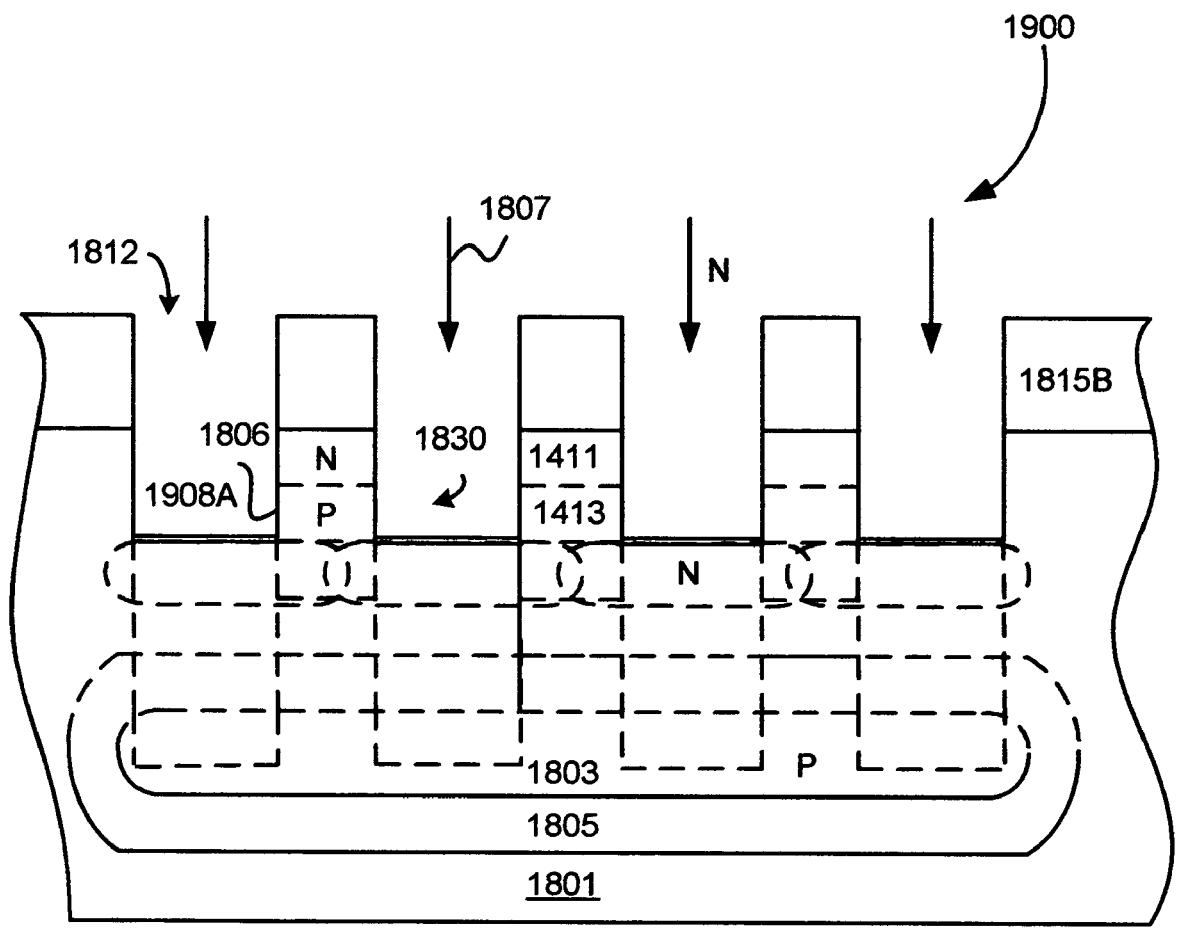
FIG. 19C is a simplified partial cross-sectional view of the semiconductor device of FIG. 19B in another stage of fabrication showing the formation of pillar sidewalls and of source and drain regions of intended transistors to be formed in the pillars.

Referencing FIG. 19C, a second masking material 1815B may be layered and patterned over semiconductor substrate 1801 to define openings for exposing regions of a semiconductor substrate 1801 to be etched pillars 1830 to form sidewalls 1806 defining of an array 1900. Per the cross-section through the row of pillars, the pillar sidewalls may define at least, in part, trenches 1812. The anisotropic etch may be continued for lowering floors 1908A of trenches 1812 to an elevation between the p-bodies of the access transistors and the drain (or cathode-emitter) regions that are to be defined in the pillars. Upon reaching this depth, n-type dopant 1807 may be implanted with an energy sufficient to extend portions of the dopant laterally across at least half the width for the pillars.

Figure 19D:
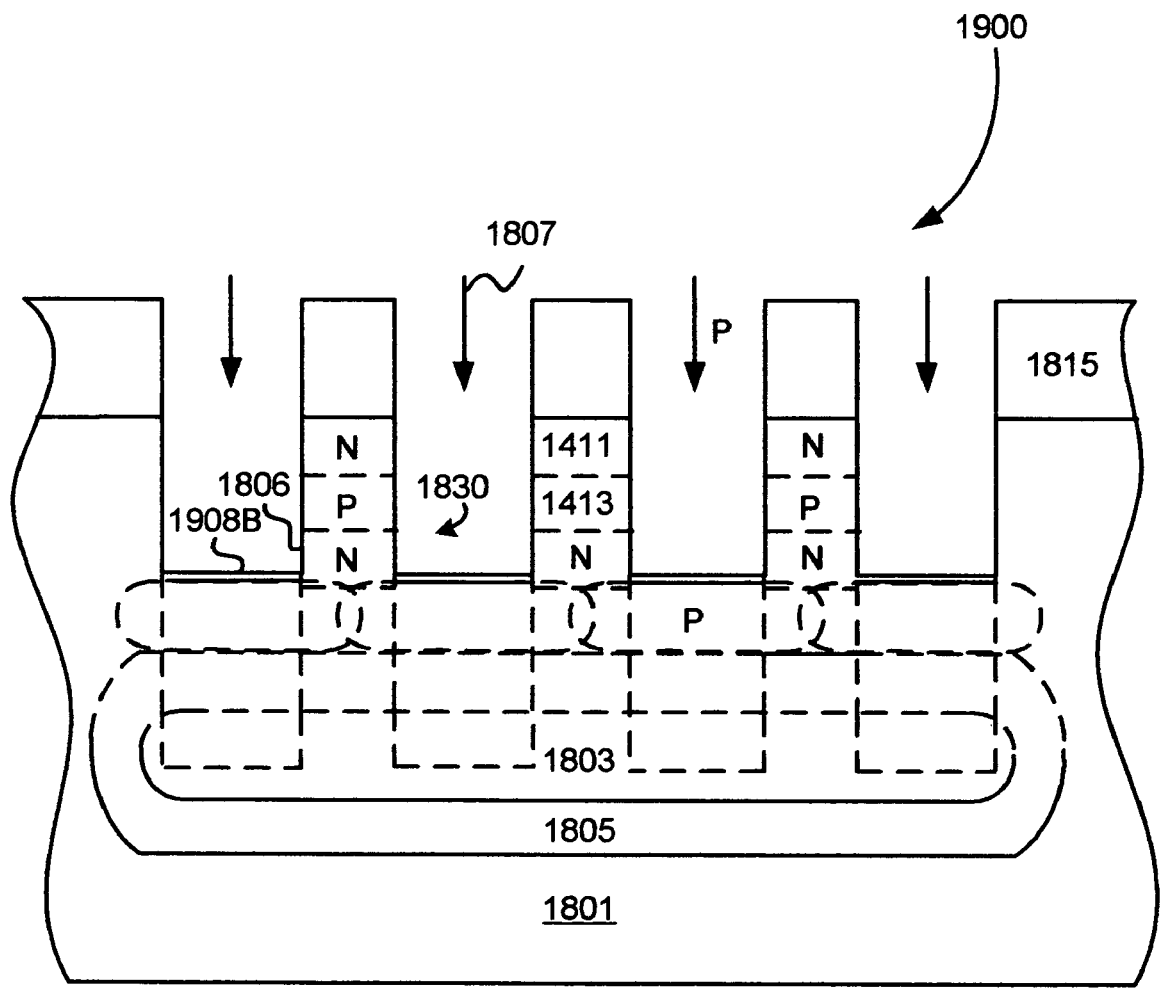
FIG. 19D is a simplified partial cross-sectional view of the semiconductor device of FIG. 19C in another stage of fabrication showing the formation of a base region of intended thyristors.
Figure 19E:
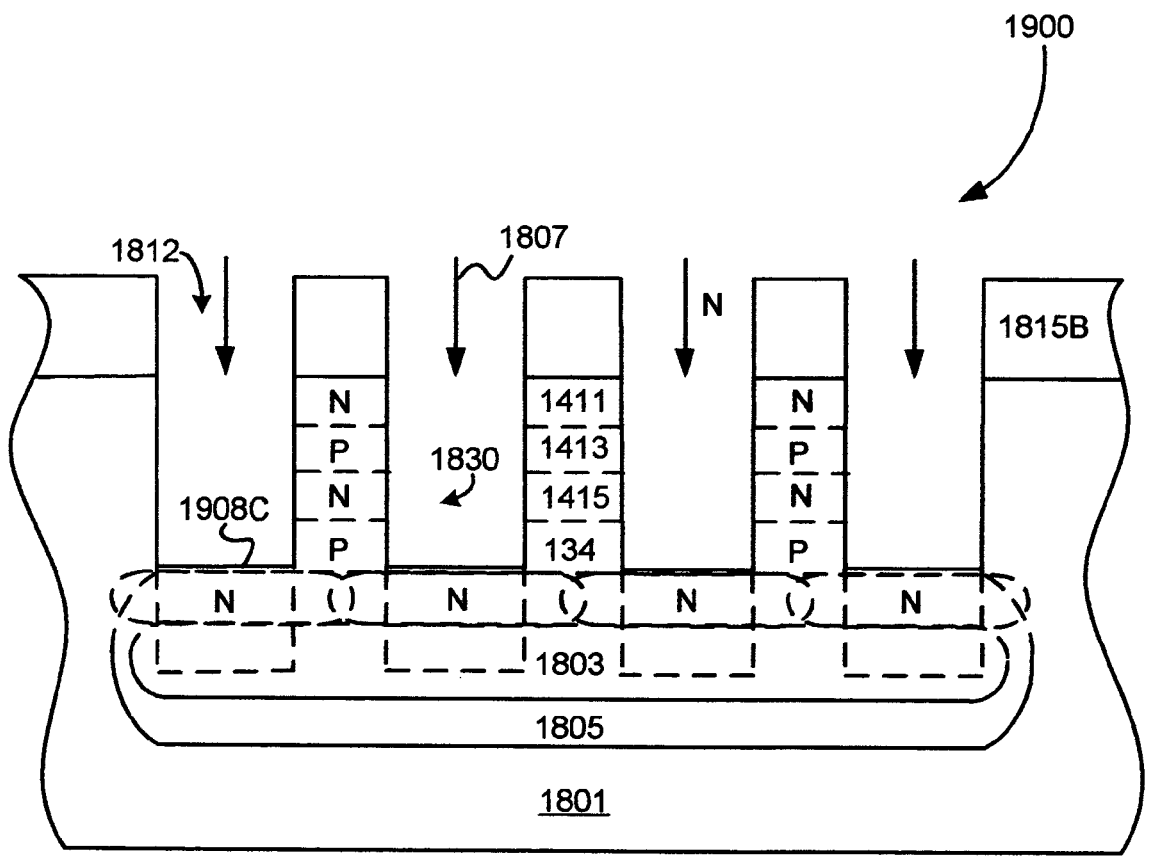
FIG. 19E is a simplified partial cross-sectional view of the semiconductor device of FIG. 19D in another stage of fabrication showing the formation of another base region of intended thyristors.
Figure 19F:
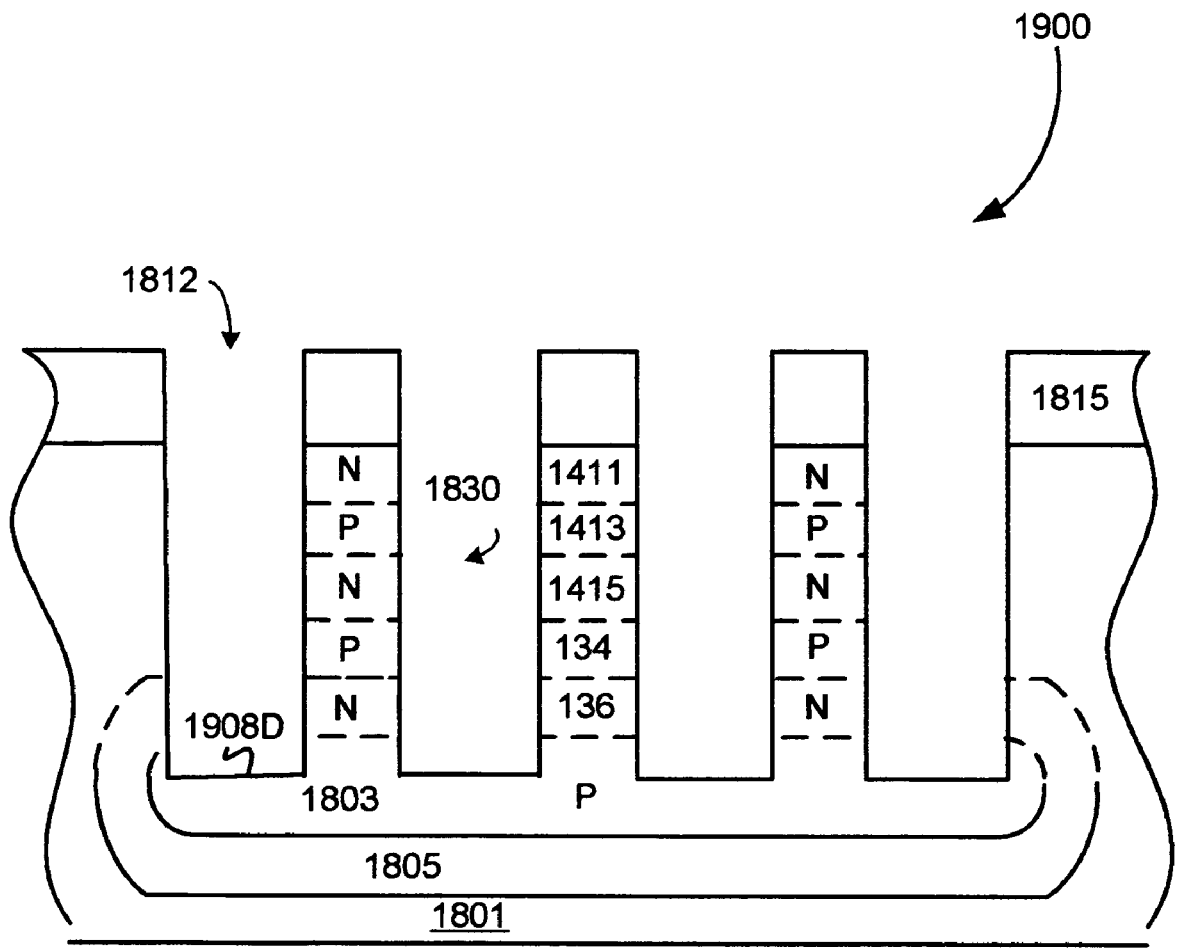
FIG. 19F is a simplified partial cross-sectional view of a semiconductor device of FIG. 19E in another stage of fabrication showing the extension of trench floors into buried implant regions to further define the thyristors.

An anisotropic etch may then be performed, referencing FIG. 19D, to further lower the depth of the trenches 1812 to an elevation appropriate for implanting the p-base regions for the thyristors. Alternatively, assuming a previous p-region 1855 implant described relative to FIG. 19B, the anisotropic etch may be continued further until lowering trench floors 1908C to an elevation between the desired n-base and p-base regions for the thyristor devices, as illustrated in FIG. 19E. N-type dopant 1807 may then be directed into exposed regions of the semiconductor substrate and scattered laterally into the pillar regions for defining the n-base regions for the thyristors. Thereafter, referencing FIG. 19F, the trench floor may be further etched anisotropically for extending the floor 1908D into the buried implant region 1803 of p-type dopant.

Figure 20A:
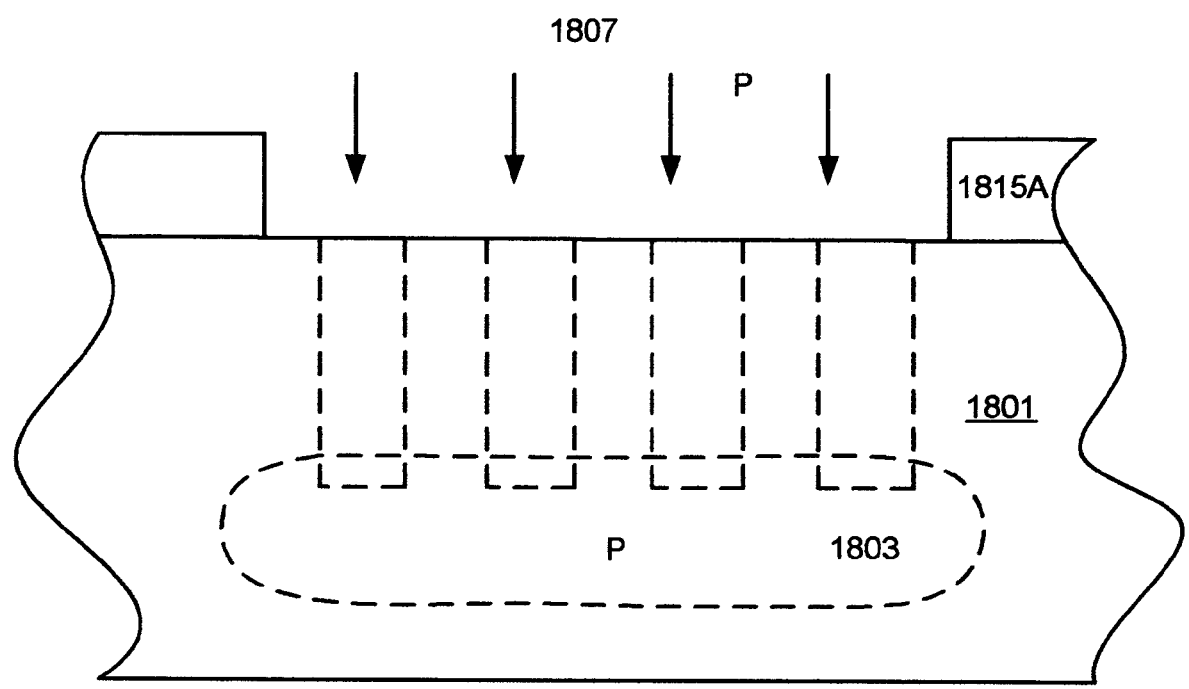
FIG. 20A is a simplified partial cross-sectional view of a semiconductor device, useful to describe a method of processing a semiconductor device for an embodiment of the present invention, in an early stage of fabrication showing the formation of a buried implant.

In accordance with a further embodiment of the present invention, referencing FIG. 20A, a semiconductor substrate 1801' may comprise n-type conductivity. First mask material 1815A may be patterned over the surface of semiconductor substrate 1801' to define openings and expose portions of the substrate to be associated with a memory array. P-type dopant 1809 may then be implanted into the substrate through the window defined by mask 1815A. The dopants of the p-type implant 1809 may be implanted with energy sufficient to establish a mean depth and form buried p-region 1803. It may be noted that this p-dopant buried region 1803 may be used for defining in part anode-emitters of thyristors to be formed for the array of memory devices.

Figure 20B:
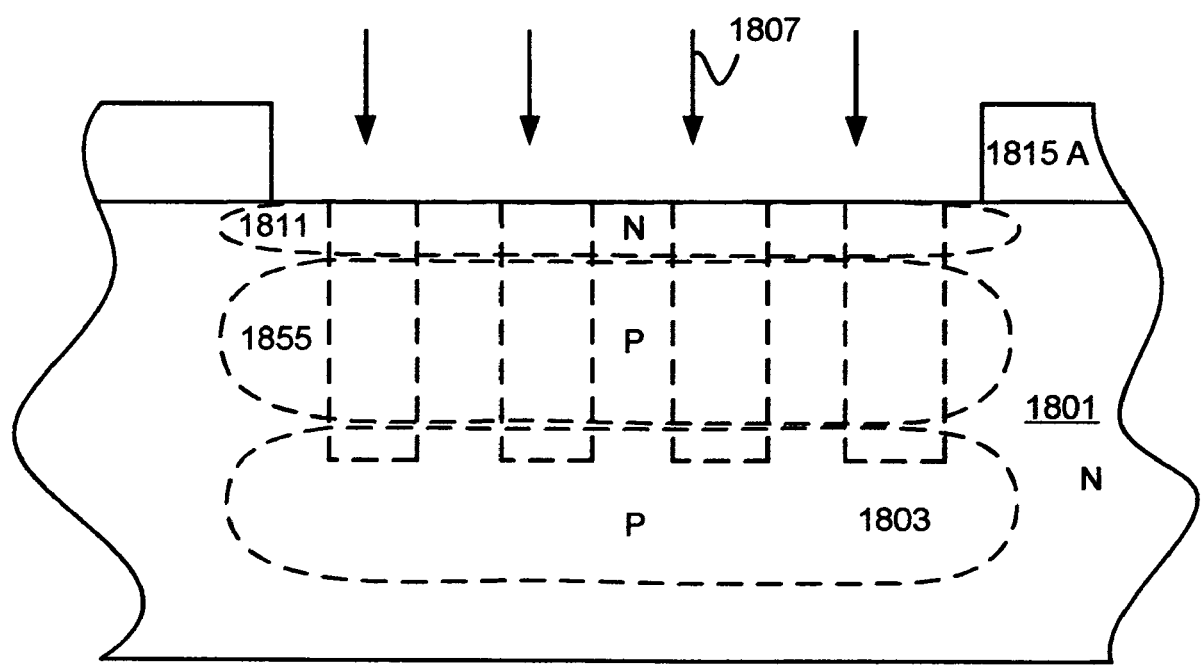
FIG. 20B is a simplified partial cross-sectional view of the semiconductor device of FIG. 20A in another stage of fabrication showing the formation of a surface implant.

Referencing FIG. 20B, a retrograde implant of p-type dopant may be performed to define an extended p-region 1855 within semiconductor substrate 1801. The region 1855 of p-implant may extend a depth of the substrate to be associated with desired p-base regions (for thyristors) and p-body regions (to access transistors) for the memory devices. These p-base and p-body regions for the thyristors and access transistors respectively will be formed within pillars that are to be patterned for the memory devices within the array. Again, n-type dopant diffusion may be performed to dope a surface layer 1811 of the semiconductor substrate to be associated with source regions for access transistors.

Figure 20C:
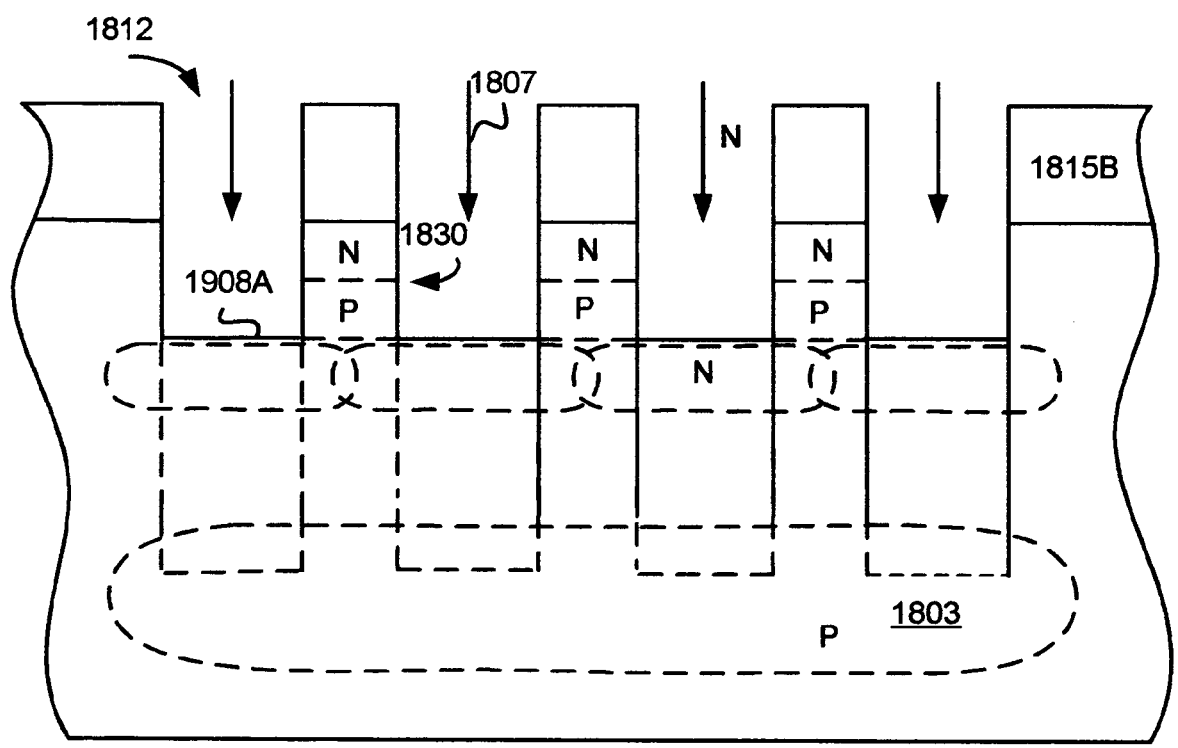
FIG. 20C is a simplified partial cross-sectional view of the semiconductor device of FIG. 20B in another stage of fabrication showing the formation of pillar sidewalls and of source and drain regions of an intended transistor.

Continuing, with further reference to FIG. 20C, first mask material 1815A may be removed and mask material layered and patterned to define a second mask 1815B over the semiconductor substrate. Sidewalls of the second mask define apertures to expose regions of semiconductor substrate 1801 for etching. After defining the second mask 1815B, exposed regions of the semiconductor substrate may be etched to form sidewalls therein and to define trenches 1812. The sidewalls of the trench begin to define pillars 1830 beneath the islands of protective material associated with mask 1815B. The anisotropic etching may continue for receding the floor 1908A to an elevation to be associated with an n-drain or cathode-emitter. At this depth, the anisotropic etching may be discontinued and n-type dopant implanted with energy sufficient to extend the dopant laterally through a width of the desired columns (per a lateral straggle technique).

Figure 20D:
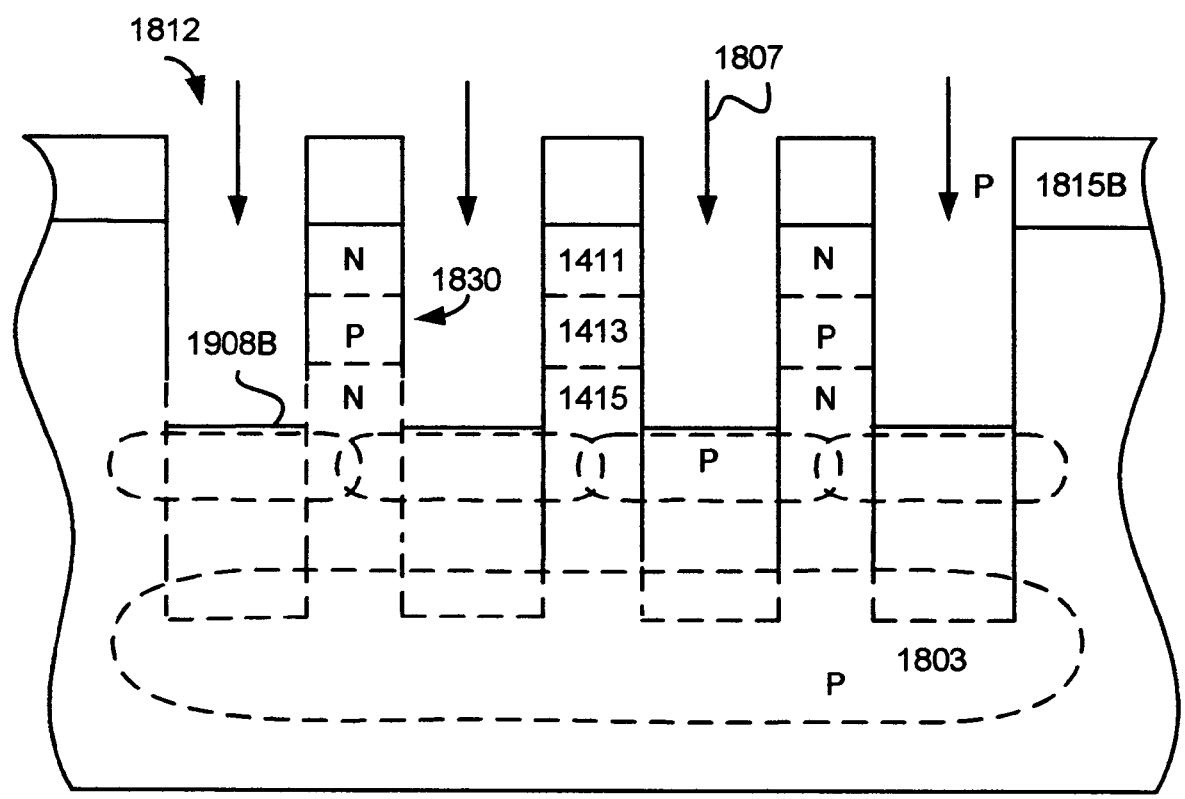
FIG. 20D is a simplified partial cross-sectional view of the semiconductor device of FIG. 20C in another stage of fabrication showing the formation of p-base regions of intended thyristors to be partially formed in the pillars.

Moving forward, with reference to FIG. 20D, additional anisotropic etching may again be performed while continuing to use mask 181 SB as an etch mask. Further, semiconductor material may be removed to further recess the floor 1908B of the trenches 1812 to an elevation, in a particular embodiment, to be associated with a p-base region. P-type dopant may be implanted (per a lateral straggle technique) with energy sufficient to scatter the p-type dopant laterally for doping the width of the columns. Note, this p-type dopant for the lateral straggle of p-type for the p-base region may be optional if the previous retrograde implant, as referenced in FIG. 20B, may have been sufficient for the extension of the retrograded implant region 1855 with desired density of p-type dopant.

Figure 20E:
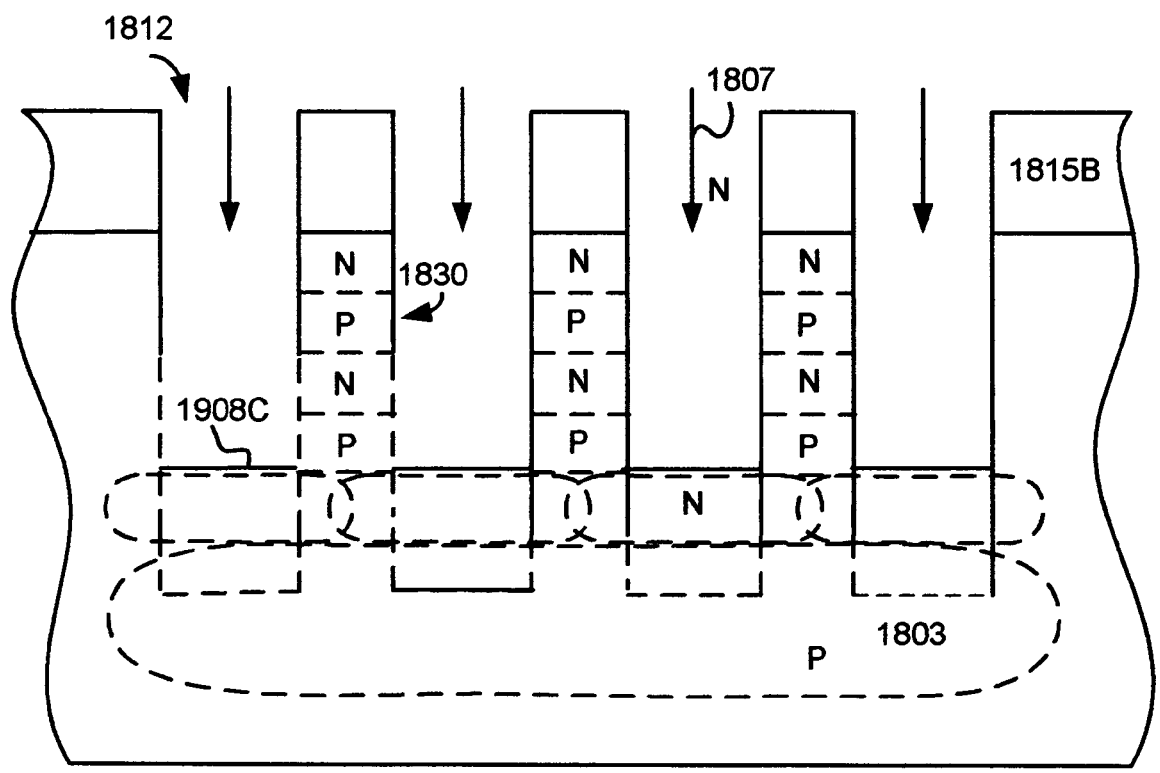
FIG. 20E is a simplified partial cross-sectional view of the semiconductor device of FIG. 20D in another stage of fabrication showing the formation of n-base regions of intended thyristors to be partially formed in the pillars.

Continuing with this embodiment, referencing FIG. 20E, anisotropic etching may again be performed for lowering the trench floor 1908C to an elevation for the n-base regions for the thyristors. N-type dopant may then be implanted with energy sufficient for the lateral straggle technique to scatter the n-type dopant laterally through the widths of the pillars to define the n-base regions for the thyristors.

Figure 20F:
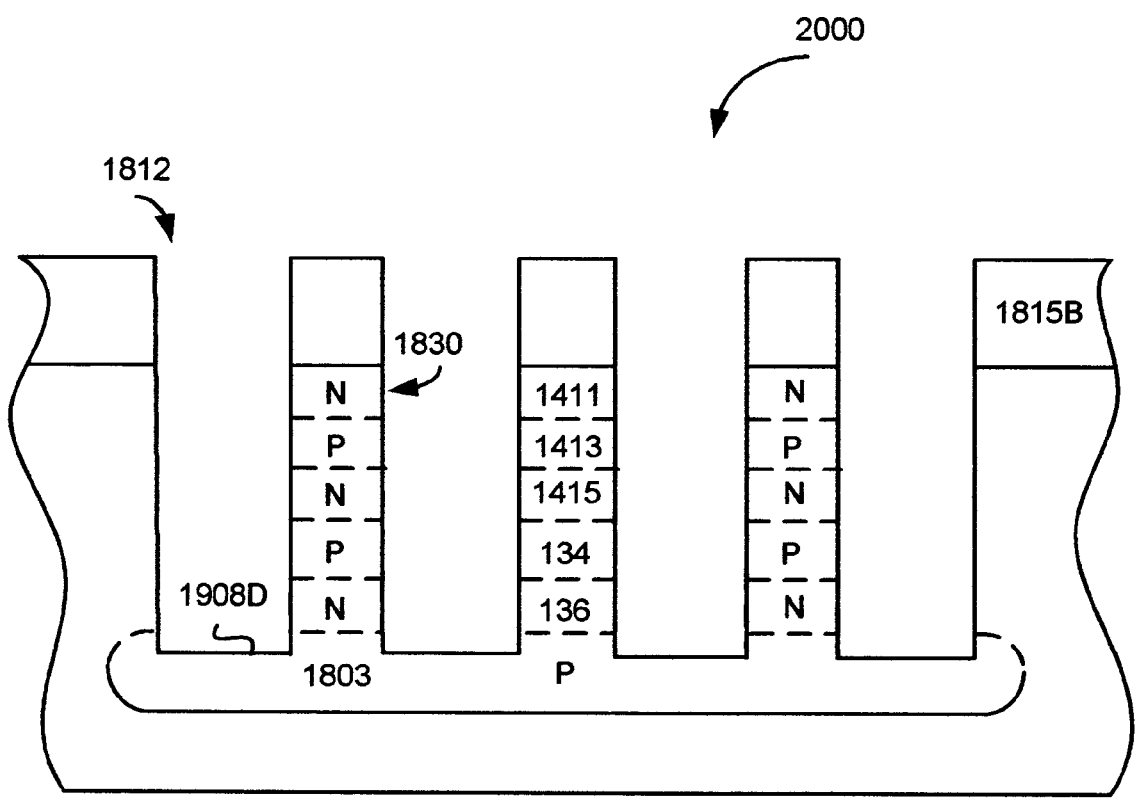
FIG. 20F is a simplified partial cross-sectional view of the semiconductor device of FIG. 20E in another stage of fabrication showing the extension of trench floors into the buried implant region for further definition of anode-emitter regions for the thyristors.

Next, referencing FIG. 20F, anisotropic etching may then be used to extend the floor 1908D of the trenches 1812 into the buried p-type region 1803. At this point, the sidewalls of the pillars may extend the depth of the trenches 1812. Each pillar 1830, in turn, may now comprise alternating layers of opposite conductivity-type semiconductor material 1411, 1413, 1415, 134, 136, and 1803 for source/drain, p-body, drain/source (or cathode-emitter), p-base, n-base, and anode-emitter regions, respectively, to the different thyristor based memory elements to the array 2000 of memory elements.

Figure 21A:
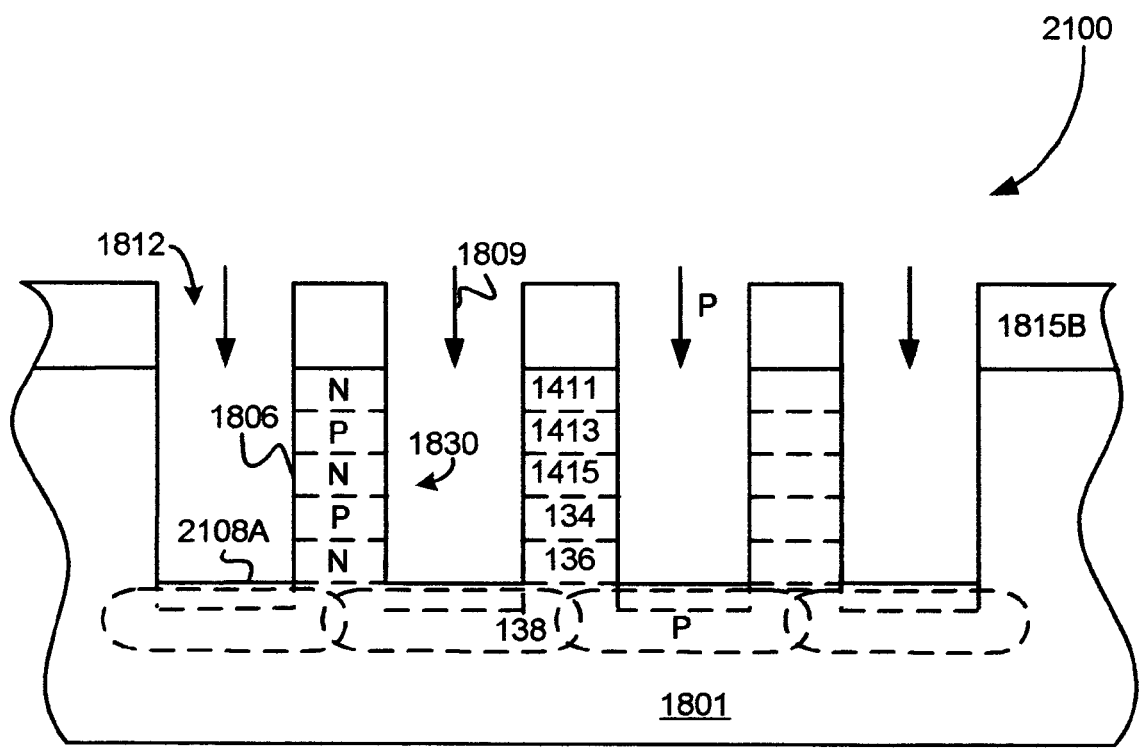
FIG. 21A is a simplified partial cross-sectional view of a semiconductor device, useful to describe a method of processing a semiconductor device for an embodiment of the present invention, in a stage of fabrication showing the doping of anode-emitter regions for thyristors partially formed in pillars of semiconductor material.
Figure 21B:
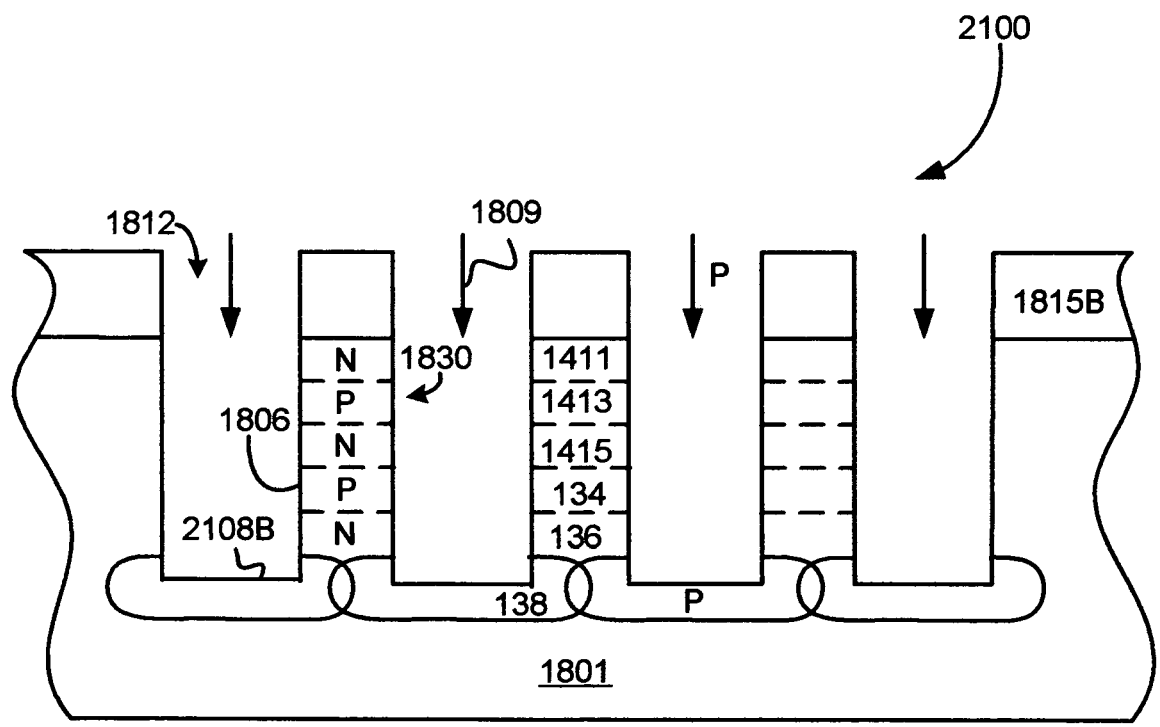
FIG. 21B is a simplified partial cross-sectional view of the semiconductor device of FIG. 21A in another stage of fabrication showing the lowering of trench floors to further define anode-emitter regions of thyristors partially formed in the pillars.

In another embodiment for a method of forming pillars to a semiconductor device, referencing FIGS. 21A and 21B, instead of forming both of the n-type and nested p-type buried layers (1805, 1803 relative to FIGS. 18A and 18B) early in the process, the trenches may be etched to define the pillars before the implanting for the anode-emitter region. In this particular embodiment, exposed regions of semiconductor material may be etched to form the trenches with sidewalls 1806 defining pillars 1830. Additionally, the originating semiconductor substrate 1801 in this embodiment may comprise N-type conductivity. Upon reaching a depth for defining the floor 2108A of the trench at an elevation between the n-base region and p-emitter regions for the thyristors, p-type dopant 1809 may then be implanted into the lower exposed regions of the semiconductor substrate as defined by mask 181 SB. The implant may be performed with energy sufficient to extend dopant laterally through widths to be associated with the pillars. Further referencing FIG. 21B, additional anisotropic etching may then further recess the floor 2100B of trench 1812 to extend sidewalls 1806 of the pillars into the previously implanted p-dopant regions 138. Accordingly, p-anode-emitter regions may be formed at the base of each pillar 1830. These pillar base regions may be separate slightly per respective vertical extents of the p-anode-emitter regions for other pillars within the array. Beyond the pillar foundations, the p-dopant regions 138 may overlap and commonly connect the anode-emitter regions of different thyristors.

Referencing FIGS. 22A through 22H, pillars for a semiconductor device may be formed using a method consistent with an embodiment of the present invention, in which the doping of pillars may be performed between different intervals associated with filling the trenches and defining the capacitor electrodes and gate electrodes.

Figure 22A:
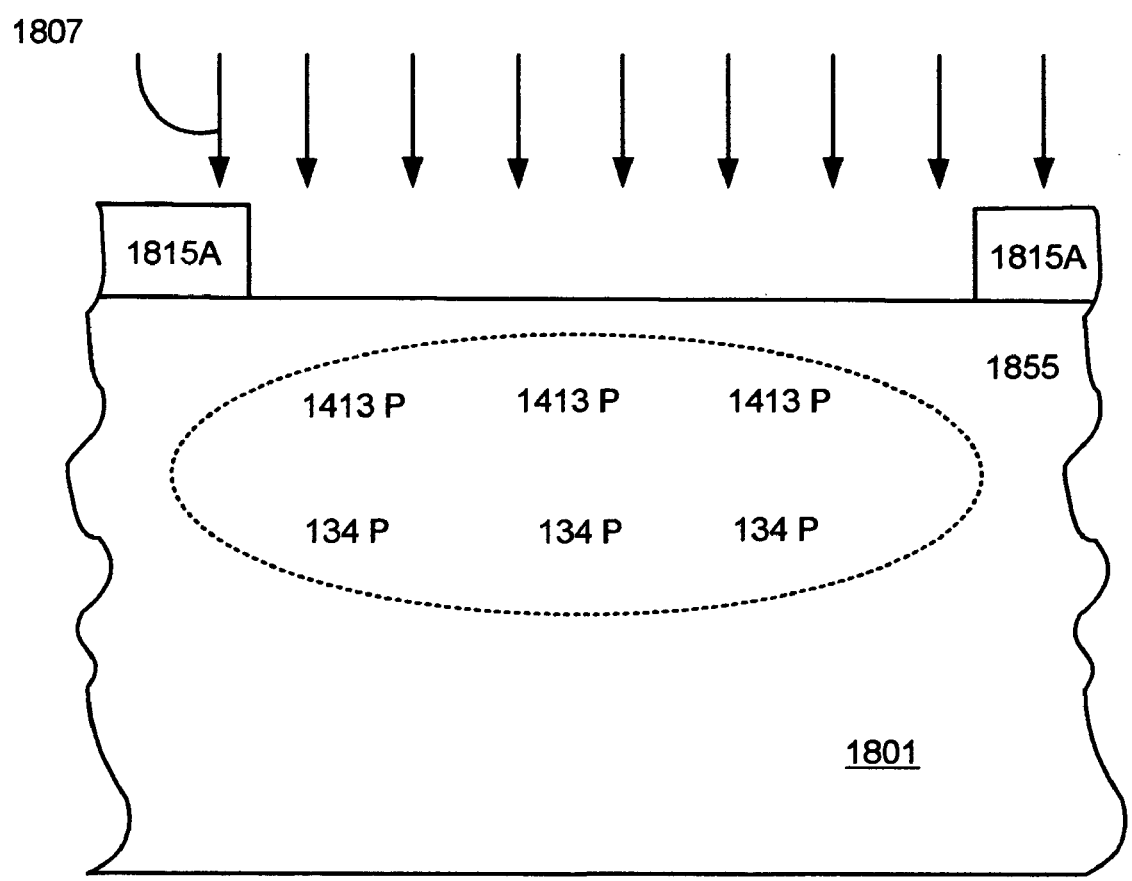
FIG. 22A is a simplified partial cross-sectional view of a semiconductor device in an early stage of fabrication, useful to describe a method of processing a semiconductor device for an embodiment of the present invention, showing the formation of a buried implant region.

Referencing FIG. 22A, masking material may be patterned (e.g., using photolithography) to form mask 1815A. The mask 181 SA may comprise sidewalls defining a window to expose portions of substrate 1801. Dopant (e.g., p-type) ions may be implanted into the exposed regions with sufficient (retrograde) to encompass depths for desired p-body 1413 and p-base 134 regions to be associated with access transistors and thyristors, respectively.

Referencing FIG. 22A, the doped region 1855 may approximate a Gaussian distribution of dopant density with respect to depth within the doped region 1855.

Figure 22B:
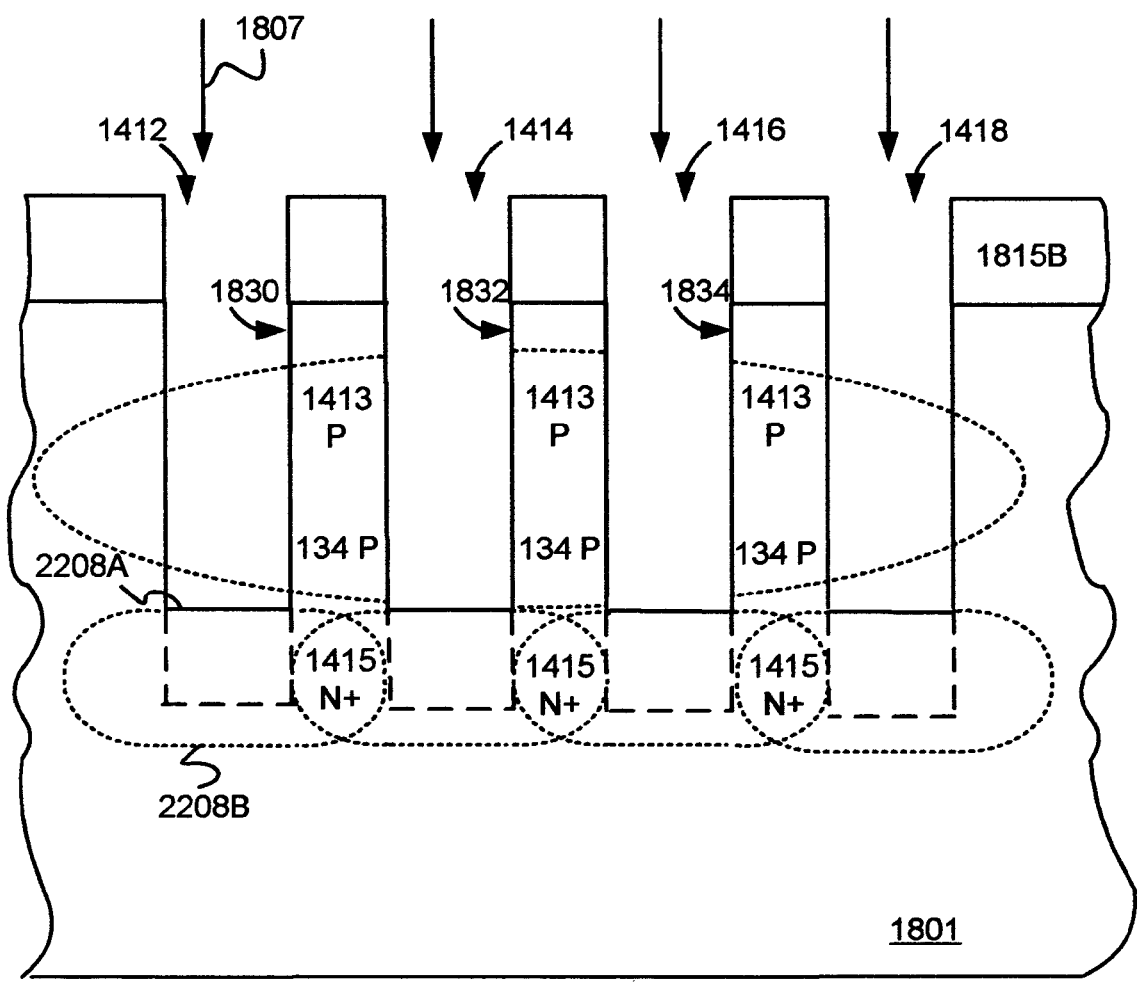
FIG. 22B is a simplified partial cross-sectional view of the semiconductor device of FIG. 22A in another stage of fabrication showing the formation of pillar sidewalls.

Referencing FIG. 22B, mask 1815A may be removed. Etch-resistant material, e.g., oxide and/or nitride, may be deposited on substrate 1801 and patterned to define mask 1815B, comprising islands of the protective material over regions of semiconductor material intended for the pillars. Trenches 1412, 1414, 1416, 1418 may then be etched anisotropically into exposed regions of the semiconductor material as defined by mask 1815B. In one embodiment, trenches may be etched to define floor 2208 of the trenches at an elevation associated with intended n-base regions 1415 for the thyristors. N-type dopant may be implanted with sufficient energy to laterally scatter n-type dopant into the desired n-base regions of the pillars. Thereafter, etching may continue to lower the floor of the trench to an elevation corresponding to a level near the intended bottom for the pillars. Implantation may then be performed using p-type dopant to implant the dopant beyond the floor 2208B with energy sufficient to scatter the dopant laterally into regions intended for anode-emitters 138 of the thyristors at the base of the pillars.

Figure 22C:
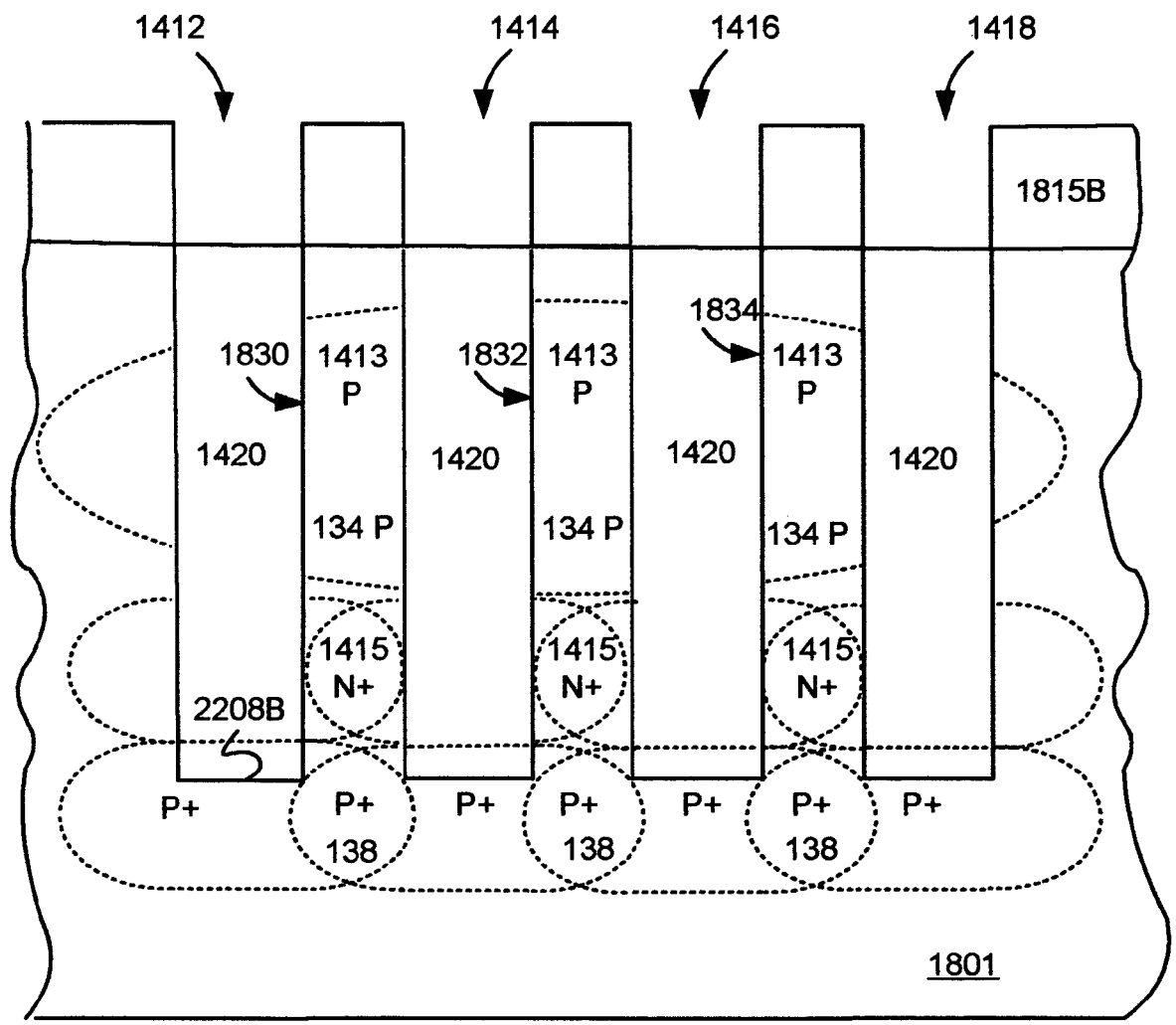
FIG. 22C is a simplified partial cross-sectional view of the semiconductor device of FIG. 22B in another stage of fabrication showing the filling of trenches with oxide.

Referencing FIG. 22C, trenches 1412, 1414, 1416, 1418 may then be further etched to lower the trench floors and define sidewalls about respective anode-emitters. The trenches may then be lined and/or filled with an insulating material such as oxide 1420.

Figure 22D:
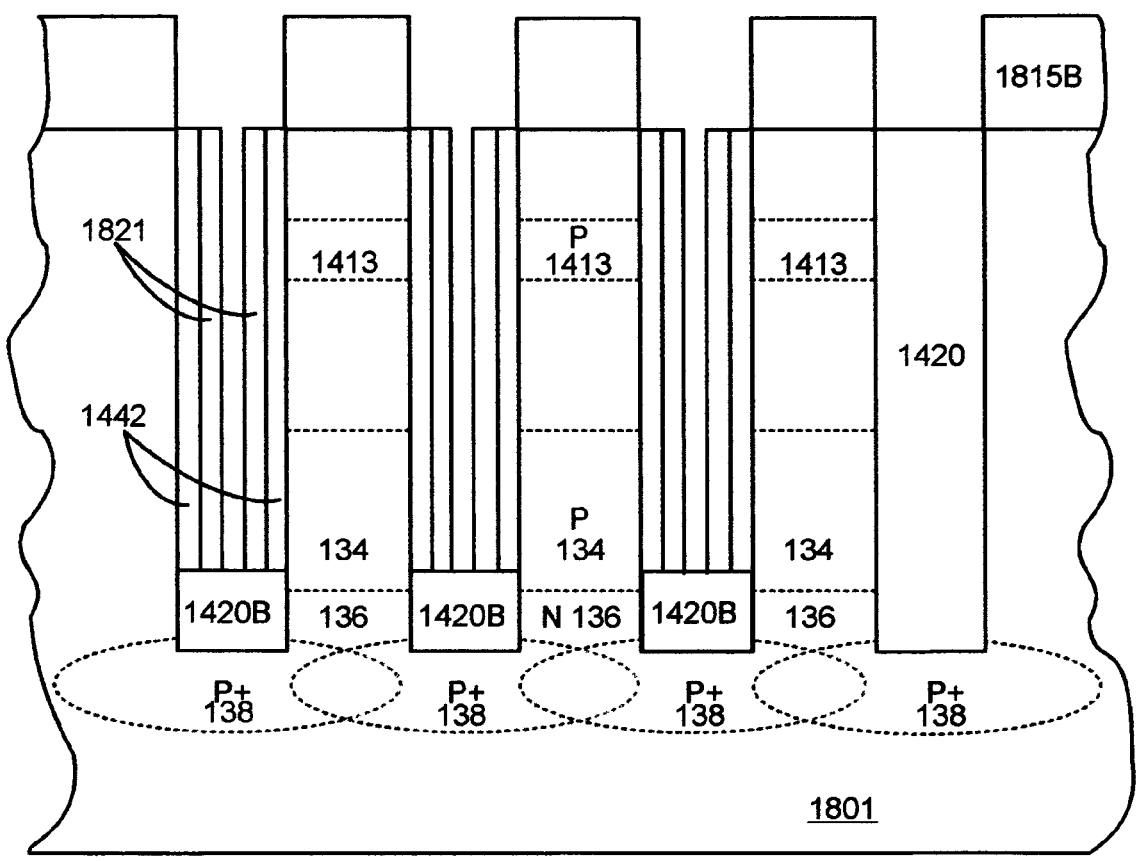
FIG. 22D is a simplified partial cross-sectional view of the semiconductor device of FIG. 22C in another stage of fabrication showing the etching of oxide and the deposition of dielectric and conductive material over pillar sidewalls.

Referencing FIG. 22D, the oxide 1420 may then be etched (selectively, and may be per an anisotropic process) down to a level slightly above an upper boundary of n-base regions 136. Dielectric 1442 may then be formed (e.g., thermal oxide) against the exposed sidewalls of the pillars. A conductive material 1821 (e.g., polysilicon) may then be formed over the dielectric 1442. In a particular embodiment, these materials may be layered by known processes, such as chemical vapor deposition, plasma enhanced, selective, thermal assisted, etc.

Figure 22E:
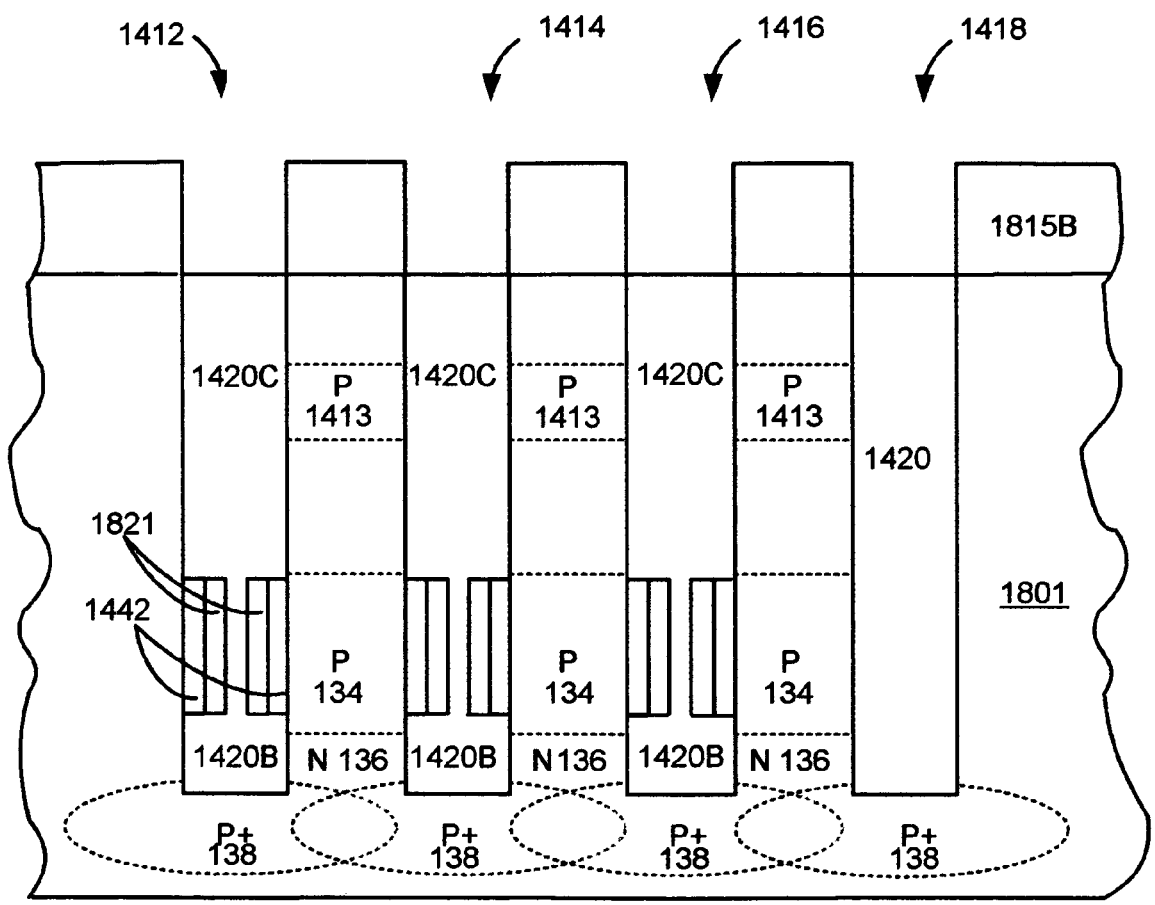
FIG. 22E is a simplified partial cross-sectional view of the semiconductor device of FIG. 22D in another stage of fabrication showing the etching of the conductive material and the filling of the trenches with oxide.

Referencing FIG. 22E, the conductive material 1821 may then be etched anisotropically, down to a level that may be lateral to and perhaps slightly below the upper boundary of p-base regions 134 for the intended thyristor. This may form capacitor electrodes 1821 capacitively coupled to the p-base regions 134 of the thyristors. Trenches 1412, 1414, 1416, 1418 may then, once again, be filled with insulting material such as oxide 1420.

Referencing FIG. 22F, the oxide may be etched (in a particular case, anisotropically and selectively) to a level slightly below an elevation of the p-channel or p-body 1413 for an access transistor. N-type implantation 1807 may then be performed with energy sufficient to scatter dopant laterally into the drain (cathode-emitter) region 1415 within the pillars 1830, 1832, 1834. The cathode-emitter regions 1415 may be described in common with the drain of the associated access transistors.

Figure 22F:
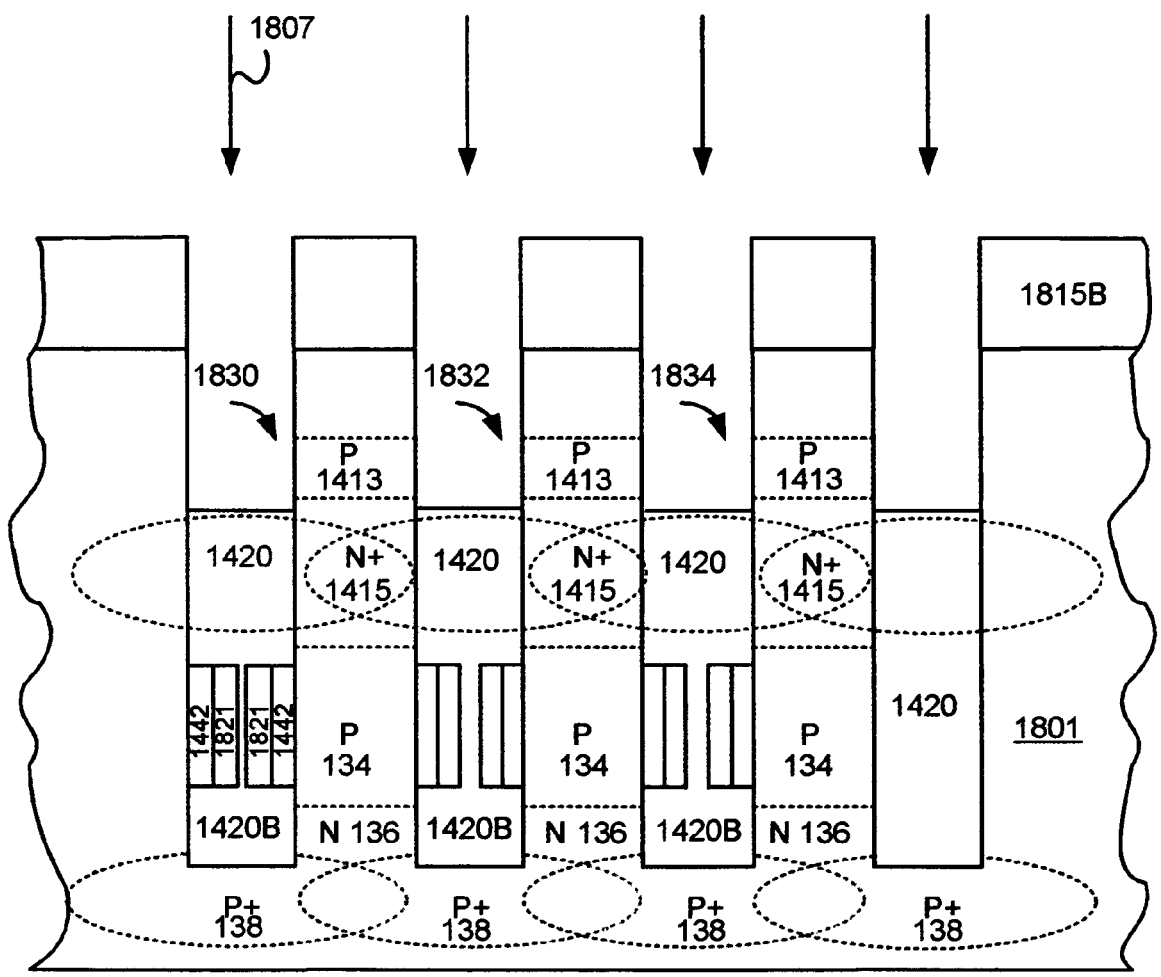
FIG. 22F is a simplified partial cross-sectional view of the semiconductor device of FIG. 22E in another stage of fabrication showing the etching of oxide and the doping of cathode-emitter regions for thyristors.
Figure 22G:
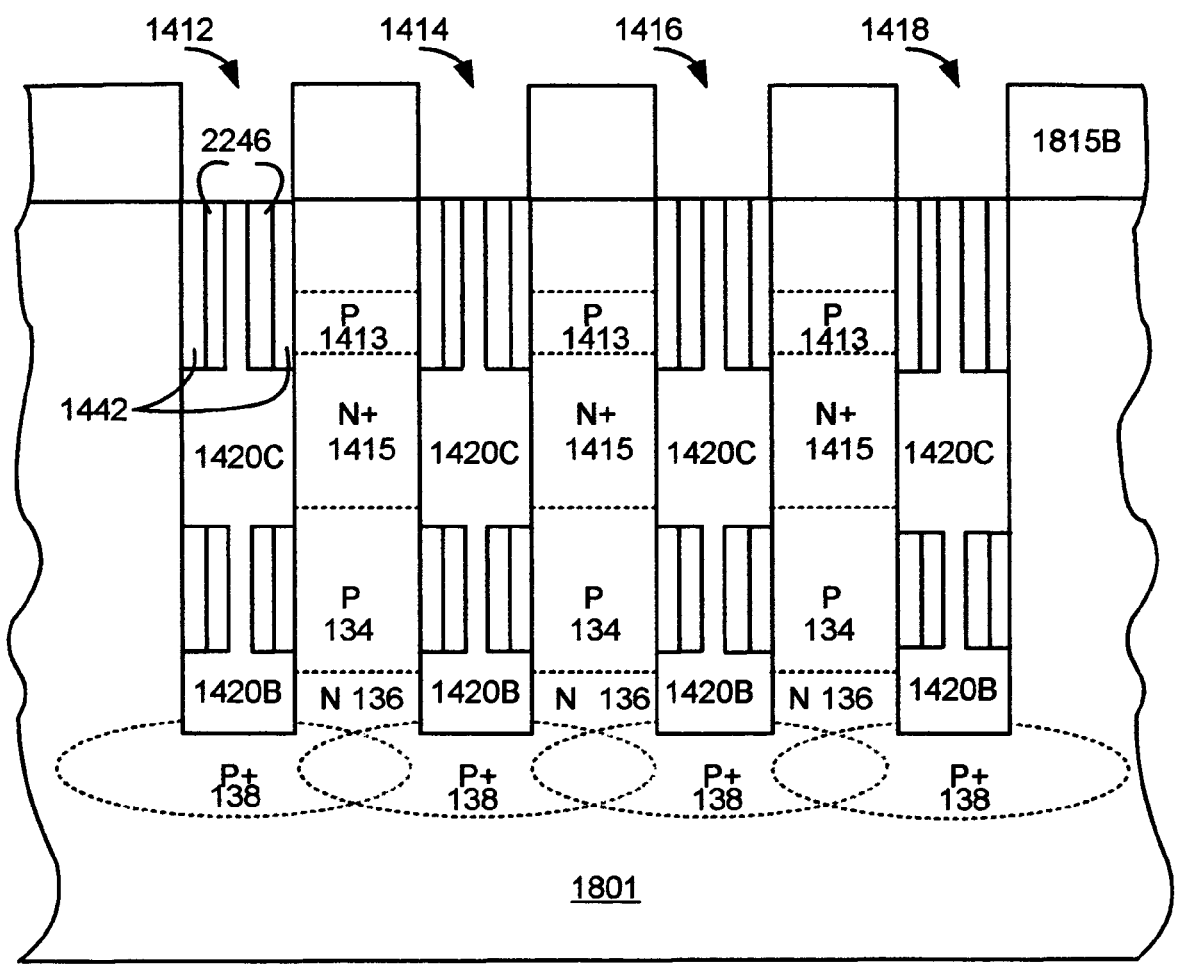
FIG. 22G is a simplified partial cross-sectional view of the semiconductor device of FIG. 22F in another stage of fabrication showing the deposition of dielectric and conductive material over pillar sidewalls and filling the trenches with oxide.

Referencing FIG. 22G, gate dielectric 1442 may then be formed on the exposed sidewalls of the pillars defining the trenches 1412, 1414, 1416, 1418, e.g., at elevations above oxide 1420C. Conductive material for gate electrodes 2246 may then be formed over dielectric 1442. The narrow trenches between separated gate electrode layers 1442 (between different rows of pillars) may then be filled with insulating material such as more oxide 1420.

Figure 22H:
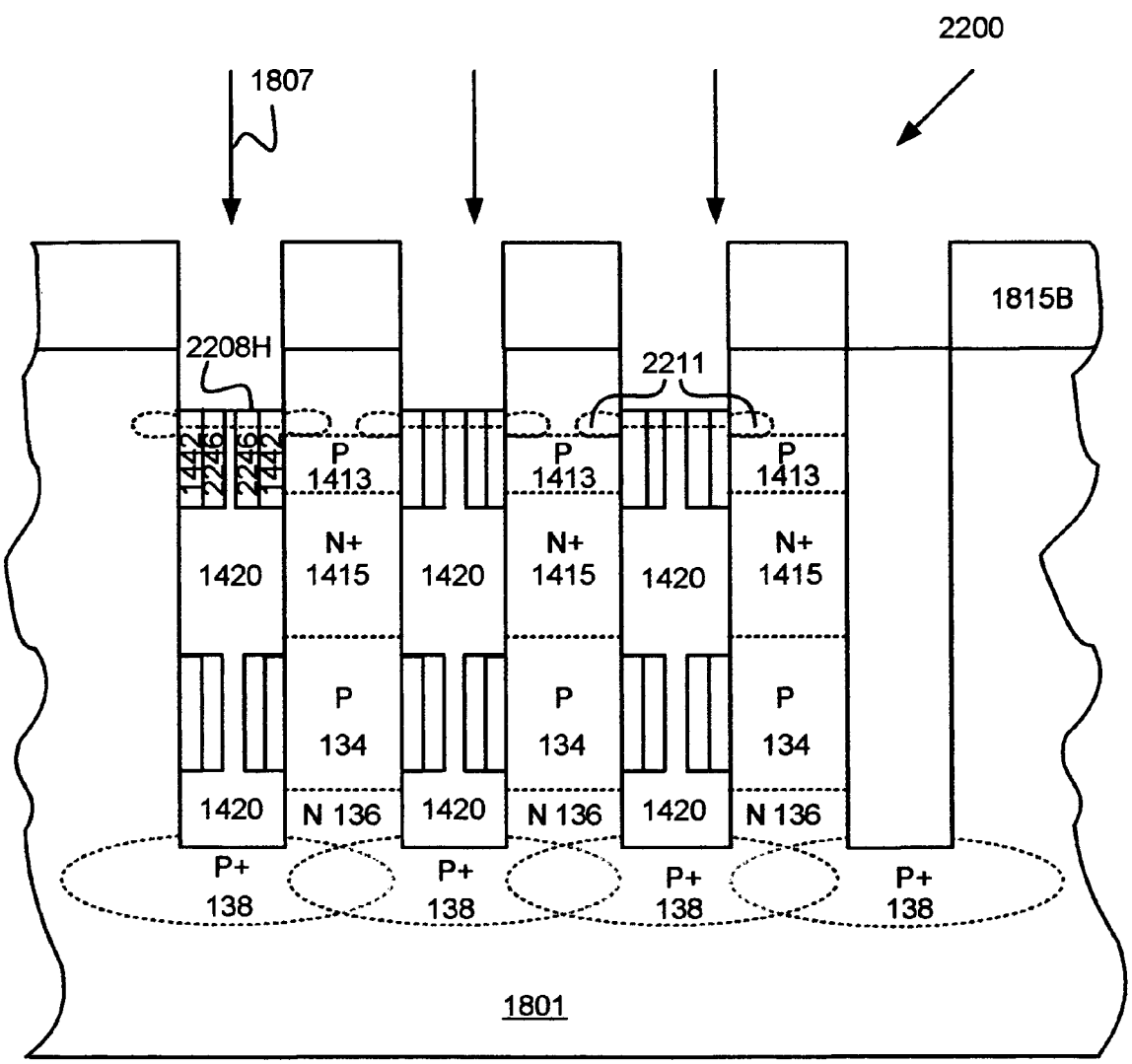
FIG. 22H is a simplified partial cross-sectional view of the semiconductor device of FIG. 22G in another stage of fabrication showing etching of oxide and the formation of lightly-doped drain regions to access transistors.

Referencing FIG. 22H, the conductive material for the gate electrodes (and/or gate dielectric) may then be etched to form a floor 2208H for a shallow trench at an elevation slightly above the p-body regions 1413 for the access transistors. In a given embodiment, this etch may be performed anisotropically using previously defined mask 1815B that defines exposed regions for the material removal. The etch may remove both conductive material and the insulating material (e.g., poly and oxide).

With the floor 2208H of the shallow trenches defined at an elevation slightly higher than the upper boundary for (channels) p-bodies 1413; n-type dopant 1807 may then be performed with energy and dosage appropriate to form n-type lightly doped drain/source regions 2211 for the access transistors.

In a further optional embodiment, the floor of the trench may be further etched to define the upper edge of electrodes 2246 at an elevation just beneath the previously defined LDD region. The trenches may then be filled with oxide, planarized (e.g., chemical mechanical polishing (CMP)), and the (e.g., nitride/oxide) masks might also be removed from the tops of the pillars.

In a further embodiment, n-type implant or diffusion may be performed to dope the top level of semiconductor material for the N+ source/drain region 2211 for the access transistors. Additional CMOS processes may also be incorporated to form peripheral devices and other inter-layer contacts and interconnects.

Further referencing FIGS. 22A through 22H, the exemplary cross-sectional views depict pillars 1830, 1832, 1834, per this embodiment, with a distance between them of magnitude sufficient to separate the different rows and to prevent capacitor electrodes 1821 and gate electrodes 2246 thereof from contacting or interconnecting the gates and electrodes associated with the other pillars.

Figure 23:
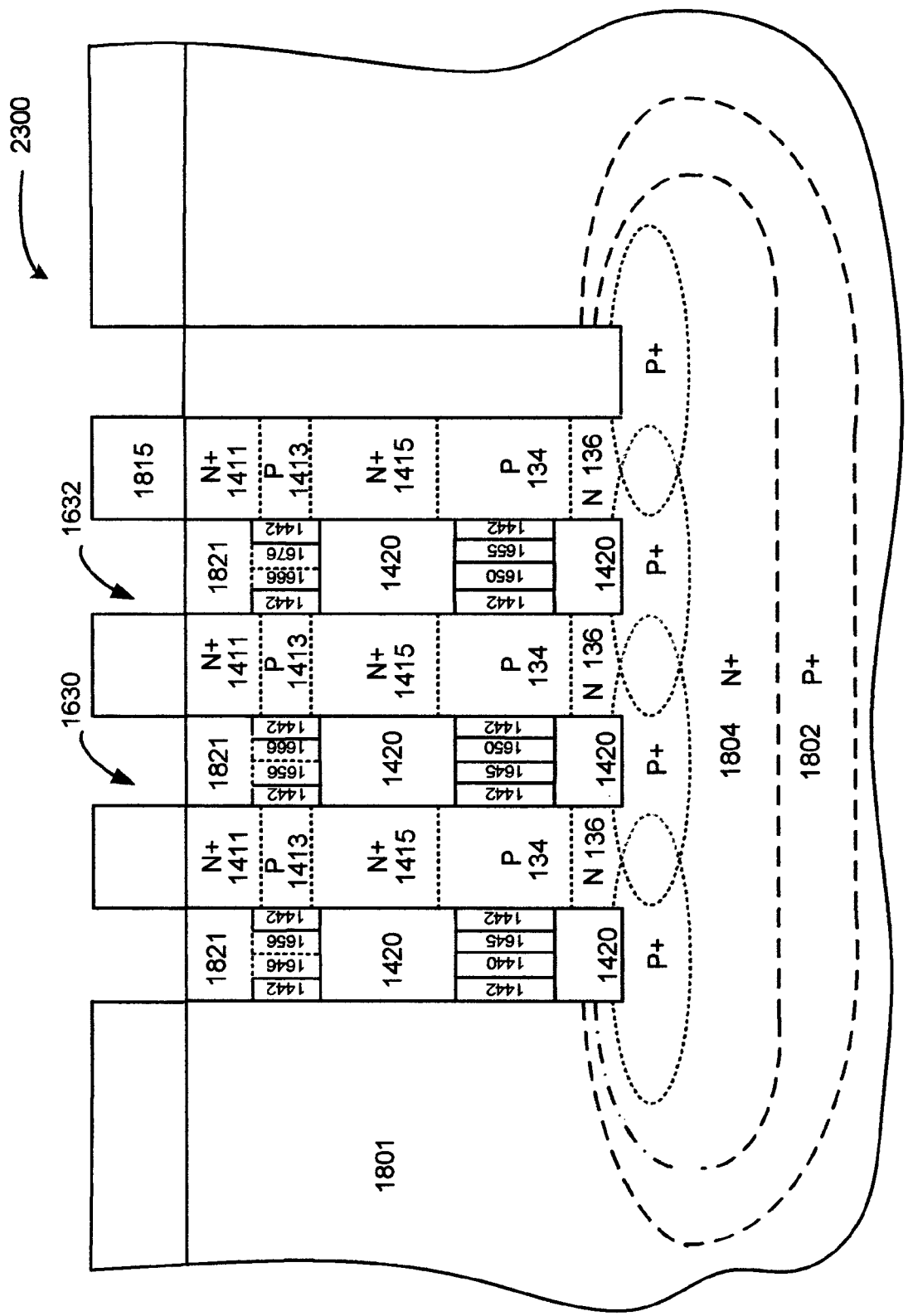
FIG. 23 is a simplified partial cross-sectional view of the semiconductor device of FIG. 18D, in a further stage of fabrication showing the formation of an oxide barrier, dielectric, and gate electrodes, and useful for describing a method of fabrication for an embodiment of the present invention.

In contrast, referencing FIG. 23, memory array 2300, per an alternative cross-sectional view of an embodiment, may show reduced distance between the pillars associated with a given row. Capacitor electrodes 1645 and gate electrodes 1656 associated with pillar 1630 and capacitor electrodes 1650 and gate electrodes 1666 associated with neighboring pillar 1632 of the same row may be formed with thickness greater than one-half the distance between the pillars. The conductive material for the electrode sleeves around the pillars, therefore, may interconnect. In a particular embodiment, the distance between the pillars within the row may be less than or equal to the diameter of the pillars along a lateral dimension/axis parallel to the row. The conductive sleeves interconnecting within the row of pillars may comprise a thickness greater than ½ the lateral diameters. Interconnected sleeves associated with the gate electrodes may be referenced collectively as a first wordline while those associated with the capacitor electrodes over respective thyristor base regions may be referenced collectively as a second wordline. The second wordline may be described further as being offset vertically relative to the first wordline.

The neighboring gate electrodes and capacitor electrodes, may be formed by CVD deposition (e.g., within the method(s) discussed with reference to FIGS. 22A through 22H) until obtaining material thickness sufficient to interconnect the sleeves between the pillars along a given row).

Further FIG. 23, the embodiment may comprise the buried P-type conductivity region 1802 that may be formed in substrate 1801, e.g., of N-type conductivity. It may be understood, however, that alternative embodiments may comprise a substrate of P-type conductivity and that, therefore, the representative dashed lines of buried P+ region 1802 may be removed. Accordingly, buried N-type region 1804 may be formed in a substrate 1801 of, e.g., P-type conductivity.

Figure 24:
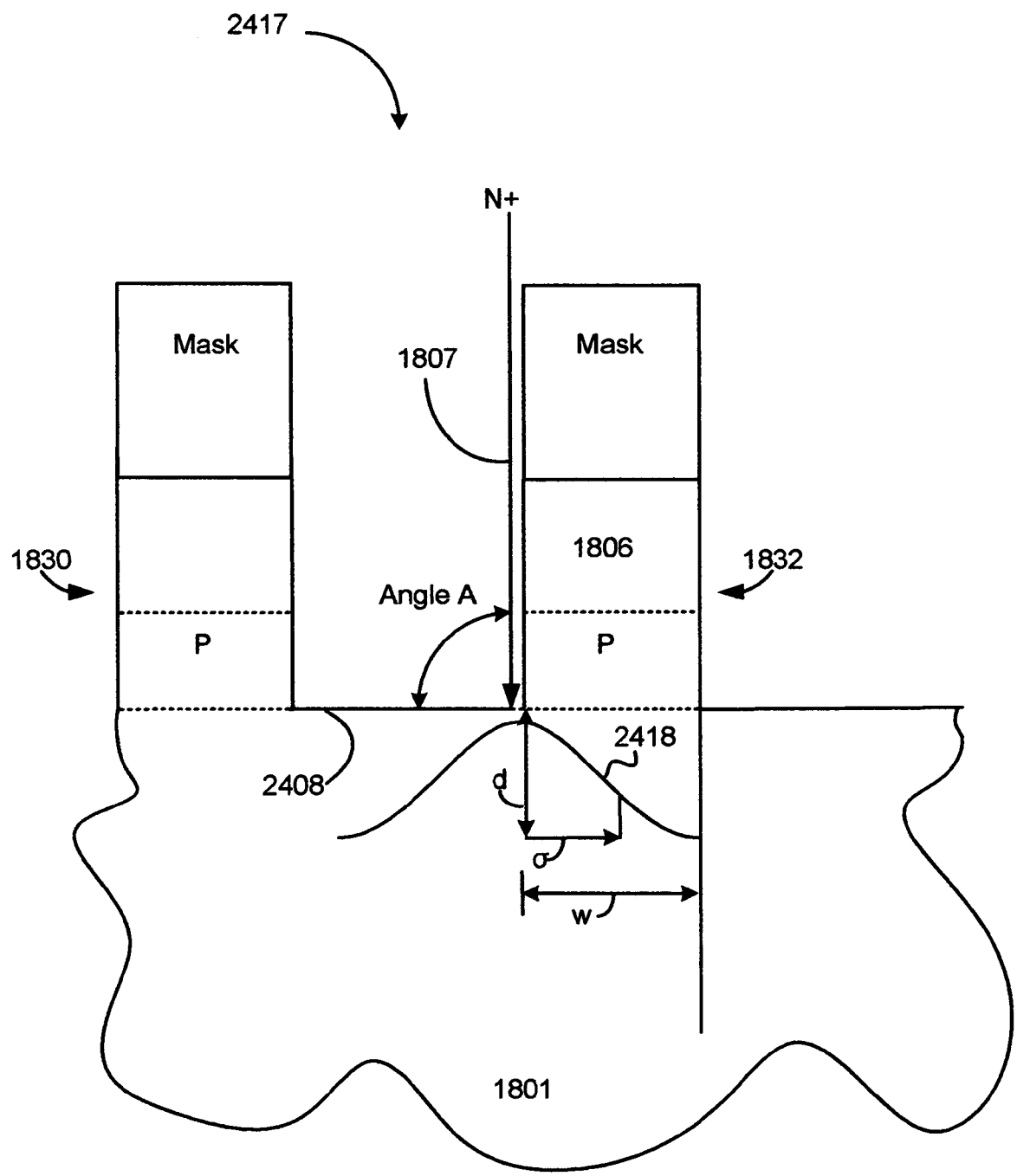
FIG. 24 is a simplified partial cross-sectional view of a semiconductor device, illustrating the process of doping a substrate using lateral straggle as may be employed in certain embodiments of the invention.

Moving ahead to reference FIG. 24, a lateral straggle process may comprise dopant implant 1807 into a recessed surface 2408 of substrate 1801. In a particular embodiment, the angle of incidence (Angle A) for the dopant implants may be perpendicular. As the ions penetrate the recessed substrate surface 2408, they may collide with atoms within the substrate and scatter randomly. Depending on the ion implantation energy and other factors, the ions may penetrate an average depth of "d". Some of the colliding ions may scatter laterally through a region of the semiconductor material beneath pillar 1832. The scattering of these ions may result in an approximation of a Gaussian distribution of dopant for the concentration thereof laterally beneath the pillar 1832. Curve 2418 may illustrate a possible Gaussian distribution for the concentration of the dopants relative to a lateral offset.

In general, the greater the lateral distance of a position from the peripheral edge defined by the mask and the partial pillar, the lower its concentration of implanted dopant. In a particular embodiment, pillar 1832 may be designed for width w. It may be desirable, based on the design considerations, to define a first standard deviation of the Gaussian distribution in relationship to the lateral distance from the border by a relationship.

$$a = \frac{xw}{d};$$

where 0>|x|<1

For example, one standard deviation associated with the dopant's lateral distribution may be specified for a distance xw from the border 1806, where x=0.5. In other words, the implant for the lateral straggle may establish a Gaussian distribution for the dopants at one sigma offset appropriate to implant the position at approximately halfway into the width w of the intended pillar 1832. In another embodiment, the implanting may be designed for the one sigma distribution a to lie approximately one fourth into the width w of the intended pillar: x=0.25.

In a particular embodiment, w may be, for example, 130 nanometers. In a further embodiment, it may be desirable to establish a dopant concentration distribution per a first standard deviation to occur at a distance xw from the border 1806, where x=0.5. A depth d for the implant may then be designed in order to achieve the intended lateral distribution. In general, the following relationship applies:

$$\frac{xw}{d} = \sigma;$$

where 0<x<1

Applying the above formula to the present example, where x=0.5, w=130 nanometers, and σ=0.7 (approximately), the desired average depth d for the implant may be designed for approximately 45 nanometers. For further information regarding lateral straggle, see: "Novel Minority Carrier Isolation Device", cited above under Related Data, and also to VLSI Era Volume 1—Process Technology, S. Wolf and R. N. Tauber, Lattice Press, 1986 (First Edition), pp. 285-286, which is fully incorporated herein by reference.

Again referencing FIG. 22F, the intended pillars 1830, 1832, 1834 may be doped using lateral straggle from more than one direction. The individual intended pillars may then have cumulative Gaussian distributions of dopant from all sides of the pillar. For example, in a particular embodiment, all the substrate 1801 surrounding the intended pillars 1830, 1832, and 1834 may be etched, leaving the pillars with a cylindrical shape (perhaps round from a top view). Dopant may be implanted from around the perimeter of the pillars.

Figure 25:
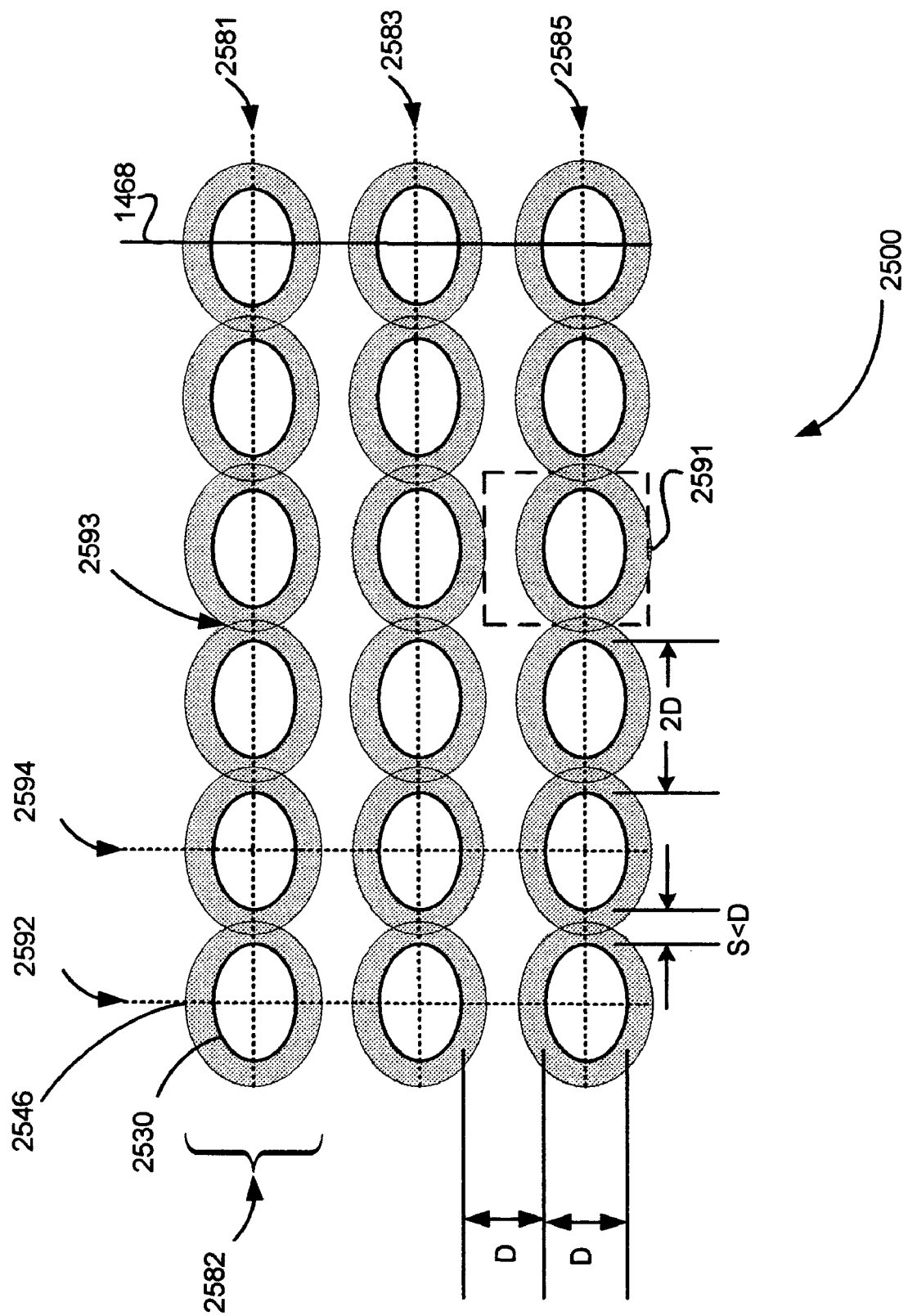
FIG. 25 is a simplified partial cross-sectional top view of a semiconductor device consistent with another embodiment of the present invention, showing oval pillars (as seen from the top view) for a memory array disposed in a plurality of rows and columns and with conductive sleeves encircling the individual pillars.

Referencing FIG. 25, a thyristor-based memory array 2500 may comprise rows 2581, 2583, 2585 and columns 2592, 2594 (only a few rows and columns are shown and numbered to avoid clutter) of pillars 2530. The array 2500, as seen from this top view, may comprise pillars 2530 having a shape other than round. In this particular embodiment of FIG. 25, the pillars may comprise a circumference that is oval. The smallest dimension D of the ovals may be referenced as a longitudinal diameter for the pillars along an axis perpendicular to the rows. In a particular embodiment, D could be 130 nanometers. In another particular embodiment, D could be related to a minimum feature size (e.g., that may be imaged with optical lithography). See generally, Silicon Processing for the VSLI Era, Volume 1—Process Technology, S. Wolf and R. N. Tauber, Lattice Press, 2000 (Second Edition), Chapter 13, "Lithography II: Optical Aligners and Photomasks", all of which is incorporated by reference herein.

Further referencing FIG. 25, similarly to the embodiment of FIG. 17, conductive sleeves 2546 may comprise polysilicon encircling and capacitively coupled (dielectric not shown) to regions of the pillars 2530. Examples of sleeves 2546 (e.g., gates or capacitor-electrodes) have been discussed earlier with reference to FIGS. 14-24. The sleeves 2546 of the rows 2581, 2583, 2585 may be shorted together (e.g., short 2593) and may collectively be referenced as wordlines 2582.

The sleeves 2546 associated with the pillars 2530 of given columns 2592, 2594 may avoid contact. It may be understood that the pillars 2530 of the columns 2592, 2594 may be electrically coupled to respective bitlines 1468 (only one bitline shown schematically for clarity).

Further referencing FIG. 25, the layout of the memory array 2500 may economize cell area 2591. While the lateral width of the pillars along a row may be >D, the spacing between pillars 2530 within the rows 2581, 2583, and 2585 may be <D. This distance <D between pillars 2530 of a given row of rows 2581, 2583, 2585 may be small enough to allow the sleeves 2546 to short together, as discussed above. Within the rows, the spatial period for the periodicity pillar-to-pillar may be as great as 2D.

In a particular embodiment, D may be 130 nanometers. Thus, the spatial period for the periodicity consumed by a memory cell area 1991 along a row may be 260 nanometers. In another particular embodiment, as discussed above, D may represent a minimum feature size that may be imaged using conventional optical lithography. If, in a particular embodiment D is such a minimum feature size, then the distance between pillars 2530, which may be less than D, may be less than such minimum feature size.

Optical proximity correction or a similarly capable technology may be used to image the distance between pillars 2530 along a row. See VLSI Era Volume 1—Process Technology, S. Wolf and R. N. Tauber, Lattice Press, 1986 (First Edition), pp. 285-286.

The pillars 2530 within a given column may be separated by a distance approximately equal to D. This distance may be sufficiently great to prevent the sleeves 2546 from shorting together. In this embodiment, the area of a memory cell 2591 (a pillar 2530 and sleeve 2546) may extend a length along a column of approximately 2D, and a width along a row of 2D. The cell area for this embodiment, therefore, may be approximately $4D^2$.

Referencing FIGS. 26A, 26B, 26C, and 27, a thyristor-based memory array 2600 according to another embodiment of the present invention and a method 2700 of fabricating may form pillars 2630 of diameters D. However, in contrast to the embodiment described above relative to FIG. 17, the distance between pillars 2630 may be the same D along both the lateral and longitudinal axis. Along both the columns and the rows, the distance between pillars (periodicity) may be as great as 2D. The memory cell area 2691, comprising pillar 1630 and its respective conductive sleeve 1646 may comprise an area of approximately $4D^2$.

Figure 26A:
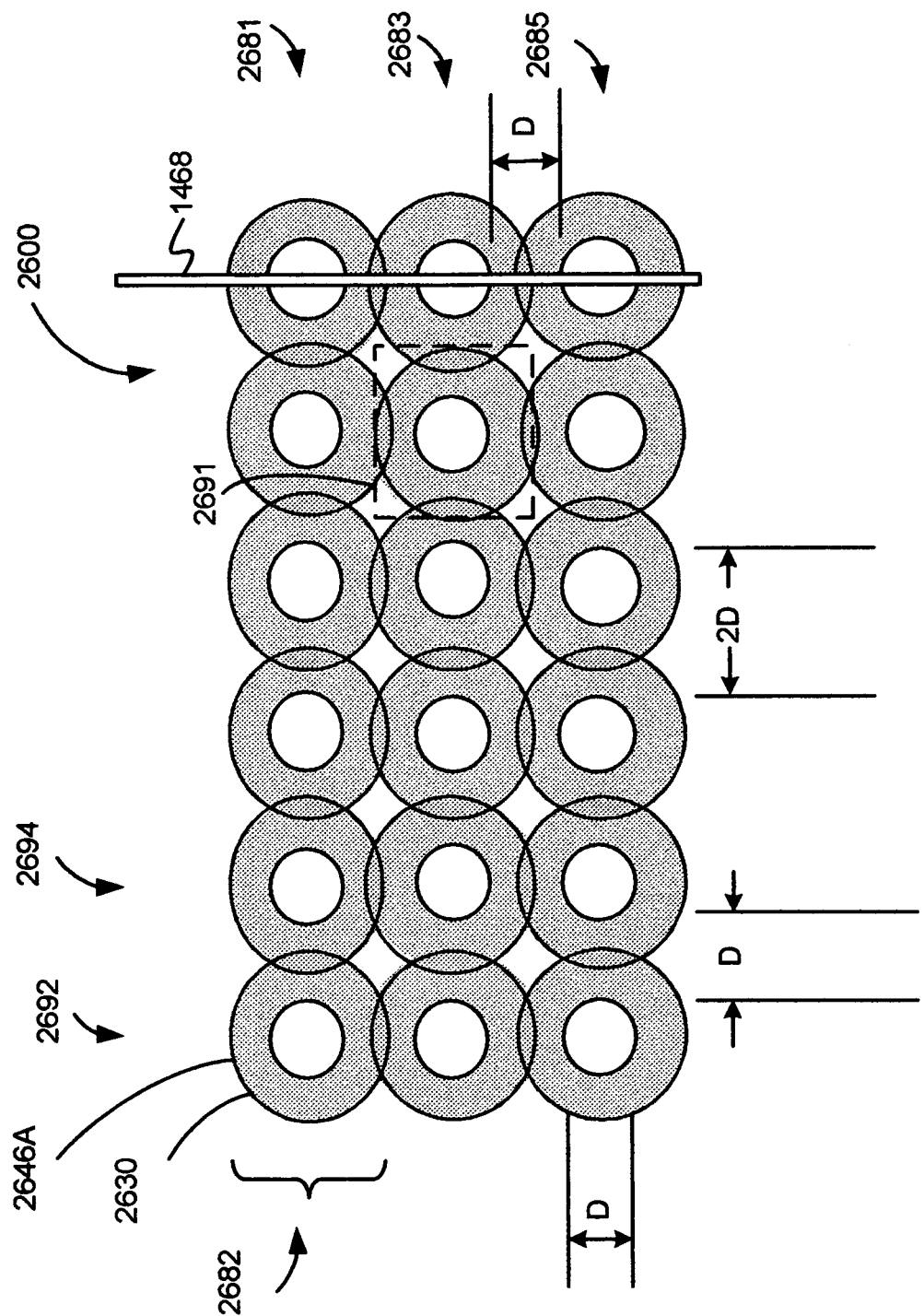
FIG. 26A is a simplified cross-sectional top view of a semiconductor device useful for explaining another embodiment of the present invention, and showing round pillars (as seen from the top view) for a memory array disposed in a plurality of rows and columns during a given stage of development and showing conductive sleeves encircling the pillars.
Figure 26B:
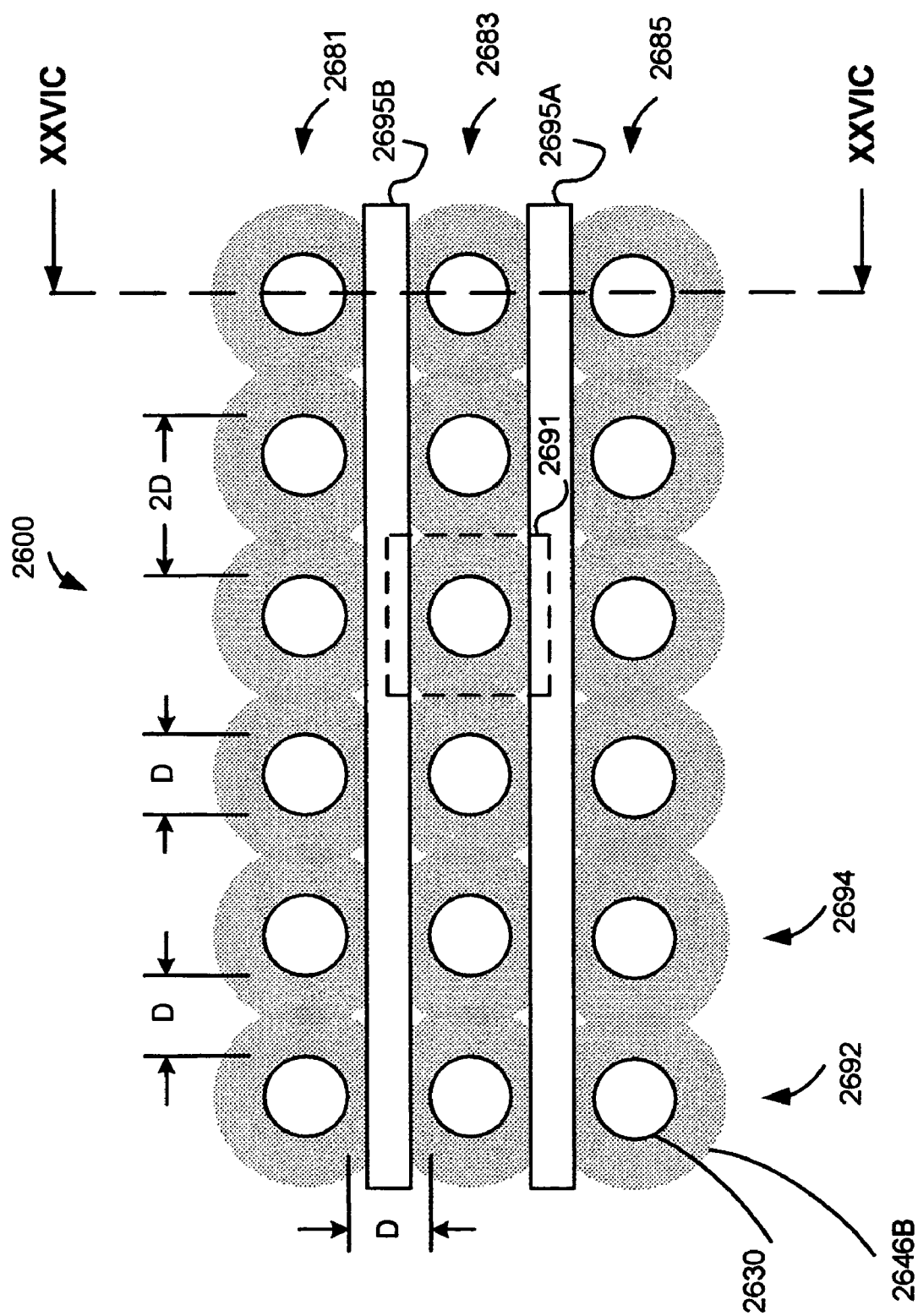
FIG. 26B is a simplified cross-sectional view of the semiconductor device of FIG. 26A, in a further stage of fabrication and showing the formation of barriers between rows of pillars.
Figure 26C:
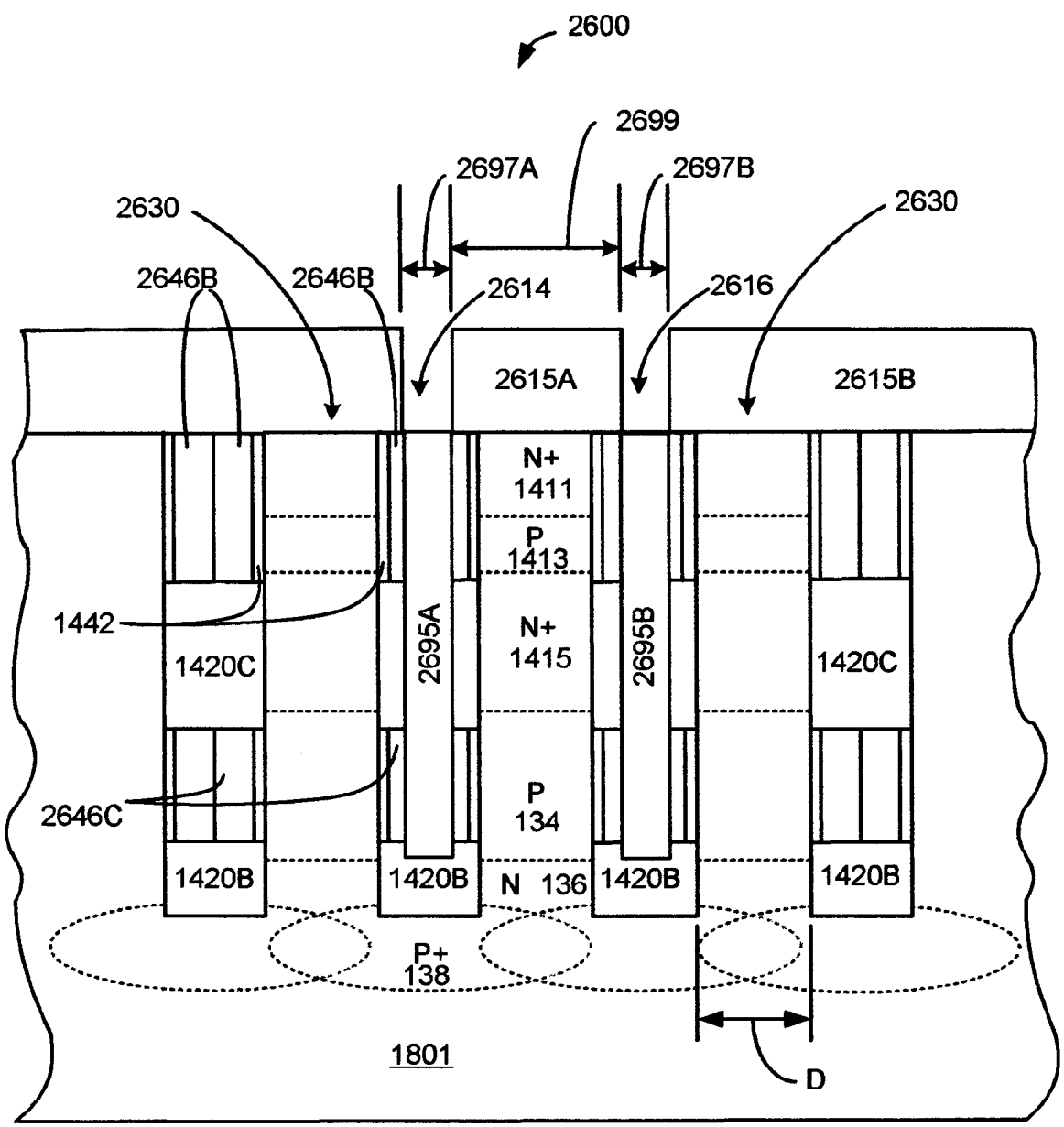
FIG. 26C is a simplified cross-sectional view of the semiconductor device of FIGS. 26A and 26B, in a further stage of fabrication and showing the formation of barriers between pillars—the line of sight being as indicated on FIG. 26B for sectional XXVIC.

Referencing FIGS. 26B and 26C, insulative barriers 2695A, 2695B may be disposed between the different row wordlines to prevent conductive sleeves 2646B (and 2646C of FIG. 26C) of different wordlines from shorting together. The distances between pillars may be the same as those discussed relative to FIG. 26A. The memory cell area 2691, comprising a pillar 2630, its respective conductive sleeve 2646 and an allocable portion of an insulative barrier, may have a area of approximately $4D^2$.

In a further embodiment of the present invention, referencing FIG. 26C, the conductive sleeves 2646A at a first elevation associated with the capacitive coupling to thyristors may be intercoupled along both the lateral (rows 2681, 2683, 2685 of FIG. 26B) and longitudinal (column, e.g., 2692, 2694 of FIG. 26B) axis of the memory array 2600.

At a second elevation for this embodiment, referencing FIGS. 26B and 26C, the conductive sleeves 2646B may be associated with gate electrodes for access transistors and may isolate (via isolation barriers 2695A, 2695B) the separate rows within the memory array 2600. In other words, at one planar, cross-sectional view through the body regions of the access transistors, the conductive material 2646B may define first wordlines associated with gate electrodes to respective rows 2681, 2683, 2685 of the array. In this embodiment, a given wordline may be isolated and driven separately from the wordlines of other rows. At another planar, cross-sectional view through base regions of the thyristors, the conductive material 2646C may define second wordline collectively across the entire array. So, while the sleeves of conductive material 2646C at the lower elevation may be interconnected across the entire array, the sleeves of conductive material 2646B of the second elevation, may be vertically offset, e.g., above the first, and may be isolated between different rows.

Further referencing FIG. 26C, in another embodiment, conductive sleeves 2646B, 2646C, at both elevations may be isolated by isolation barriers 2695A, 2695B. That is, a given wordline at either the first of the second elevation may be isolated and driven separately from the wordlines of other rows.

Figure 27:
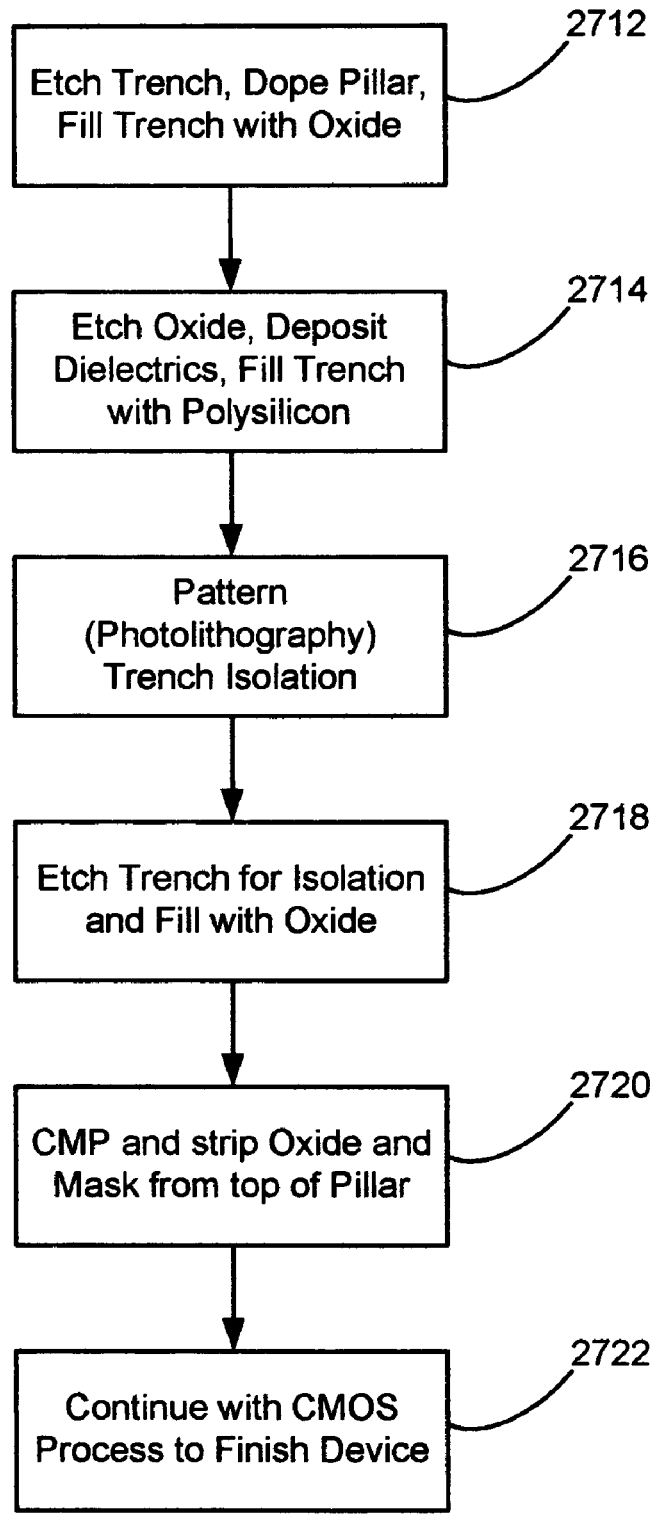
FIG. 27 is a simplified flow diagram for a method of forming a semiconductor device according to a particular embodiment of the present invention, and including the formation of insulative barriers.

Referencing FIG. 27, a method 2700 of fabricating a semiconductor device may include the formation of insulative barriers (2695A, 2695B FIGS. 26B, 26C). Trenches may be etched, pillars doped, and insulating material (oxide) deposited to fill the trenches (Process Block 2712). The oxide may then be etched, dielectrics (1442, FIG. 26C) formed conformally against pillars, and gates and electrodes (2646B, 2646C, FIG. 26C) formed against the dielectric and capacitively coupled to sidewalls of the pillars (Process Block 2714). These processes 2712 and 2714 could be performed in a manner similar to those discussed relative to FIGS. 18A-24.

In a particular embodiment, the distance between rows may be at or near the minimum independent feature size. In one embodiment, the widths (2697A, 2697B of FIG. 26C) of the trench isolation 2695A, 2695B may need to be less than the minimum independent optical lithographic feature size. That is, the widths 2697A, 2697B may comprise dependent features that may represent spacing between independently patterned features (e.g., width 2699 of mask 2615A, FIG. 26C). Therefore, more advanced techniques might be used to pattern openings within a mask (e.g., 2615A, 2615B of FIG. 26C) for the location and widths (2697A, 2697B) for the barriers—for example, phase shift lithographic techniques, spacer formation, etc. (Process Block 2716). The trenches (e.g., 2614, 2616, FIG. 26C) for the isolation barriers (2695A, 2695B, FIGS. 26B, 26C) may then be etched and filled with an insulative material, such as oxide (Process Block 2718).

A planarization process (i.e., CMP) may then be performed, and the nitride and oxide (e.g., masks) stripped from the tops of the pillars (Process Block 2720). Further CMOS processes (e.g., metallization, interlayer dielectrics, contacts, etc.) may then be continued for the device (Process Block 2722).

Figure 28:
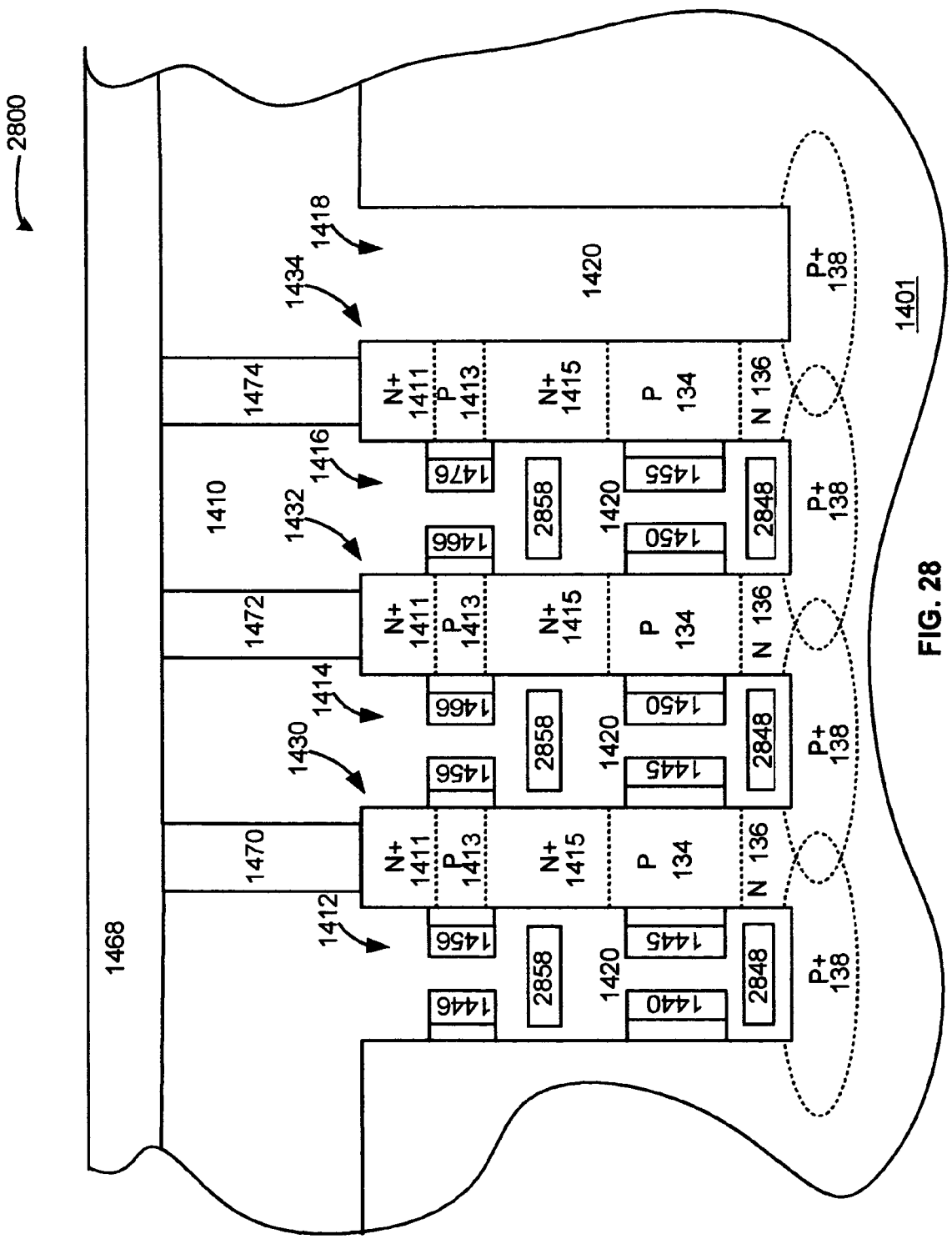
FIG. 28 is a simplified partial cross-sectional side view of a semiconductor device consistent with another embodiment of the present invention, and showing portions of the semiconductor device electrically isolated from one another.

Referencing FIG. 28, a memory array 2800 consistent with an embodiment of the present invention, may comprise conductive material 2848, such as polysilicon or tungsten, which may be disposed in the lower region of the trenches below the capacitor-electrodes, e.g., 1440, 1445, 1450, and 1455. The conductive material 2148 may serve to assist electrical insulation of different memory cells. For example, in a particular embodiment the conductive material 2148 may serve to at least partially electrically isolate the capacitor-electrodes 1440, 1445, 1450, 1455 from n-base regions 136, and to perhaps isolate one n-base and anode-emitter of one thyristor from respective regions of another thyristor.

The memory array 2800 may also comprise conductive material 2858, such as polysilicon or tungsten, within an area of the trench above the capacitor-electrodes (e.g., 1440, 1445, 1450, 1455) and below the gates (e.g., 1446, 1456, 1466, 1476). The conductive material 2858 may similarly serve to electrically insulate various regions of the memory cells within array 2800 from each other. For example, in this particular embodiment, the conductive material 2858 may serve to electrically isolate capacitor-electrodes 1440, 1445, 1450, and 1455 from the gates 1446, 1456, 1466, and 1476. In further embodiments, the conductive material 2858 may be electrically coupled to, a voltage source, perhaps enhancing its insulative quality.

Conductive material 2848, 2858 (embedded in oxide or perhaps lined with insulative material) may be particularly useful in applications where typical insulators cannot fill deep openings or trenches (e.g., 1412, 1414, 1416) whose depths may be greater than twice their widths. Typical insulators may not adequately fill such trenches due to the tendency of the insulator to fill an upper portion of the trench before a lower portion of the trench is filled. The conductive material might then be selected as a function of its suitability for the specified trench; polysilicon and Tungsten are often adequate. See generally, "Trench Isolation for Thyristor-Based Device" cited above under Related Data. Reference may also be made regarding thyristor-based memory devices to U.S. Pat. No. 6,229,161, which is cited and incorporated by reference above under Background.

Figure 29:
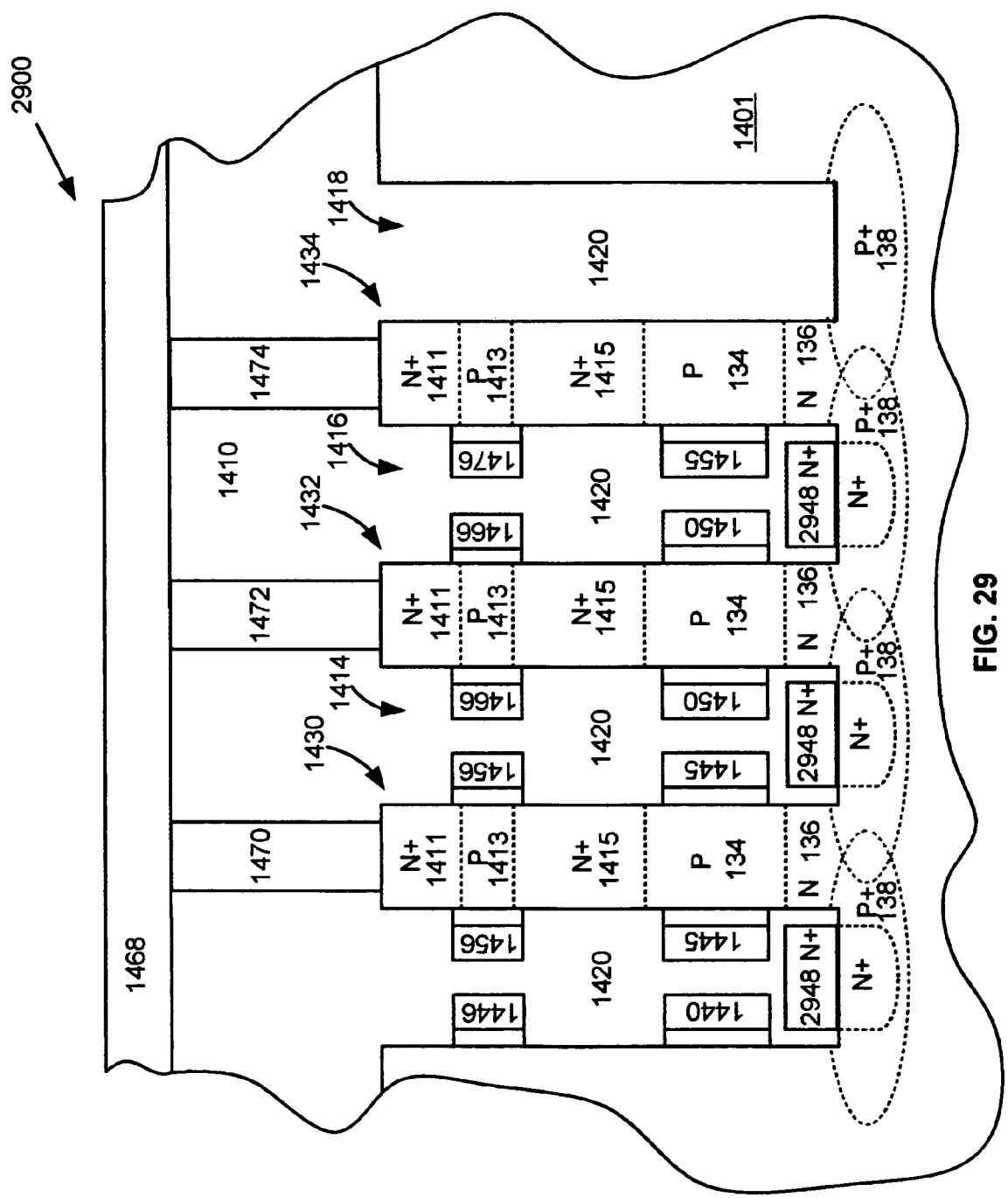
FIG. 29 is a simplified partial cross-sectional side view of a semiconductor device consistent with another embodiment of the present invention, and illustrating structures to assist minority carrier isolation.

Referencing FIG. 29, a memory array 2900 consistent with an embodiment of the present invention may comprise N+ type poly 2248 that may be disposed against a bottom floor of the trenches. In further embodiments, n-type dopant might also extend diffuse into portions of substrate 1901 between the P+ anode-emitter regions 138 at the base of the different pillars for respective thyristors. These isolation collectors 2248 may create N/P junctions that may act as collectors of minority carriers (electrons in this example because the collectors extend into P+ regions), which might otherwise drift between the memory cells.

Likewise, relative to the embodiment of FIG. 29, the thyristors (regions 138, 136, 134, 1415) may comprise anode-emitter regions of a common buried P+ region 138. Excess minority carriers (electrons) that might be injected from the n-base regions 136 into the anode-emitter 138 could potentially diffuse across the common substrate region to a neighboring anode-emitter 138. But, with the isolation collectors of n-type material against the p-type material, they may collect the excess minority carriers before they might otherwise reach an adjacent thyristor. Stated differently, FIG. 29 shows plural thyristors close to one another. When a thyristor is in an on state, electrons may be injected into the anode 138. These electrons may diffuse to an adjacent thyristor, which may have been previously programmed for an off state. The diffused electrons may trigger and initiate current in the adjacent thyristor. If the noise level exceeds the forward break-over (Ifb) current, the adjacent thyristor might then transition to an on state, when it might need to preserve an off state.

The isolation collectors 2948 may, therefore, be described as minority carrier isolation devices. That is, they may serve to collect and prevent minority carriers from diffusing to adjacent thyristors by disposing p/n junctions in the diffusion paths of the minority carriers (electrons, in this example). These junctions might also be constructed/biased in such a way that they behave similar to a collector of a bipolar transistor. These collectors 2948 may then collect sufficient stray minority carriers to prevent corruption of adjacent thyristors. For further information regarding minority carrier isolation devices, see "Novel Minority Carrier Isolation Device", cited and incorporated by reference above under Related Data. See also: U.S. patent application Ser. No. 10/262,792 filed Oct. 1, 2002, entitled "Thyristor Device with a High-Aspect-Ratio Trench," U.S. patent application Ser. No. 10/262,696 filed Oct. 1, 2002, entitled "Buried Emitter Contact for Thyristor-based Semiconductor Device," and U.S. patent application Ser. No. 10/263,376 filed Oct. 1, 2002, entitled "Deep Trench Isolation for Thyristor-based Semiconductor Device," all of which are hereby incorporated by reference in their entirety.

Figure 30:
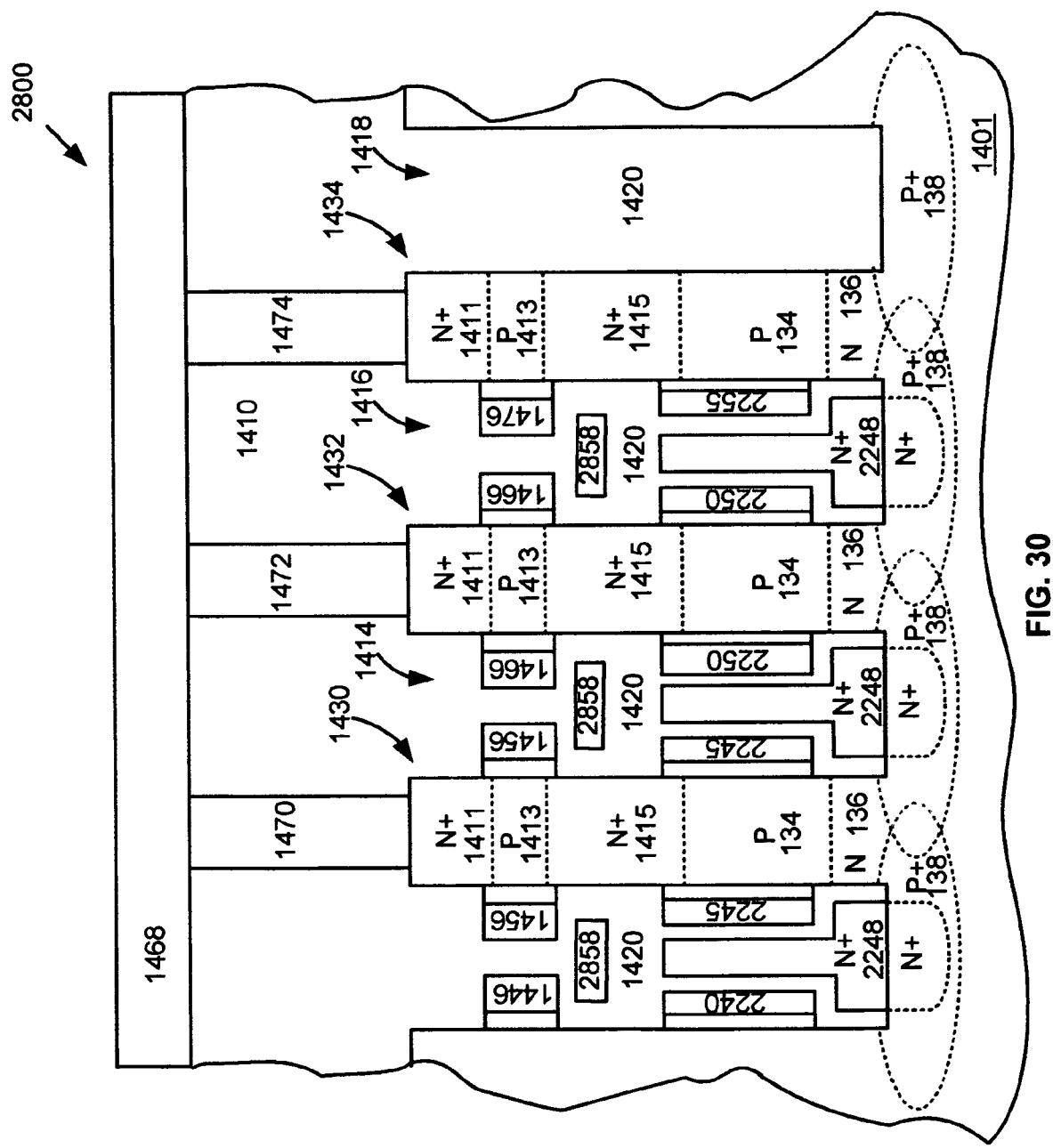
FIG. 30 is a partial simplified cross-sectional side view of a semiconductor device consistent with another embodiment of the present invention, showing neighboring capacitor-electrodes and other portions thereof with conductive material therebetween.

Referencing FIG. 30, a memory array 3000 consistent with another embodiment of the present invention may comprise conductive material 3048 that may be disposed against the trench floors and extend between two neighboring capacitor electrodes (e.g., 3040 and 3045). The top (relative to the supporting substrate 1401) surface of the conductive material 3048 may be at approximately the same level as the tops of the two proximate capacitor-electrodes (e.g., 3040 and 3045). The conductive material may at least partly electrically insulate the neighboring capacitor-electrodes (e.g., 3040 and 3045) from each other. In order to accommodate the conductive material 3048 disposed between them, the capacitor-electrodes 3040, 3045, 3050, 3055 may be designed more narrowly and/or farther apart than they might otherwise be if the conductive material 3048 were not so disposed.

In the particular embodiment discussed relative to FIG. 30, the conductive material 3048 may be formed with an N+ conductivity type. In further embodiments, n-type dopant may extend into the P+ anode-emitter regions of the thyristors and may function as a minority carrier isolation device, perhaps similarly to the isolation collectors 2948 of FIG. 29. For further information regarding conductive material disposed between devices, see "Deep Trench Isolation for Thyristor-Based Semiconductor Device", referenced and incorporated by reference above under Related Data; and "Thyristor Device with a High-aspect-ratio Trench" referenced and incorporated by reference above.

In a further embodiment, referencing FIG. 31, conductive material 2858 may be formed in a region between the pillars, above the capacitor electrodes (e.g., 2245, 2250) and below the gate electrodes (e.g., 1456, 1466).

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors; adding structures to the integrated circuit device; increasing the number of P-N sections in the thyristor device; and interchanging P and N regions in the device structures and/or using P-MOSFETS rather than N-MOSFETS. Such modifications and changes do not depart from the true spirit and scope of the present invention that may be set forth in the following claims.

What is claimed is:

1. A semiconductor device, comprising:
   a plurality of thyristor-based memory cells each comprising a thyristor formed in a pillar of semiconductor material that has a cylindrical circumference of a first diameter;
   the pillars associated with the plurality of thyristor-based memory cells defining rows and columns of an array; and
   a given pillar of the plurality spaced by a first distance of magnitude up to the first diameter relative to a first pillar of the same row, and
   a second pillar of the plurality spaced from the given pillar by a second distance of magnitude up to twice the first diameter within the same column;
   in which the pillars each further comprise an access device in electrical series relationship and vertically aligned with the associated thyristor.

2. The device of claim 1, in which the pillars of semiconductor material each comprise alternating layers of opposite type conductivities that define the access device in series and vertical relationship with the thyristor.

3. The device of claim 1, in which the at least a portion of the access device comprises source, channel and drain regions of a MOSFET; and
   the at least a portion of the thyristor comprises cathode-emitter, p-base, and a-base regions.

4. The device of claim 3, in which the cathode-emitter region is disposed above the p-base region and in common with the drain/source region of the MOSFET.

5. The device of claim 3, further comprising:
   an anode-emitter region of the thyristor defining in part a portion of the second given pillar; and
   a buried n-region disposed exterior to the anode-emitter region within the semiconductor substrate.

6. The device of claim 5, in which the anode-emitter region comprises a further portion that extends below the second given pillar and is electrically coupled in common to respective portions of the anode-emitter regions of at least one neighboring pillar.

7. A semiconductor thyristor-based memory array comprising:
   an array of memory cells comprising a plurality of rows and columns of semiconductor pillars;
   first and second row wordlines comprising respective first and second layers of conductive material;
   the first and the second layers of conductive material vertically offset relative to each other;
   each of the first and the second wordlines for a given row of the semiconductor pillars comprising a plurality of apertures:
   the apertures defined by the first wordline aligned vertically to apertures of the second wordline;
   the pillars of semiconductor material for the given row extending through the aligned apertures; and
   dielectric disposed between the pillars and the conductive material of the first and second wordlines;
   in which the semiconductor pillars comprise vertically aligned alternating regions of opposite conductivity type to define at least part of a thyristor in series with an access transistor therein.

8. The memory array of claim 7, the conductive material for the first wordline operable collectively as a gate electrode capacitively coupled to a body region of the respective access transistors for the pillars of a given row.

9. The memory array of claim 8, in which the layer of conductive material for the second wordline is operable as a capacitor electrode capacitively coupled to a base region of the respective thyristors for the pillars associated with the given row.

10. A semiconductor thyristor-based memory array comprising:
- an array of memory cells comprising a plurality of rows and columns of semiconductor pillars;
- first and second row wordlines comprising respective first and second layers of conductive material;
- the first and the second layers of conductive material vertically offset relative to each other;
- each of the first and the second wordlines for a given row of the semiconductor pillars comprising a plurality of apertures;
- the apertures defined by the first wordline aligned vertically to apertures of the second wordline;
- the pillars of semiconductor material for the given row extending through the aligned apertures; and
- dielectric disposed between the pillars and the conductive material of the first and second wordlines;

in which;
- the semiconductor pillars comprise vertically aligned alternating regions of opposite conductivity type to define at least part of a thyristor in series with an access transistor therein;
- the conductive material for the first wordline operable collectively as a gate electrode capacitively coupled to a body region of the respective access transistors for the pillars of a given row;
- the layer of conductive material for the second wordline is operable as a capacitor electrode capacitively coupled to a base region of the respective thyristors for the pillars associated with the given row; and
- at least one of the first and second wordlines is formed from sleeves of conductive material conformally deposited about the pillars with a radial thickness of magnitude greater than half the distance interspacing the neighboring pillars within the given row.

11. The memory array of claim 10, in which the layer of conductive material for the first wordline comprises a depth sufficient to span a channel length for the body region between and to overlap at least respective portions of source and drain regions of the access transistors.

12. The memory array of claim 11, the conductive material for the second wordline being limited to a depth of magnitude less than that for the base region of the thyristors to which it is capacitively coupled.

13. The memory array of claim 12, in which
- pillars of the plurality associated with a given row are interspaced by a lateral distance less than the lateral diameter; and
- a different row of the pillars that neighbors the given row is separated therefrom by a longitudinal distance greater than the longitudinal diameter.

* * * * *